(12) United States Patent
Motoki et al.

(10) Patent No.: US 7,534,310 B2
(45) Date of Patent: *May 19, 2009

(54) SINGLE CRYSTAL GAN SUBSTRATE, METHOD OF GROWING SINGLE CRYSTAL GAN AND METHOD OF PRODUCING SINGLE CRYSTAL GAN SUBSTRATE

(75) Inventors: Kensaku Motoki, Hyogo (JP); Ryu Hirota, Hyogo (JP); Takuji Okahisa, Hyogo (JP); Seiji Nakahata, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 247 days.

This patent is subject to a terminal disclaimer.

(21) Appl. No.: 11/434,744

(22) Filed: May 17, 2006

(65) Prior Publication Data
US 2006/0213429 A1    Sep. 28, 2006

Related U.S. Application Data

(62) Division of application No. 10/265,719, filed on Oct. 8, 2002, now Pat. No. 7,087,114.

(30) Foreign Application Priority Data

Oct. 9, 2001    (JP) .............................. 2001-311018
Sep. 17, 2002    (JP) .............................. 2002-269387

(51) Int. Cl.
*C30B 29/38*    (2006.01)
(52) U.S. Cl. ........................ 148/33.1; 148/33.2; 117/89; 117/94; 117/95
(58) Field of Classification Search .................. 117/89, 117/94, 95; 148/33.1, 33.2
See application file for complete search history.

(56) References Cited

U.S. PATENT DOCUMENTS 6,252,261 B1    6/2001    Usui et al.

(Continued)

FOREIGN PATENT DOCUMENTS

EP    0 966 047 A    12/1999

(Continued)

OTHER PUBLICATIONS

Powell, A.R. "New Approach to growth of low dislocation relaxed SiGe material." Applied Physics Letter, 64 (14) Apr. 4, 1994, pp. 1856-1858.

(Continued)

*Primary Examiner*—Robert M Kunemund
(74) *Attorney, Agent, or Firm*—McDermott Will & Emery LLP

(57) ABSTRACT

A low dislocation density GaN single crystal substrate is made by forming a seed mask having parallel stripes regularly and periodically aligning on an undersubstrate, growing a GaN crystal on a facet-growth condition, forming repetitions of parallel facet hills and facet valleys rooted upon the mask stripes, maintaining the facet hills and facet valleys, producing voluminous defect accumulating regions (H) accompanying the valleys, yielding low dislocation single crystal regions (Z) following the facets, making C-plane growth regions (Y) following flat tops between the facets, gathering dislocations on the facets into the valleys by the action of the growing facets, reducing dislocations in the low dislocation single crystal regions (Z) and the C-plane growth regions (Y), and accumulating the dislocations in cores (S) or interfaces (K) of the voluminous defect accumulating regions (H).

49 Claims, 12 Drawing Sheets

GaN substrate of the present invention

U.S. PATENT DOCUMENTS

| | | | |
|---|---|---|---|
| 6,265,322 | B1 | 7/2001 | Anselm et al. |
| 6,582,986 | B2 | 6/2003 | Kong et al. |
| 6,667,184 | B2 | 12/2003 | Motoki et al. |
| 7,112,826 | B2 * | 9/2006 | Motoki et al. ............... 257/103 |
| 2004/0082150 | A1 | 4/2004 | Kong et al. |
| 2004/0089919 | A1 | 5/2004 | Motoki et al. |

FOREIGN PATENT DOCUMENTS

| | | |
|---|---|---|
| EP | 1 041 610 A | 10/2000 |
| EP | 1 088 914 A1 | 4/2001 |
| JP | 9-298300 | 10/1997 |
| JP | 10-9008 | 1/1998 |
| JP | 10-102546 | 4/1998 |
| JP | 2001-102307 A | 4/2001 |
| WO | WO 99/23693 | 5/1999 |

OTHER PUBLICATIONS

Wu, J et al., "Selective growth of cubic GaN on patterned GaAs (100) substrates by metalorganic vapor phase epitaxy", 3rd International Conference on Nitride Semiconductors, Montpellier, France, Jul. 4-9, 1999, 'Online!, vol. 176, No. 1, pp. 557-560, XP002228656.

Li, X et al., "Characteristics of GaN stripes grown by selective-area metalorganic chemical vapor deposition", Proceedings of the 38th Electronic Materials Conference, Santa Barbara, CA, USA, Jun. 26-28, 1996, vol. 26, No. 3, pp. 306-310, XP009004611.

Kawaguchi, Y. et al., "Selective area growth (SAG) and epitaxial lateral overgrowth (ELO) of GaN using tungsten mask", GaN and Related Alloys, Symposium, GaN and Related Alloys, Symposium, Boston, MA, USA, Nov. 30-Dec. 4, 1998, 'Online!, p. G4 1/6 pp. XP002228657.

Zhang, et al., "Epitaxial lateral overgrowth of GaN with chloride-based growth chemistries in both hydride and metalorganic vapor phase epitaxy", GaN and Related Alloys, Symposium, GaN and Related Alloys, Symposium, Boston, MA, USA, Nov. 30-Dec. 4, 1998, 'Online!, p. G4. 7/6 pp. XP002228658.

Kuan, T S et al., "Dislocation mechanisms in the GaN lateral overgrowth by hydride vapor phase epitaxy", GaN and Related Alloys—1999. Symposium (Materials Research Society Symposium Proceedings vol. 595), GaN and Related Alloys—1999. Symposium, Boston, MA, USA, Nov. 28-Dec. 3, 1999. 'Online!, pp. W2.6.1-W2.6.6, XP002228659.

Miyake, H et al., "Fabrication of GaN with buried tungsten (W) structures using epitaxial lateral overgrowth (ELO) via LP-MOVPE" GaN and Related Alloys—1999. Symposium (Materials Research Society Symposium Proceedings vol. 595), GaN and Related Alloys—1999. Symposium, Boston, MA, USA, Nov. 28-Dec. 3, 1999. 'Online! pp. W2.3.1.-W2.3.6, XP002228660.

Usui, A "Growth of Thick GaN Layers by Hydride Vapor-Phase Epitaxy", Electronics & Communications in Japan, Part II—Electronics, Scripta Technica. New York, US, vol. 81, No. 7, Jul. 1998, pp. 57-63, XP000835031.

Yoshiki, K., et al., "Selective Growth of Wurtzite GaN and AlxGa1-xN on GaN/Sapphire Substrates by Metalorganic Vapor Phase Epitaxy", Journal of Crystal Growth, North-Holland Publishing Co. Amsterdam, NL, vol. 144, No. 3/4, Dec. 2, 1994, pp. 133-140, XP000483655.

Beaumont, B, et al., Lateral Overgrowth of GaN on Patterned GaN/Sapphire Substrate Via Selective Metal Organic Vapour Phase Epitaxy: A Route to Produce Self Supported GaN Substrates, Journal of Crystal Growth, North-Holland Publishing Co., Amsterdam, NL, vol. 189/190, Jun. 2, 1998, pp. 97-102, XP000667735.

Usui, A et al., "Thick GaN Epitaxial Growth With Low Dislocation Density by Hydride Vapor Phase Epitaxy", Japanese Journal of Applied Physics, Publication Office Japanese Journal of Applied Physics. Tokyo, JP, vol. 36., No. 7B, Part 2, Jul. 15, 1997, pp. L899-L902, XP000742410.

Akasaka, T et al., "GaN Hexagonal Microprisms With Smooth Vertical Facets Fabricated by Selective Metalorganic Vapor Phase Epitaxy", Applied Physics Letters, American Institute of Physics, New York, US, vol. 71, No. 15, Oct. 13, 1997, pp. 2196-2198, XP000725873.

Kapolnek, D et al. "Anisotropic Epitaxial Lateral Growth in GaN Selective Area Epitaxy", Applied Physics Letters, American Institute of Physics, New York, US, vol. 71, No. 9, Sep. 1, 1997, pp. 1204-1206, XP000720234.

European Search Report issued in European Patent Application No. EP 02 02 1243, dated Apr. 2, 2008.

Hiramatsu, K., et al. "Fabrication and characterization of low defect density GaN using facet-controlled epitaxial lateral overgrowth (FACELO)," Journal of Crystal Growth, 2000, p. 316-326, vol. 221, Elsevier Science B.V.

* cited by examiner

Fig. 1　　　　　　　　Prior Art
Decrement of dislocations by a pit made by facets
(a) a pit made by facets
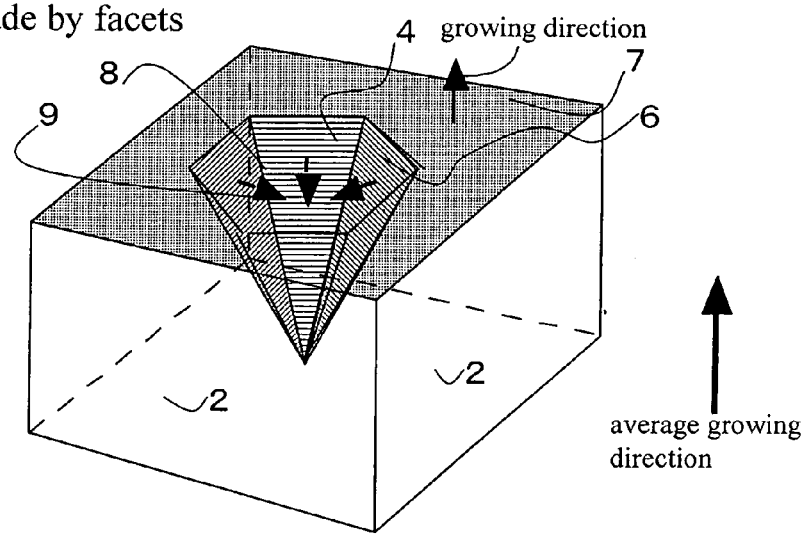
(b) after continual growth
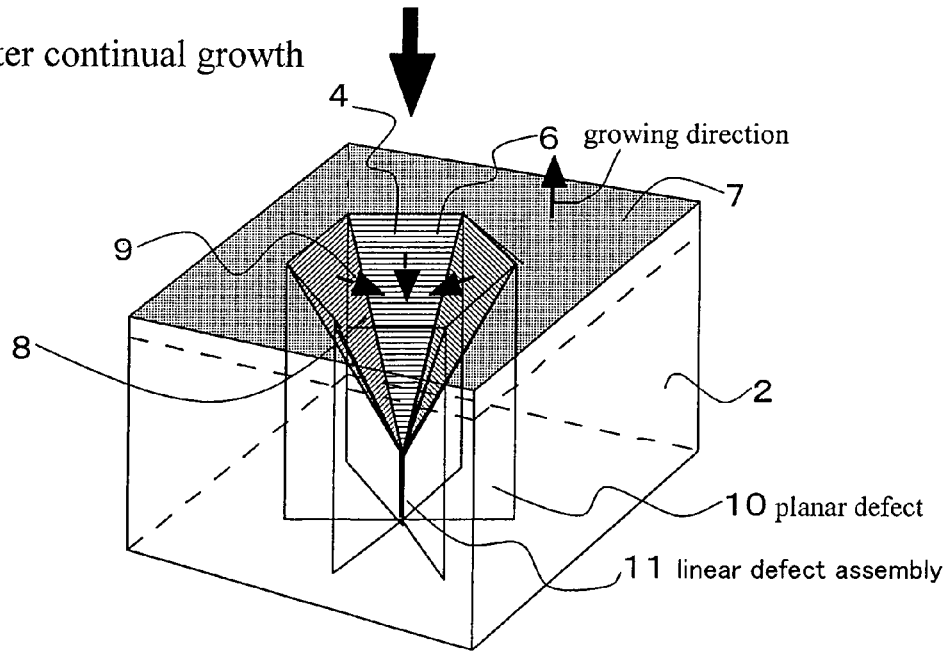

Movements of dislocations inside a pit made by facets

Fig.3  Prior Art
Facet growth
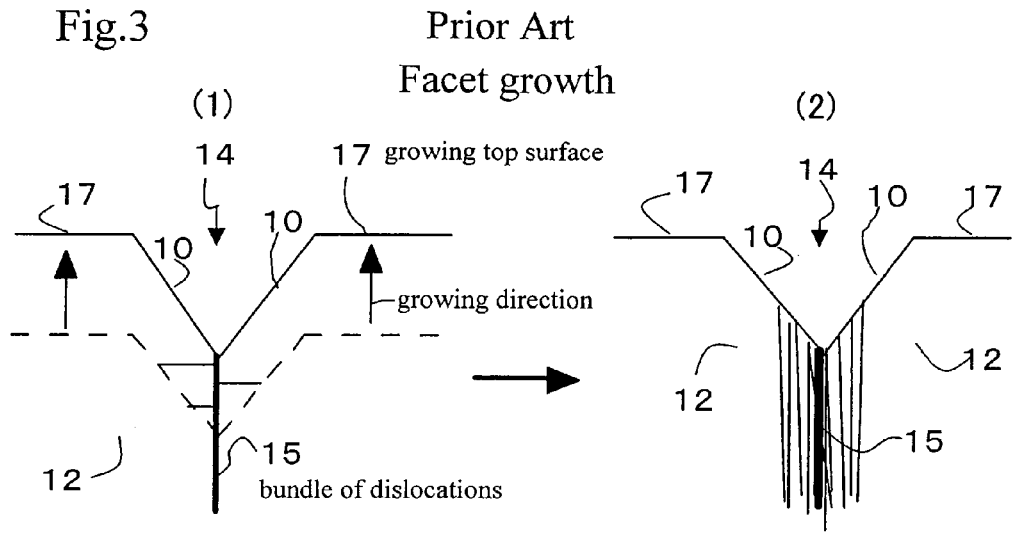
Fig.4  Growing method of the present invention
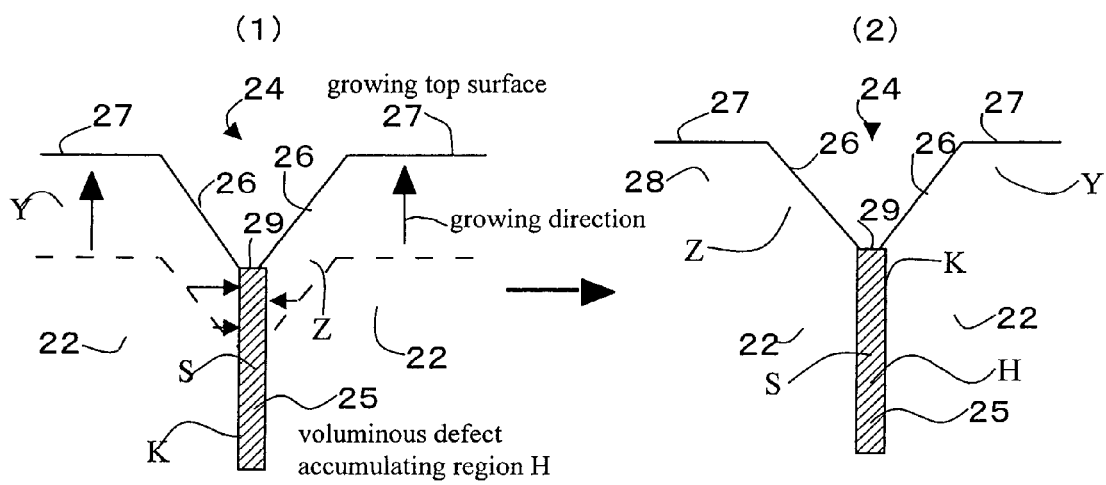

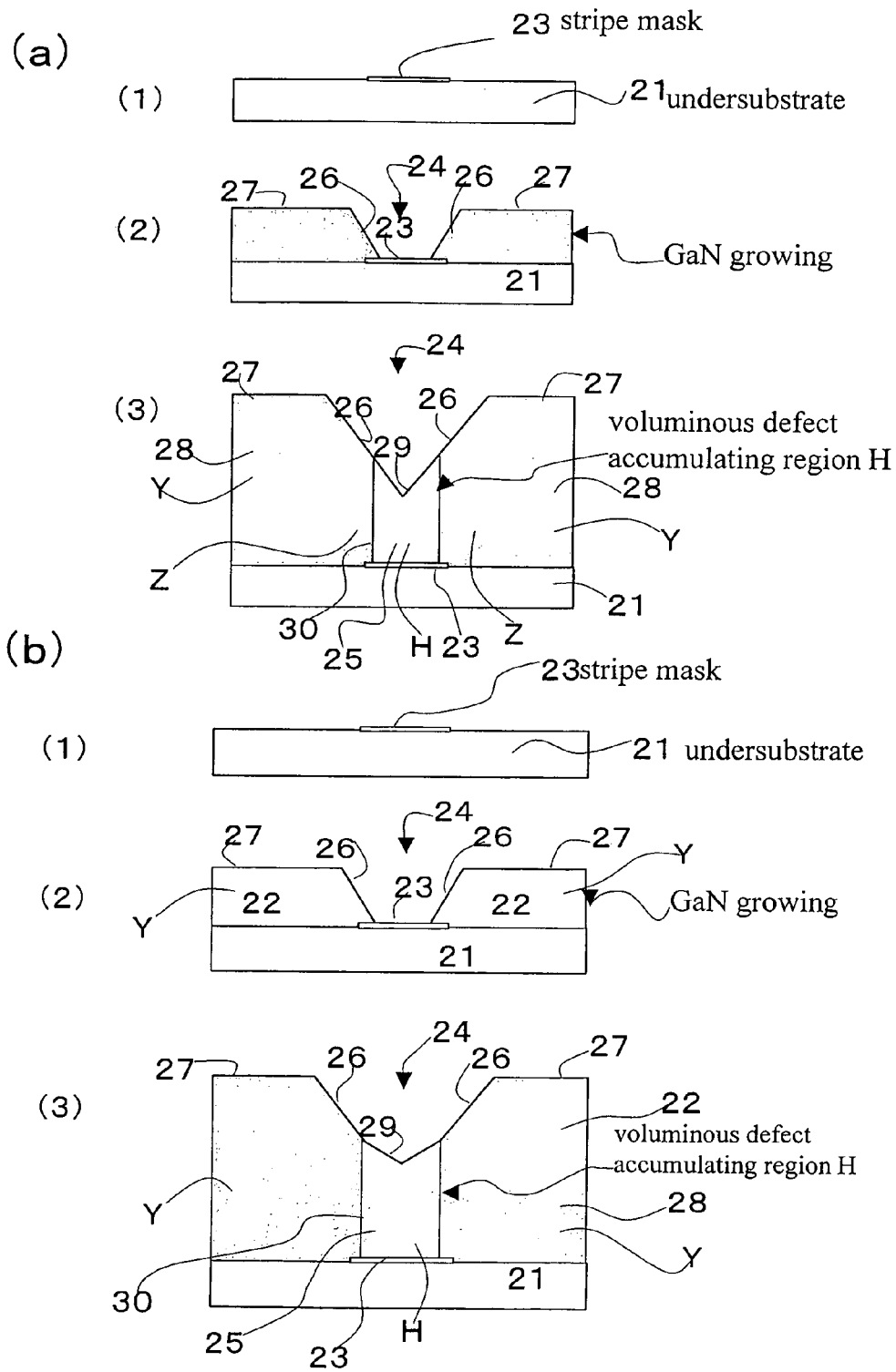
Fig. 5  Relation between mask and voluminous defect accumulating region H in the present invention Fig. 6   Relation between mask and voluminous defect accumulating region H in the present invention
(a) arrangement of mask
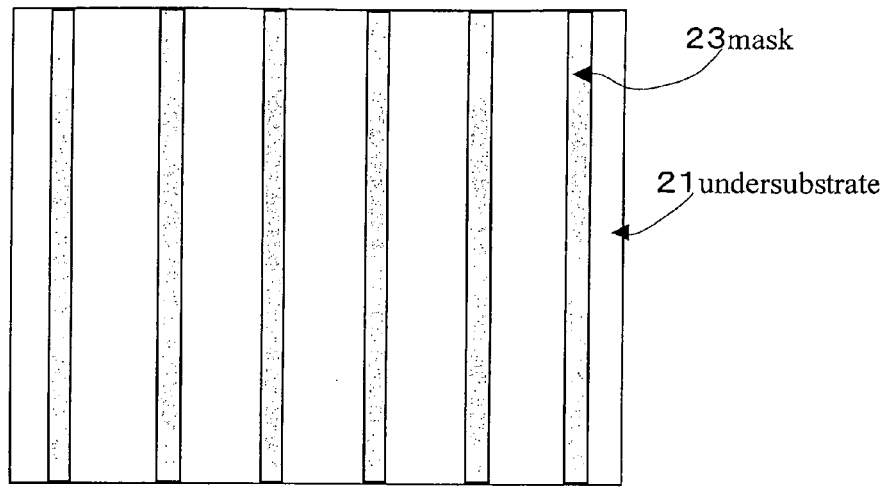
(b) after growing thick GaN
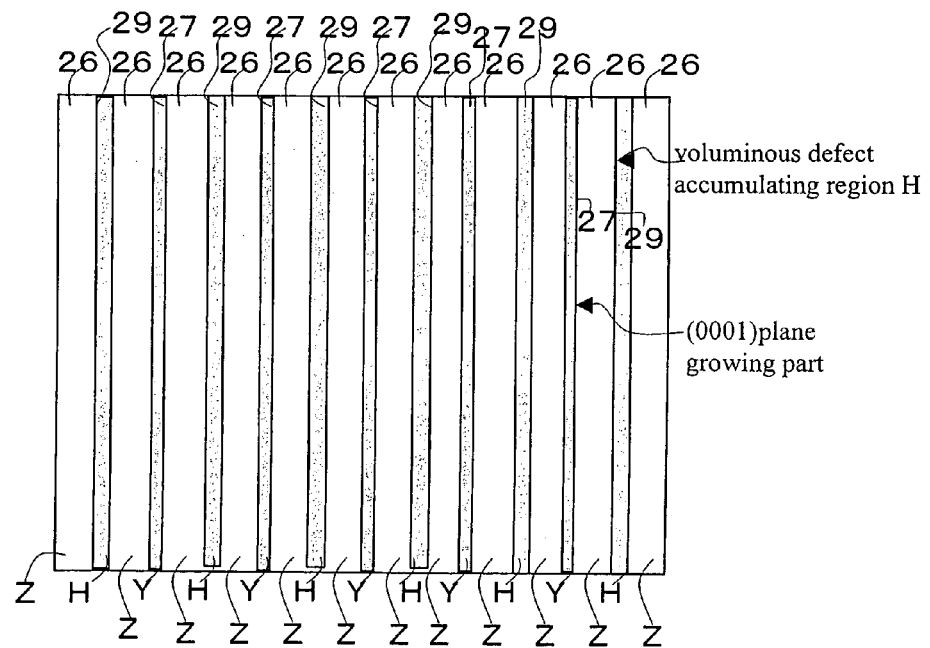

Prism shaped growth of the present invention

GaN substrate of the present invention

Fig. 9
Crystal composition on surface
(a) stripe along <1-100> direction
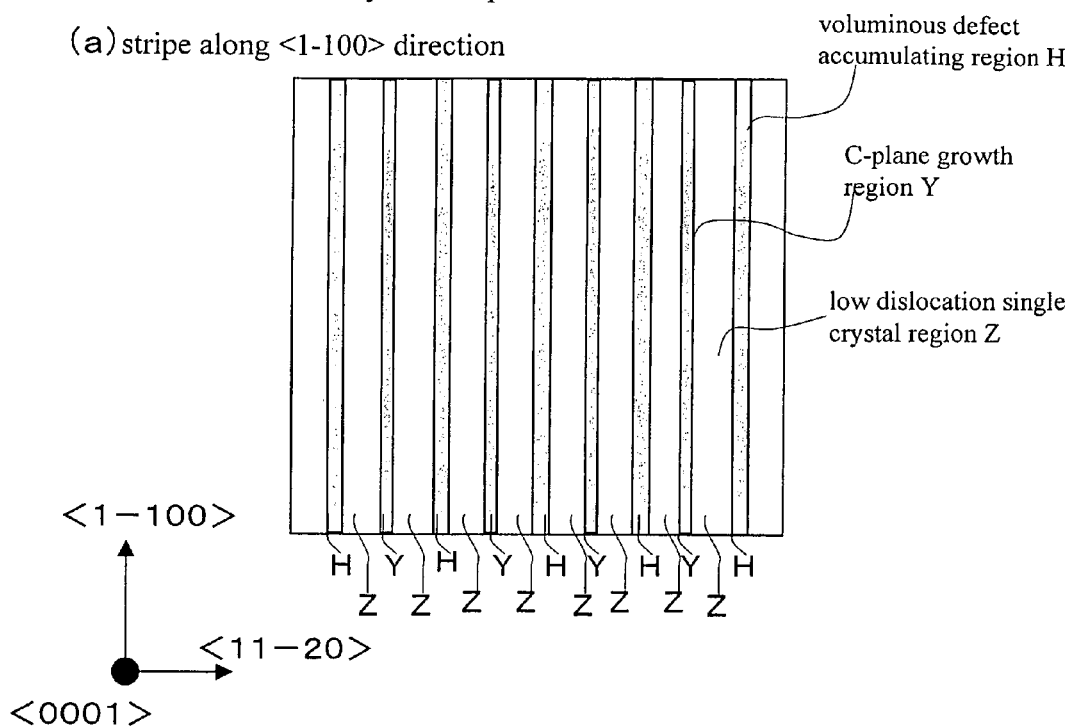
voluminous defect accumulating region H
C-plane growth region Y
low dislocation single crystal region Z
(b) stripe along <11-20> direction
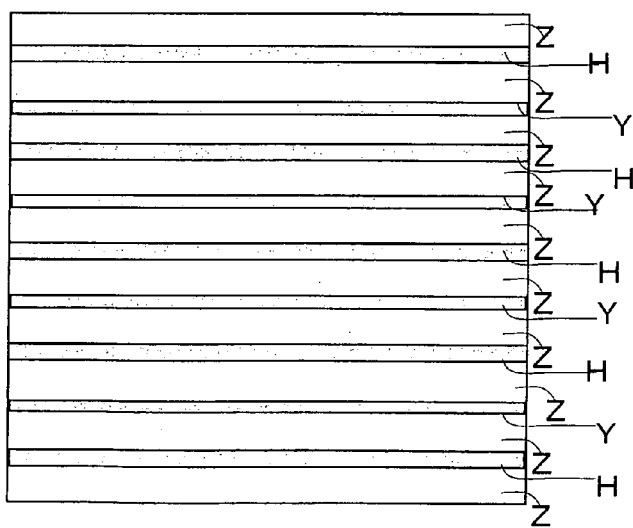

Fig. 10   Processes of producing a GaN substrate
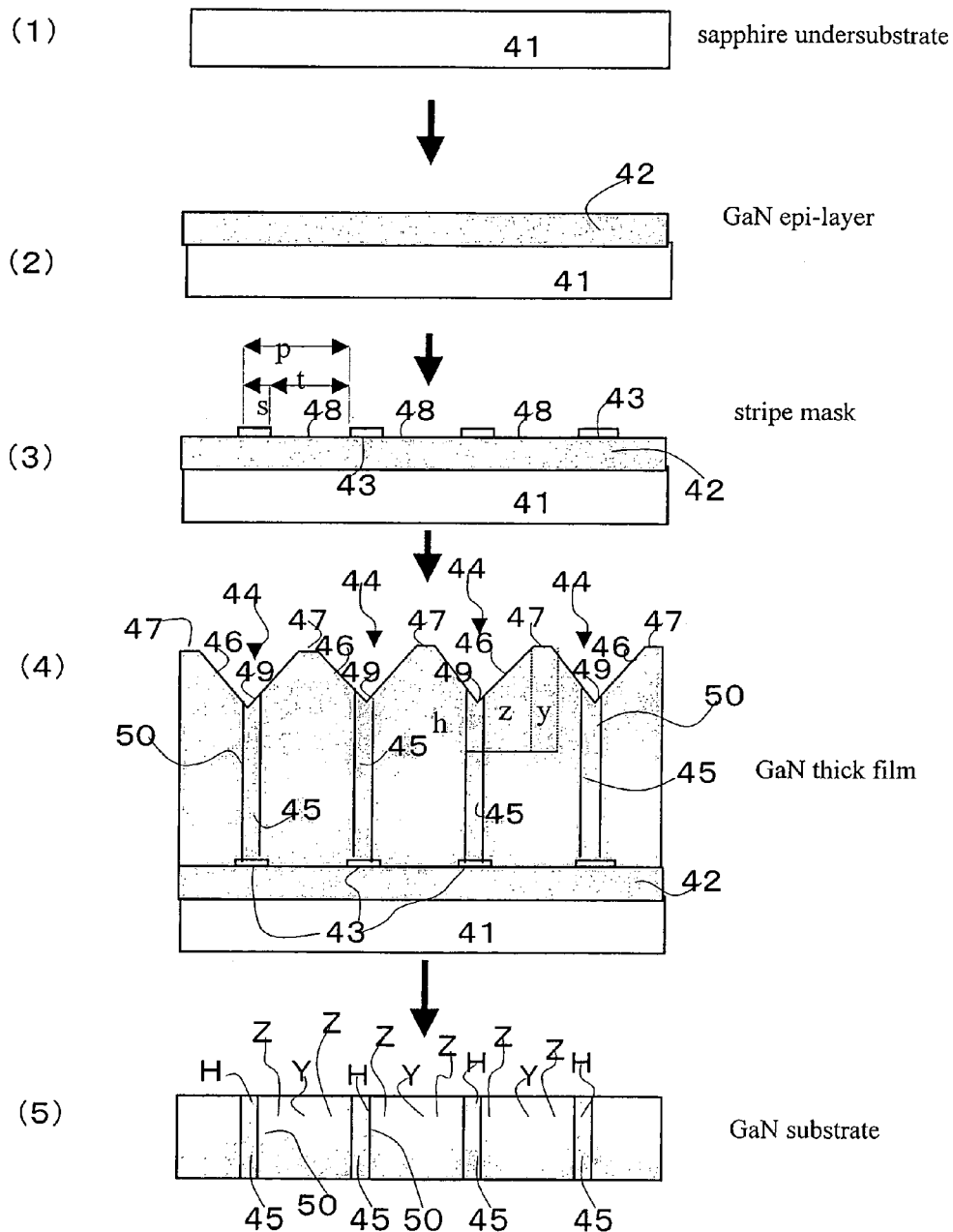

Fig. 11    Processes of producing a GaN substrate
(1) 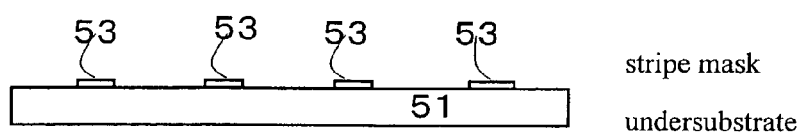
stripe mask
undersubstrate
(2) 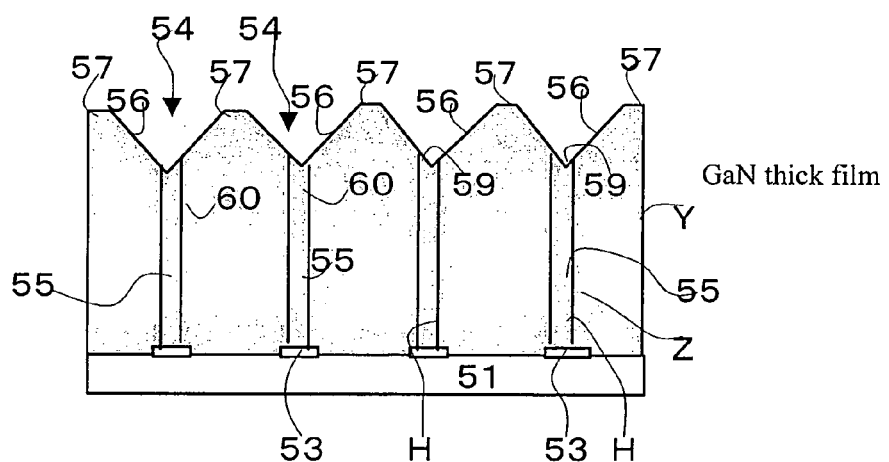
GaN thick film
(3) 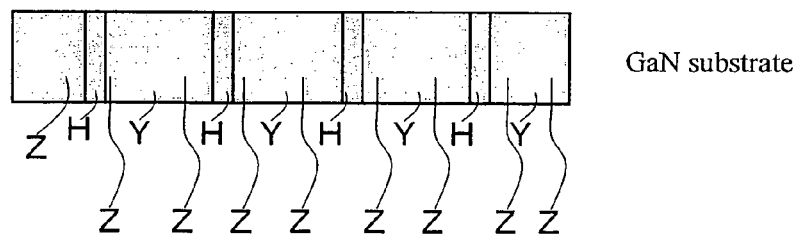
GaN substrate

SINGLE CRYSTAL GAN SUBSTRATE, METHOD OF GROWING SINGLE CRYSTAL GAN AND METHOD OF PRODUCING SINGLE CRYSTAL GAN SUBSTRATE

This application is a divisional of application Ser. No. 10/265,719, filed on Oct. 8, 2002 now U.S. Pat. No. 7,087, 114, which in turn claims the priority of Japanese Patent Applications No. 2001-311018 filed on Oct. 9, 2001 and No. 2002-269387 filed on Sep. 17, 2002, the disclosures of which are incorporated herein by reference.

BACKGROUND OF THE INVENTION

1. Field of the Invention

This invention relates to a single crystal gallium nitride (GaN) substrate, a method of growing single crystal GaN and a method of making a single crystal GaN substrate utilized as a substrate of making laser diodes (LDs) and light emitting diodes (LEDs) composed of groups 3-5 nitride semiconductors.

2. Description of Related Art

Light emitting devices based upon group 3-5 nitride semiconductor include blue/green light emitting diodes and blue light laser diodes. Blue light LEDs have been sold on the market. But, LDs have not been on the market yet. Almost all of the conventional 3-5 nitride light emitting devices and laser diodes (LEDs, LDs) have been fabricated upon sapphire ($\alpha$-$Al_2O_3$) substrates. Sapphire is a rigid and sturdy material. Sapphire excels in chemical and physical stability. Another advantage of sapphire is to allow GaN heteroepitaxial growth on it. Thus, GaN films, AlGaN films or InGaN films can be grown on sapphire substrates. Sapphire has been an exclusive, pertinent substrate for GaN type LEDs.

Sapphire, however, has some drawbacks as a substrate. Sapphire lacks cleavage. Sapphire is not a semiconductor but an insulator. GaN films or InGaN films grown on a sapphire substrate are annoyed by large lattice misfitting. Lattice misfitting means a difference of lattice constants between a substrate and a film. Sapphire belongs to trigonal symmetry group. Sapphire lacks three-fold rotation symmetry and inversion symmetry. Poor symmetry deprives sapphire of cleavage planes.

The use of sapphire substrates forces device makers to cut a processed GaN wafer into individual chips by mechanical dicing instead of natural cleavage. To dice a hard, sturdy, rigid sapphire plate mechanically into pieces is a difficult process, which decreases yield and enhances cost.

Noncleavage further induces a serious difficulty of making good resonator mirrors of laser diodes. The resonators are made by mechanical polishing, which raises the cost of LDs and declines the quality of the resonators.

Insulation is another weak point of sapphire. Insulating sapphire incurs a difficulty of n-electrodes. An insulating substrate forbids an LED from having an n-electrode on the bottom unlike an ordinary diode. An n-electrode is formed by etching away a top p-GaN layer, an active layer, revealing an intermediate n-GaN film on the sapphire substrate, depositing an n-metal electrode on the n-GaN film, and wirebonding the n-metal electrode with a lead pin. The etching for revealing the intermediate film and wirebonding are extra steps which are required for making an n-electrode on the on-sapphire device.

Current flows in a horizontal direction in the n-GaN film. The n-GaN film should be grown to a thick film for reducing electric resistivity of the n-GaN film. Extra steps and extra components raise the cost of fabrication.

Since two electrodes are formed on n- and p-films within a chip, an extra wide area is required for the chip. The wide, large chip raises cost up.

The third weak point of a sapphire substrate is lattice misfitting. Lattice misfitting induces high density dislocations into GaN epi-layers grown upon a sapphire substrate. It is said that GaN epi-layers of on-sapphire LEDs sold on the market should have $1 \times 10^9$ $cm^{-2}$ dislocations.

Another candidate for a substrate is silicon carbide SiC, since lattice misfit between SiC and GaN is smaller than the GaN/sapphire misfit. A GaN grown on a SiC substrate turns out to have a similar high dislocation density to the on-sapphire GaN layers. SiC does not surpass sapphire as a substrate.

High dislocation density in GaN, InGaN, AlGaN epi-layers causes no problem in the nitride-type LEDs because of low current density. In the case of LDs having a narrow striped electrode and a narrow emission area, high density current would reproduce dislocations and the increased dislocations would shorten the lifetime of LDs. Non-cleavage, insulator and misfit are three serious drawbacks of sapphire substrates.

The best candidate for an ideal substrate for LDs is a gallium nitride (GaN). single crystal substrate. If a high quality GaN single crystal substrate were obtained, the problem of the lattice misfitting would be solved, because a device would take a GaN/GaN homoepitaxy structure.

A GaN crystal has cleavage planes $\{1-100\}$. Cleavability of GaN enables device makers to divide a processed GaN wafer into individual chips along cleavage planes. Cleavage lowers the difficulty and cost of chip separation. Resonator mirrors of LDs can be easily produced by natural cleavage. High quality resonators are formed by the cleavage.

GaN can be doped with n-type dopants or p-type dopants. Doping with an impurity can prepare a conductive GaN substrate. Since a low resistance n-type substrate is made by doping with an n-type dopant, an n-electrode can be formed at a bottom of an n-GaN substrate. Vertical electrode alignment enables an LD and an LED to reduce a chip size, simplify a device structure and curtail the cost.

However, GaN single crystals are not yielded as natural resources. Production of GaN single crystals is difficult. Manufacture of high quality GaN single crystal substrates with a practical size has been impossible till now.

It is said that ultrahigh pressure and ultrahigh temperature would realize production of a tiny GaN crystal grown from a mixture of melt/solid at thermal equilibrium. The ultrahigh pressure method is impractical. A wide GaN substrate cannot be made by the method.

Methods of making GaN substrate crystals by growing a thick GaN crystal on a foreign material substrate in vapor phase and eliminating the foreign material substrate had been proposed. The vapor phase method has been inherently a method for making thin GaN, AlGaN, InGaN films on a sapphire substrate. The vapor phase method was diverted from film piling to substrate production. The inherent vapor phase method is unsuitable for substrate production. Large inner stress and many dislocations appeared in the GaN films made by the vapor phase method. Large inner stress prevented GaN films from growing thick crystals sufficient for substrates. A GaN "substrate" is a final product of the present invention. A substrate of a foreign material, e.g., sapphire or GaAs is a starting base plate for making GaN. Two substrates should not be confused. For discriminating two kinds of substrates, the starting foreign substrate is here named "undersubstrate".

The inventors of the present invention proposed an epitaxial lateral overgrowth method of growing a GaN via a mask on an undersubstrate in vapor phase (①) Japanese Patent Application No. 9-298300, ② Japanese patent application No. 10-9008).

In the ELO method proposed by us was a method of preparing a GaAs undersubstrate, producing an SiO$_2$ or SiN film on the GaAs undersubstrate, perforating many small windows regularly and periodically aligning with a short pitch (spatial period), growing a GaN film on the masked GaAs substrate in vapor phase for a long time, and eliminating the GaAs substrate. The ELO alleviates inner stress and dislocations. The preceding ELO method utilized sapphire as an undersubstrate, which may be called an on-sapphire ELO. But, the above ELO method made use of GaAs as an undersubstrate. The method of the present inventors is called here an on-GaAs ELO.

The inventors of the present invention have proposed a method of making a plurality of GaN substrates by homoepitaxially growing a thick GaN crystal upon a GaN substrate obtained by the former mentioned ELO method, making a tall GaN ingot and slicing the tall GaN ingot into a plurality of wafers (③ Japanese Patent Application No. 10-102546).

The improved ELO gave a probability for making wide GaN single crystal substrates on a commercial scale.

The ELO made GaN crystals were plagued with high dislocation density. The ELO reduces dislocations at an early stage of the growth. During the long time growth, however, dislocations increase again. Bad quality prohibited the ELO-GaN substrate from being the substrates for producing nitride type laser diodes (InGaN-LDs). Production of high quality (long lifetime) LDs required lower dislocation density GaN substrates.

Mass production of devices requires wide GaN substrates which have low dislocation density and high quality in a wide area.

The inventors of the present invention proposed a method of making low dislocation density GaN substrate (④ Japanese Patent Laying Open No. 2001-102307). The present invention is an improvement of the former method ④.

The method proposed by ④ is now called "facet growth" method in short. The method reduces dislocations by forming three-dimensional facets and facet pits of e.g., reverse-hexagonal cones on a growing surface intentionally, maintaining the facets and pits, growing a GaN crystal without burying the pits, gathering dislocations by the facets to the bottom of the pits, and reducing dislocations in other regions except the pit bottoms.

Three-dimensional facet pits are otherwise reverse-dodecagonal cones built by facets. The facets comprise typical {11–22} and {1–101} planes.

The facet growth ④ (Japanese Patent Laying Open No. 2001-102307) proposed by the inventors grows a GaN crystal in vapor phase on the condition of making facets and maintains the facets without burying the pits of facets. The facets grow not in the c-axis direction but in a direction normal to the facets. The roles of facets and pits in the facet growth ④ (Japanese Patent Laying Open No. 2001-102307) are described with reference to FIG. 1 which shows a small part around a facet pit on a surface of a GaN crystal growing in the facet growth. In practice, many facets and facet pits appear on the surface. A vapor phase epitaxy method (HVPE, MOCVD, MOC or Sublimation) grows a GaN crystal on a substrate in a direction of a c-axis. The growth is a c-axis direction growth but is not a "C-plane growth" which has been prevalent in the conventional GaN growth. Facets grow in directions normal to the facets.

Conventional C-plane growth methods grow a GaN film epitaxially on a substrate by maintaining a smooth C-plane surface. Produced GaN crystals have poor quality of high dislocation density, for example, $10^{10}$ cm$^{-2}$. Our new facet growth method intentionally makes facets and pits, maintains the facets and reduces dislocations by make the best use of the function of facets of gathering dislocations into pit bottoms.

The facet growth produces plenty of reverse hexagonal cone pits 4 on the growing GaN surface. FIG. 1 shows a single one of many pits. Six slanting planes are low index facets 6 of {11–22} or {1–101} planes. A flat top surface 7 outside of the pit 4 is a surface of C-plane growth. In the pit, the facet grows inward in the direction of a normal standing on the facet as shown by inward arrows. Dislocations are swept to corner lines 8 by the growing facet. Dislocations are gathered on the six corner lines 8.

The dislocations swept to the corner lines 8 slide down along the corner lines to the bottom of the pit. In practice, the dislocations do not fall along the corner lines 8. The growth raised the facets, the corner lines and the pit bottoms at a definite speed. Sliding dislocations along the rising corner lines centrifugally move inward in horizontal directions. Finally, the dislocations attain to the center of the pit just at the time when the pit bottom rises to the height of the dislocation. Then, dislocations are accumulated at the bottom of the pit. The number of the dislocations on the facets is reduced by the accumulation of dislocations at the bottom.

Proceeding of the facet growth sometimes forms planar defects 10 following the corner lines 8 by storing the swept dislocations at the corner lines. The planar defects are six planes with sixty degree rotation invariance corresponding with the hexagonal symmetry of GaN. The width of the planar defects 10 is equal to the diameter of the pit 4. The six planar defects 10 cross at a vertical extension of the pit bottom. The crossing line forms a linear defect assembly 11 having highly concentrated dislocation. Ideally all the dislocations initially existing in the pit are swept to and are accumulated at the pit bottom. The other parts lose dislocations and become low dislocation density single crystals. This is the dislocation reduction method proposed by ④ (Japanese Patent Laying Open No. 2001-102307).

Finally, the majority of dislocations are concentrated to the pit center. The operations of the facets reduce dislocation density in the regions included within the projection of the pits.

There are some problems in the new facet growth method proposed by ④ which makes facet pits at random spots accidentally, maintains the facet pits, grows a GaN crystal without burying the pits, and concentrates dislocations to the bottoms of the facet pits.

Though the facets gather dislocations to the pit bottoms, dislocations are not concentrated fully into a narrow, restricted spot. For example, when 100 μmφ pits are yielded, some pits can concentrate dislocations to a small spot at the bottom of a several micrometer diameter but other pits have about 50 μmφ hazy dislocation dispersion region of medium dislocation density near the bottom.

FIG. 3 demonstrates the occurrence of the hazy dislocation dispersion. FIG. 3(1) shows that a c-axis crystal growth (arrows) moves facets 16 inward, dislocations on the facets are carried by the facets 16 in horizontal directions (shown by horizontal lines) to the pit bottom and the bottom has a linear dislocation bundle 15. But, repulsive forces release once gathered dislocations outward. FIG. 3(2) shows that the once concentrated dislocations 15 are diffusing from the bottom to the facet 16 of a pit 14. Occurrence of hazy dislocation dispersion is a drawback of the facet growth of ④.

If the pit size is enlarged for widening the area of good quality portions, the area of the hazy dislocation dispersion further dilates. The reason is supposed that enlargement of a pit size increases the number of the dislocations gathered at the bottom and the number of the dislocations released from the bundle.

The inventors think that the release of dislocations from the pit centers results from repulsion acting between concentrated dislocations. Unification of pits incurs disorder of dislocations and expansion of the hazy dispersion of dislocations. Excess concentration induces the hazy dislocation dispersion.

The hazy dislocation dispersion has about $2\times10^7$ cm$^{-2}$ dislocation density which has dependence to positions. Such a high dislocation density GaN substrate is insufficient for making laser diodes (LDs) of a satisfactory lifetime. A long lifetime of LDs requires to reduce dislocations down to one twentieth (1/20) of the current value ($2\times10^7$ cm$^{-2}$), that is, to $1\times10^6$ cm$^{-2}$.

Another problem is the existence of planar defects 10 produced under the corner lines of pits as shown in FIG. 1(b). The planar defects are radially arranged with 60 degree rotation symmetry. Facets assemble dislocations at pit corner lines. Without progressing to the center bottom, the assembled dislocations form planar defects 10 by dangling from the corner lines. A planar defect can be considered as an alignment of dislocations in a plane. The planar defects are another problem of the conventional facet growth method. Sometimes a slide of crystal planes occurs on both sides of the planar defect.

Besides the 60 degree rotation symmetric planar defects, 30 degree rotation symmetry planar defects sometimes appear in dodecagonal pits on a growing surface. Planar defects appear as dislocation arrays on the surface of the growing substrate. Planar defects are a serious hindrance to produce long lifetime LDs. Prolongation of LD lifetime requires reduction of the planar defects.

The final problem is distribution of defects. Dislocation reduction of the facet growth method makes use of facet pits accidentally and randomly appearing on a facet growth. Positions of pits are not predetermined. Numbers of appearing pits are also not programmable. Positions, numbers, shapes and sizes of appearing pits are all stochastic, random, accidental variables which are unpredeterminable, unprogrammable, uncontrollable. It is a problem that the positions of pits are uncontrollable.

If a plurality of laser diodes were fabricated upon a GaN substrate having random distributing planar defects, emission stripes of active layers of the laser diodes would accidentally coincide with the defect assemblies which occupy random spots on the GaN substrate. In the case of coincidence of the active layer with the defect bundles, important emission layers are plagued by the defect assemblies. Large current density driving current would invite rapid degeneration on emission stripes from the inherent defects of the laser diodes.

Uncontrollability of the positions of pits would decrease the yield of manufacturing laser diodes on the substrate.

Manufacturing GaN substrates for making laser diodes thereon requires enhancement of yield through controlling the positions of dislocation bundles on the GaN substrates. It is important to control the positions of dislocation bundles not to collide with emission stripes of laser diode chips on the GaN substrates.

Three problems have been described for long lifetime laser diodes. The purpose of the present invention is to conquer the three problems;

(1) Reduction of hazy dislocation diffusion from the pit center composed of facets, (2) Extinction of planar defects at the bottoms of the pits composed of facets, (3) Controlling of positions of the pits made of facets.

The present invention aims at overcoming the difficulties of the three problems. Preliminary descriptions are given to orientations of crystals and vapor phase growth of gallium nitride (GaN) for facilitating the understanding of the present invention. The present invention can be carried out by any of the vapor phase methods described here. GaN has hexagonal symmetry. Designation of planes and directions of GaN is far more difficult than cubic symmetry, e.g., silicon (Si) or gallium arsenide (GaAs).

Clear understanding of the definitions of crystal planes, directions, and orientations is indispensable for describing relations of parts and structures of GaN crystals. Three index designation and four index designation are employed for expressing planes and directions of GaN crystal. Here, the four index designation is chosen.

There are some rules for determining expressions of crystal planes and crystal directions. Integers h, k, m and n are used for representing planes. The integers are called "Miller indices" or plane indices. Collective representation of planes is taken into wavy brackets as {hkmn} without comma. Individual representation of planes is taken into round brackets as (hkmn) without comma. Collective representation of directions is taken into key brackets as <hkmn> without comma. Individual representation of directions is taken into square brackets as [hkmn] without comma. The four kinds of brackets for representation should be clearly discriminated. An individual plane (hkmn) is orthogonal to an individual direction having the same Miller indices [khmn]. Namely, a [hkmn] direction is a normal of a (hkmn) plane.

Allowable symmetry operations are determined by the symmetry group of the object crystal. When a plane or direction is returned to another plane or direction by an allowable symmetry operation, two planes or two directions are equivalent. Equivalent planes or directions are represented by a common collective representation. Hexagonal GaN has three time rotation symmetry, which allows commutation of three indices h, k, m of a-, b- and d-axes. Miller indices h, k and m are equivalent. The final index n of a c-axis is a unique one which cannot be commutated with other indices. A collective plane representation {hkmn} includes all planes obtained by replacing a (hkmn) plane on all allowable symmetric operations.

Hexagonal symmetry group contains several different subgroups. Equivalent planes or directions depend upon the subgroup. GaN has three-fold rotation symmetry but lacks inversion symmetry. Sapphire ($Al_2O_3$) belongs not to hexagonal symmetry but to trigonal symmetry. Sapphire has neither three-fold rotation symmetry nor inversion symmetry. The following descriptions are valid only for GaN but invalid for sapphire without three-fold rotation.

GaN has three-fold rotation symmetry. Then, (hkmn), (kmhn), (mhkn), (hmkn), (khmn) and (mkhn) are six equivalent planes included in a collective representation {hkmn}. Six collective representations {hkmn}, {kmhn}, {mhkn}, {hmkn}, {khmn} and {mkhn} designate all the same planes. Miller indices are plus or minus integers. A minus sign should be denoted by an upper line. Since upper lines are forbidden in a patent description, a front "−" denotes a minus integer.

Since GaN has non inversion symmetry, {hkmn} is not identical to {−h−k−m−n}. A C-plane (0001) is different from a −C-plane (000−1) in GaN. Ga atoms exclusively appear on a C-plane (0001). But, N atoms exclusively appear on a −C-plane. Thus, a (0001) plane is sometimes denoted by a (0001) Ga plane and a (000−1) plane is sometimes denoted by a (000-1) N plane. The latter is often written as (0001) N plane by omitting a minus sign.

Hexagonal GaN has three equivalent principal axes having three-fold rotation symmetry. Two of the three axes are denoted by a-axis and b-axis. The third axis has no name traditionally. For the convenience of expression, the third axes is now called d-axis. Namely, the a-axis, b-axis and d-axis are defined with 120 degree angle rotation on a plane perpendicular to c-axis. The c-axis is a special axis different from the three axes in hexagonal symmetry. Crystal planes are an assembly of indefinite number of parallel planes having a common inclination and a common distance. Miller indices of a plane are defined as reciprocals of a length of a segment of an axis cut by a first plane divided by the axis length. When the first plane cuts a-axis at a/h, cuts b-axis at b/k, cuts d-axis at d/m and cuts c-axis at c/n, the set of the planes is denoted by (hkmn).

Smaller Miller index planes are more important planes with smaller number of equivalent planes. Smaller index planes appear on a crystal surface more frequently than larger index planes. Larger Miller index planes are less important with large number of equivalent planes. Forward three indices are not independent, since the three indices include only two freedom. Three indices represent two-dimensional directions. Three indices can be represented by two indices at the sacrifice of symmetry. The three indices h, k and m are linearly dependent. Three indices h, k and m always satisfy a sum rule h+k+m=0.

GaN has three typical planes. One important plane is C-plane. C-plane is expressed by (0001) plane. C-plane is a plane which is perpendicular to c-axis. A plane (hkmn) is vertical to a direction [hkmn] having the same Miller indices. From now, planes are denoted by capital letters (C-, A-, M-planes) but directions are denoted by small letters (c-axis, a-axis, b-axis, d-axis) for discriminating planes from directions.

GaN which belongs to hexagonal symmetry has three-fold rotation symmetry which retrieves itself by 120 degree rotations around c-axis. C-plane (0001) has the highest symmetry. In the case of heteroepitaxy of GaN on a foreign material undersubstrate, a three-fold rotation symmetric plane of the foreign material should be utilized. GaN is grown on the undersubstrate in a c-axis direction for harmonizing the symmetry. GaN lacks inversion symmetry. (0001) plane and (000-1) plane are different plane. The discrimination between (0001) plane and (000-1) plane is later described.

The second important plane is called an M-plane which is a cleavage plane. An M-plane is a plane which crosses an edge of one of the three symmetric axes a, b and d is parallel to one of two other symmetric axes and is parallel to a c-axis. M-planes are represented by collective expressions of {1-100}, {01-10}, {-1010}, {-1100}, {0-110} and {10-10} or represented by individual expressions of (1-100), (01-10), (-1010), (-1100), (0-110) and (10-10).

Collective expressions are all equivalent. But, individual expressions signify different individual planes. Individual M-planes cross with each other at 60 degrees. It should be noted that not 90 degrees but 60 degrees are a crossing angle between individual planes. The M-plane is a convenient expression of an important plane of GaN.

The third important plane is called an A-plane. An A-plane is a plane which crosses two edges of two of the three symmetric axes a, b and d, and is parallel to a c-axis. A-planes are represented by collective expressions of {2-1-10}, {-12-10}, {-1-120}, {-2110}, {1-210} and {11-20} or represented by individual expressions of (2-1-10), (-12-10), (-1-120), (-2110), (1-210) and (11-20).

GaN lacks six-fold rotation symmetry. The above six individual planes signify two kinds of planes. The A-plane is a convenient expression of denoting the important plane. The A-plane should not be confused with the a-axis. The A-planes are not rectangular to the a-axis.

A direction <2-1-10> which has the same Miller indices as an A-plane (2-1-10) is perpendicular to the A-plane. But, the direction <2-1-10> is not called an a-direction. A direction <1-100> which is perpendicular to an M-plane (1-100) is not called an m-direction.

A GaN crystal has three typical, important planes; C-plane, A-plane and M-plane. Don't confuse directions with planes. A direction and a plane with the same Miller indices are perpendicular. On the contrary, a direction and a plane with vertical Miller indices (hh'+kk'+mm'=0) are parallel. "Facet" is an important word which appears frequently in this specification. Facets inherently mean small planes appearing on a finished crystal. In the description, facets are planes obtained by slightly slanting A-planes or M-planes toward the c-axis. Sometimes the facets which are attained by slanting A-planes are called "A-derivative" facets. {11-21} and {11-22} are A-derivative facets. The facets which are attained by slanting M-planes are called "M-derivative" facets. {1-101} and {1-102} are M-derivative facets.

A V-groove (valley) is formed by two crossing planes having common forward three indices h, k, m and different fourth index n. Typical valleys are made, for example, by A-derivative facets {2-1-1±1} or {2-1-1±2}. Other typical valleys are f M-derivative facets {1-10±1} or {1-10±2}.

The fourth index is either 2 or 1 in the above examples of the V-grooves. Lower fourth index planes appear with higher probability. The fourth index n means an inclination to the c-axis. {2-1-11} facets are obtained by slanting {2-1-10} A-planes slightly to the c-axis. {2-1-12} facets are obtained by further slanting {2-1-11} facets to the c-axis. Higher fourth index n means a larger slanting angle to the c-axis and a smaller inclination to the horizontal plane; C-plane (0001). Probable values of the forth index n are n=1, 2, 3 and 4.

In many cases, a V-groove is formed by one-step facets. A concept of two-step facets will appear later. A V-groove is sometimes formed by two different slope facets. Upper pairs of facets are bigger and steeper, which has a smaller n. The upper facets are called "groove-facets". Lower pair of facets have smaller and milder, which has a larger n. The lower facets of a V-groove are called "shallower" facets.

V-grooves (valleys) are formed mainly by M-derivative {11-22} facets or A-derivative {1-101} facets (groove facets, upper facets) in the present invention. The length of the a-axis (=b-, d-axis) is denoted by "a". The length of the c-axis is denoted by "c". An inclination of {1-101} facets to the C-plane is given by $\tan^{-1}(3^{1/2}a/2c)$. An inclination of {11-22} facets to the C-plane is given by $\tan^{-1}(a/c)$.

Shallower facets appearing at bottoms of pits are denote by {11-23}, {1-102}, {11-24}, {1-103} which have index n of higher values. Slanting angles of {1-10n} planes (n≧2) to C-plane are $\tan^{-1}(3^{1/2}a/2cn)$. The slanting angles of $\tan^{-1}(3^{1/2}a/2cn)$ for n larger than 2 are smaller than the slanting angle for n=1. Slanting angles of {11-2n} planes (n≧3) to C-plane are $\tan^{-1}(2a/cn)$. The slanting angles of $\tan^{-1}(2a/cn)$ for n larger than 3 are smaller than the slanting angle for n=2. The facet having a larger index n is denoted by a shallower facet.

GaN is a wurtzite type crystal of hexagonal symmetry. A GaN unit cell is a hexagonal column having a hexagonal bottom including seven Ga atoms positioned at six corners and a center point, a ⅜ height hexagonal plane including seven N atoms positioned at six corners and a center point, a ½ height hexagonal plane including three Ga atoms at corners of an equilateral triangle, a ⅞0 height plane including three N atoms at corners of an equilateral triangle, and a hexagonal top including seven Ga atoms positioned at six corners and a center point. GaN has three-fold rotation symmetry. GaN, however, has neither inversion nor six-fold rotation symmetry.

Sapphire, silicon (Si), gallium arsenide (GaAs) wafers are used as an undersubstrate. Sapphire (α-Al O), trigonal symmetry, lacks three-fold rotation symmetry and inversion symmetry. Poor symmetry deprives sapphire of cleavage. Uncleavability is a serious drawback of sapphire.

Silicon has diamond-type cubic symmetry. Si has three Miller indices. Cubic symmetry enables three Miller indices k, h, m to define plane orientations (khm). Three Miller indices are independent. Unlike hexagonal symmetry, there is no sum rule among three Miller indices. Namely in general k+h+m≠0. Cubic symmetry has only one three-fold rotation symmetric direction. The direction is an orthogonal line direction, which is normal to a (111) plane. Usual silicon devices have been manufactured upon (001) plane substrates. But, the (001) plane lacks three-fold rotation symmetry. The (001) Si wafer cannot be a candidate for an undersubstrate of growing hexagonal GaN. Three-fold rotation symmetric Si (111) wafers can be a candidate for the undersubstrate.

GaAs is not hexagonal but cubic. GaAs has a zinc blende type (ZnS) lattice structure. Cubic GaAs is fully defined by three plane indices. GaAs has a unique three-fold rotation symmetry direction which is parallel to an orthogonal line. The three-fold symmetric plane is denoted by a (111) plane. Usual GaAs devices have been produced upon (001) planes which have cleavage planes (±1±10) perpendicular to the surface on four sides. But, the (001) wafer which lacks three-fold rotation symmetry cannot be an undersubstrate. Instead of (001), a (111) GaAs wafer can be a candidate for an undersubstrate for GaN growth.

GaAs lacks inversion symmetry. A (111) plane has two versions. One is a (111) plane having dangling As atoms. The other is a (111) plane having dangling g Ga atoms. The former is sometimes denoted by (111) As plane and the latter is denoted by (111) Ga plane. (111) Ga is otherwise represented by (111) A. (111) As is represented by (111) B.

The present invention employs a vapor phase growth for making GaN, for example, an HVPE method, an MOCVD method, an MOC method and a sublimation method. The methods are described.

[1. HVPE Method (Hydride Vapor Phase Epitaxy)]

HVPE employs metal gallium (Ga) as a gallium source unlike MOCVD or MOC. A nitrogen source is ammonia gas. The HVPE apparatus contains a vertical hot-wall furnace, a Ga-boat sustained at an upper spot in the furnace, a susceptor installed at a lower spot in the furnace, top gas inlets, a gas exhausting tube and a vacuum pump. An undersubstrate (sapphire etc.) is put on the susceptor. Metal Ga solids are supplied to the Ga-boat. The furnace is closed and is heated. The Ga solids are heated into a melt. Hydrogen gas ($H_2$) and hydrochloric acid gas (HCl) are supplied to the Ga-melt. Gallium chloride (GaCl) is produced. Gaseous GaCl is carried by the hydrogen gas downward to the heated undersubstrate. Hydrogen gas ($H_2$) and ammonia gas ($NH_3$) are supplied to the gaseous GaCl above the susceptor. Gallium nitride (GaN) is synthesized and is piled upon the undersubstrate for making a GaN film. The HVPE has an advantage of immunity from carbon contamination, because the Ga source is metallic Ga and GaCl is once synthesized as an intermediate.

[2. MOCVD Method (Metallorganic Chemical Vapor Deposition)]

An MOCVD method is the most frequently utilized for growing GaN thin films on sapphire substrates. An MOCVD apparatus includes a cold wall furnace, a susceptor installed in the furnace, a heater contained in the susceptor, gas inlets, a gas exhaustion hole and a vacuum pump. A material for Ga is metallorganic compounds. Usually trimethyl gallium (TMG) or triethyl gallium (TEG) is employed as a Ga source. The material for nitrogen is ammonia gas. A substrate is placed upon the susceptor in the furnace. TMG gas, $NH_3$ gas and $H_2$ gas are supplied to the substrate on the heated susceptor. Reaction of ammonia and the TMG gas makes gallium nitride (GaN). GaN piles upon the substrate. A GaN film is grown on the substrate. This is the most prevalent way of making GaN films on sapphire substrates for producing InGaN-LEDs. The growing speed is low. If thick GaN crystals are made by the MOCVD, some problems occur. One is the low speed of growth. Another problem is low gas utility rate, which was not a problem for making thin films by consuming small amounts of material gases. The MOCVD requires excess amount of gas of ammonia. High rate of ammonia/TMG raises gas cost in the case of bulk crystal production due to a large consumption of gases. The low gas utility rate caused a serious problem in the case of making a thick GaN crystal. Another one is a problem of carbon contamination. The TMG (Ga-material) includes carbon atoms. The carbon atoms contaminate a growing GaN crystal. The carbon contamination degrades the grown GaN crystal, because carbon makes deep donors which lowers electric conductivity. The carbon contamination changes an inherently transparent GaN crystal to be yellowish.

[3. MOC Method (Metallorganic Chloride Method)]

A Ga material is a metallorganic material, for example, TMG (trimethylgallium) like the MOCVD. In the MOC, however, TMG does not react directly with ammonia. TMG reacts with HCl gas in a hot wall furnace. The reaction yields gallium chloride (GaCl) once. Gaseous GaCl is carried to a heated substrate. GaCl reacts with ammonia supplied to the substrate and GaN is synthesized and piled on the substrate. An advantage of this invention is small carbon contamination since GaCl is made at the beginning step. This method, however, cannot overcome the difficulty of excess gas consumption.

[4. Sublimation Method]

A sublimation method does not utilize gas materials but solid materials. The starting material is GaN polycrystals. The sublimation method makes a GaN thin film on an undersubstrate by placing polycrystalline GaN solid at a place and an undersubstrate at another place in a furnace, heating the furnace, yielding a temperature gradient in the furnace, subliming the solid GaN into GaN vapor, transferring the GaN vapor to the substrate at a lower temperature, and piling GaN on the substrate.

Before fundamental principles of the present invention are described, the three problems are clarified further.

A problem of the previous facet growth maintaining facet pits is a state of an assembly of dislocations. Propagation of dislocations on the facets in the pits sweeps and concentrates many dislocations to the center of the pit. The state of dislocation assemblies is unstable, which is a serious problem.

When two dislocations having different signs of Burgers vectors, which means a direction and a size of slipping of lattices, collide with each other, the dislocations sometimes vanish by occurrence of favorable cancellation. In practice, most of the dislocations swept by the same facet have Burgers vectors of same signs. No cancellation occurs between two dislocations of the same signs of Burgers vectors. Thus, the dislocations gathered to the dislocation assembly are scarcely cancelled by the reciprocal sign Burgers vectors. The converged dislocations do not vanish at the confluence of dislocations.

Repulsive force occurs between two dislocations of the same sign Burgers vectors. The repulsive force tends to release bundles of the once concentrated dislocations by giving the dislocations centrifugal forces. The dislocations diffuse outward by the repulsion. The diffusion yields hazy dispersion of dislocations in the vicinity of the dislocation bundles. The hazy dislocation dispersion is a problem.

The reason of making the hazy dislocation dispersion is no clear enough yet for the inventors. One reason is stress concentration due to the dislocation convergence. A plurality of pits are often coupled into a bigger pit during the growth. Coupling pits disturbs the arrangement of dislocations. Perturbation of the dislocation arrangement is another reason of the hazy dislocation diffusion occurring.

The number of assembled dislocations to the dislocation confluence increases. The increase of dislocations enlarges the hazy dislocation dispersion. Another reason is an increase of dislocations by the coupling of pits.

While dislocations gather to the center of the pits composed of facets, corner lines between neighboring facets yield six planar assemblies of dislocations hanging from the corner line, which lie along 6 radii which coincide with each other by 60 degree rotation. The planar defects hanging on the corner lines are generated by the facets sweeping dislocations to the six corner lines of hexagonal pits.

When the unification of pits enlarges a pit size, the number of the dislocations centripetally converging to the center increases, which enhances further the size of the planar defects. This is another drawback of the previous facet growth.

The positions of pit appearing are random, stochastic and accidental matters. Pits appear at random spots by chance. The positions of the facet pits are uncontrollable, stochastic and random.

When optoelectronic devices are produced upon a GaN substrate with the wide hazy dislocation dispersion, random dislocation assemblies fluctuate qualities of the devices, which decreases the yield of the device production.

The problems of the present invention are described again. The facet growth grows a GaN crystal by maintaining facets, sweeping dislocations on the facets to a bottom confluence and storing the dislocations at a narrow confluence. A problem is the non-convergence of dislocations and dislocation dispersion from the confluence. The dislocation dispersion would be solved by giving effective dislocation annihilation/accumulation devices in the GaN crystal.

Instead of a random narrow confluence following a pit, this invention intentionally makes regularly aligning defect assemblies as a dislocation annihilation/accumulation place. The present invention prepares dislocation annihilation/accumulation places by giving defect assemblies ruled by making defect assemblies at designed spots in a growing crystal.

The previous facet growth transports and converges dislocations by maintaining facets leading slopes. The function of conveying facets is not restricted in pit-shaped facets. Slopes of facets are important for sweeping dislocations. Shapes of a set of facets are less important. The inventors hit upon an idea of employing a linear set of facet strips instead of isolated conical facet pits.

The present invention makes a rack-shaped faceted surface having a number of linear valleys and hills aligning in parallel at a definite pitch, which looks like a series of triangle columnar prisms lying side by side.

FIG. 4, which is a section of a V-groove composed of facets, briefly demonstrates a method of the present invention. The same section continues in the direction vertical to the figure in FIG. 4. FIG. 3 is a section of a conical pit of the previous facet growth method. FIG. 4 sections are slightly similar to FIG. 3 sections. But, the actual shapes are quite different. Don't confuse the linearly continual FIG. 4 sections with the isolated FIG. 3 sections. An undersubstrate (not shown in the figures) allows a GaN crystal 22 to grow with facets 26 in a facet growth mode. A pair of complementarily inclining facets 26 and 26 forms a V-groove 24. Following the bottoms (valleys) 29 of the V-grooves 24, voluminous defect accumulating regions (H) grow upward. Low dislocation single crystal regions (Z) grow under slopes of the facets 26. There are flat tops 27 outside of the facet grooves 24. The flat top 27 is a C-plane. C-plane growth regions (Y) grow under the flat C-planes 27. The valleys 29 lead voluminous defect accumulating regions (H).

A facet 26 leads a low dislocation single crystal region (Z). A flat top 27 leads a C-plane growth region (Y). The C-plane growth regions (Y), which are low dislocation density single crystals, have electric resistance higher than that of the low dislocation single crystal regions (Z). Growing facets 26 sweep dislocations of the low dislocation single crystal regions (Z) and the C-plane 27 growth regions (Y) inward and converge the dislocations into the voluminous defect accumulating regions (H). Almost all of the dislocations centripetally run in parallel to the C-plane toward the voluminous defect accumulating regions (H). A part of dislocations couple and extinguish. The rest of the dislocations are arrested and accumulated in the voluminous defect accumulating regions (H). A voluminous defect accumulating region (H) consists of an inner core (S) and an interface (K). The dislocation annihilation/accumulation place is either a sole interface (K) or a set of a interface (K) and a core (S). The interface (K) or the core (S) never allow once-captivated dislocations to escape therefrom.

Unlike a narrow defect assembly 15 as shown in FIG. 3(1), the present invention prepares wide voluminous defect accumulating regions (H) and storing dislocations by the voluminous defect accumulating regions (H) with a definite thickness. Wideness and voluminousness enable the voluminous defect accumulating regions (H) to accommodate far more dislocations than the lean defect assembly 15 of FIG. 3(1). One advantage of the present invention is the vast capacity of the voluminous defect accumulating regions (H).

Instead of polygonal pits, the present invention employ linear facets aligning as wide strips extending in a definite direction. Six radial corner lines, which accompany polygonal pits, do not occur on a surface composed of the linear facets. The linear facets would not make radial planar defects. The present invention can avoid the difficulty of occurrence of planar defects, which is a drawback of the previous facet growth, by adopting linear facets.

It is confirmed that linear facet slopes enable linear polycrystalline regions with grain boundaries (K) to occur at the bottoms of the facets and the grain boundaries (K) to act as a dislocation annihilation/accumulation place.

The dislocation annihilation/accumulation places allow the present invention to eliminate the hazy dislocation diffusion from the confluence. The dislocation annihilation/accumulation places clear stagnating dislocations away from the narrow confluence. The dislocation annihilation/accumulation places also kill radial planar defects 10 as shown in FIG. 1(b).

The polycrystalline regions are suitable for the annihilation/accumulation places. The polycrystal character allows the voluminous defect accumulating regions (H) to accommodate much many dislocations. The inventors found out that the effective dislocation annihilation/accumulation place is not restricted to the polycrystalline regions (H).

Besides polycrystalline voluminous defect accumulating regions (H), some sorts of single crystal regions are also effective as the dislocation annihilation/accumulation places. Available single crystal regions (H) are a single crystal having an orientation slanting to the surrounding single crystal regions, a single crystal having an interface composed of planar defects, and a single crystal having an interface built with small inclination grain boundaries. Surprisingly, another single crystal (H) having an inverse polarity, which means the direction of a c-axis, is also available for a dislocation annihilation/accumulation place. Polycrystalline and single crystal voluminous defect accumulating regions (H) have a large volume with a definite width h. The large volume ensures large capacity of storing dislocations.

The dislocation annihilation/accumulation regions have a definite width h instead of an indefinitely thin regions (=planes). The definite thickness and volume of the annihilation/accumulation regions (H) have advantages over conventional ELO methods. A conventional epitaxial lateral overgrowth method (ELO) utilizing a similar stripe structure forms small facets, gathers dislocations by the facets to bisecting planes between neighboring windows, and stores the dislocations at the bisecting planes which become planar defects. The planar defects made by the conventional ELO have neither a sufficient thickness nor an enough volume, since the thickness of the planes is indefinitely small. Excess concentration of dislocations enhances the repulsion among dislocations, releases the dislocations and allows the dislocations to diffuse outward.

On the contrary, the present invention can produce the voluminous defect accumulating region (H) having a sufficient, definite thickness. The definite thickness produces two interfaces on both sides. Dislocations attracted from a left side are arrested and stored on a left side interface $K_1$. Dislocations attracted from a right side are gathered and accommodated on a right side interface $K_2$. Dislocations are divided into halves. The number of the dislocations accumulated on an interface is reduced to a half. The division weakens mutual repulsion among converged dislocations.

The voluminous defect accumulating region (H) is a region having a definite thickness. Inner cores (S) can also accommodate dislocations. The dislocation density per unit volume is reduced by additional accumulation in the cores (S). Lower dislocation density in the voluminous defect accumulating regions (H) prevents dislocations from relaxing and escaping.

The conventional ELO method relies upon C-plane growth which maintains a smooth C-plane surface without facets. The dislocations once assembled into the planar defects (bisecting planes) are not constricted and begin to disentangle themselves from the planar defects. Diffusion of the dislocations proceeds during the growth. Dislocations disperse uniformly in the growing GaN crystal. An average dislocation density is about $10^7$ cm$^-$ in the GaN crystal obtained by the conventional ELO. The GaN crystal of such a $10^7$ cm$^-$ high dislocation density is entirely useless for a substrate for making InGaN laser diodes.

This invention succeeds in avoiding burying of facet slopes, in maintaining the facet slopes by forming voluminous defect accumulating regions (H) of a definite thickness, and in captivating dislocations in the voluminous defect accumulating regions (H).

This is a feature of the present invention. What enables the regions (H) to encapsulate dislocations is either polycrystalline voluminous defect accumulating regions (H) or single crystalline voluminous defect accumulating regions (H) having shallow facets on the top.

The defect accumulating regions (H) should have a definite width for permanently arresting dislocations. The "definite width" is signified by a word "voluminous". Thus, the accumulating regions are called "voluminous" defect accumulating regions (H). The gist of the present invention is to decrease dislocations by growing GaN with voluminous defect accumulating regions (H). The width of the voluminous defect accumulating regions (H) is 1 μm to 200 μm.

The voluminous defect accumulating regions (H) and the low dislocation single crystal regions (Z) occur, satisfying a complementary relation. Controlling positions and sizes of voluminous defect accumulating regions (H) occurring determines positions and sizes of the low dislocation single crystal regions (Z). The positions and sizes of voluminous defect accumulating regions (H) can be predetermined by implanting mask as a seed of growing voluminous defect accumulating regions (H) at an early stage of growth. The seed makes a voluminous defect accumulating region (H) thereupon. A set of facets having slopes is made in the neighborhood of the voluminous defect accumulating regions (H). The facets induce formation of low dislocation single crystal regions (Z) following the facets. Thus, implantation of the seed mask can control the sizes and positions of the low dislocation single crystal regions (Z) via formation of voluminous defect accumulating regions (H).

Motivation of making facet valleys leading voluminous defect accumulating regions (H) depends upon the kinds of the voluminous defect accumulating regions (H). A common motivation is the stripe mask which produces cavities upon the stripes by delaying growth. Growing speed on the mask stripes is lower than the speed on the undersubstrate. The delay of forming surfaces is a reason of making cavities upon the stripes. The cavities stabilize forming and maintaining facet valleys following the stripes.

The voluminous defect accumulating regions (H) has a tendency of inviting occurrence of milder inclining facets thereupon. The milder (shallower) facets form stable valleys made of facets (FIG. 5(b)).

Positions of the valleys are determined. The state having valleys of facets is stable. The valleys are not buried but maintained. Controlling positions of facets is realized by this process. Therefore, positions of low dislocation single crystal regions (Z) and defect accumulating regions (H) are determined and controllable. The low dislocation single crystal regions (Z) and the defect accumulating regions (H) can be regularly arranged. This is one of important points in this invention.

The voluminous defect accumulating regions (H) appear in various versions. Polycrystalline or single crystalline voluminous defect accumulating regions (H) originate from the mask. Polycrystalline voluminous defect accumulating regions (H) discern themselves from the surrounding portions by the difference of a crystalline structure. Single crystal voluminous defect accumulating regions (H) can discriminate themselves from the surrounding portions by existence of interfaces. For example, a single crystal voluminous defect accumulating region (H) is encapsulated by interfaces of planar defects.

The planar defect interface is induced by milder (shallower) sloped facets appearing at an early stage of growth on the top, and the shallow facets make the planar defect interface as interface between two kinds of facets. Cooperation of two different slope facets gather dislocations into the interfaces therebetween, which therefore become a dislocation annihilation/accumulation place.

A conspicuous, unexpected feature is frequently appearing polarity-inversion of voluminous defect accumulating regions (H). The polarity (direction of c-axis) of the voluminous defect accumulating regions (H) is different by 180 degrees from the c-axis of the other low dislocation single crystal regions (Z) and C-plane growth regions (Y). In the inversion case, clear grain boundaries happen at the interfaces between the voluminous defect accumulating regions (H) and the low dislocation single crystal regions (Z). The interface grain boundaries play an active role of accumulating the dislocations swept and gathered by the growing facets. In particular in the case of the polarity-inversion occurring in the voluminous defect accumulating regions (H), controlling of the facet growth can be successfully achieved. The reason is that the region of the polarity-inversion grows more slowly than other regions, the inventors suppose.

The above is the basic principle basing the present invention.

The present invention allows a GaN crystal to solve three mentioned serious problems; the hazy dispersion of diffusing dislocations, the planar defects occurring at the dislocation confluence, and the difficulty of controlling positions of the dislocation confluence. The present invention grows a rack-roof GaN crystal having parallel valleys and hills as shown in FIG. 7 and makes a flat, smooth GaN substrate of low dislocation density as shown in FIG. 8. by mechanical processing the rack-roof GaN crystal.

In FIG. 7, a GaN crystal 22 grown on an undersubstrate 21 has a rack-shaped roof of repetitions of parallel hills and valleys which are steep facets. A voluminous defect accumulating region (H) accompanies a valley of the rack-roof in the vertical direction. Slopes forming the hills and valleys are facets 26. What accompanies the facets 26 in the vertical direction are the low dislocation single crystal regions (Z). FIG. 7 shows a GaN crystal having sharp ridges on the hills without flat C-plane growth regions (Y). In this case, the part held between neighboring voluminous defect accumulating regions (H) is a uniform low dislocation single crystal region (Z). The pitch p, the widths z and h satisfy an equation p=z+h. Otherwise in the case of a GaN including C-plane growth regions (Y), the pitch p, the widths z, y and h satisfy another equation p=2z+y+h. The relation between the height of the hill and the pitch p is described later. FIG. 8 demonstrates a rectangle wafer made by eliminating the undersubstrate from the as-grown GaN substrate, grinding the rack-roof on the top surface and polishing both surfaces of the ground wafer. The GaN wafer has a HZYZHZYZH ... structure having regularly, periodically aligning voluminous defect accumulating regions (H), low dislocation single crystal regions (Z) and C-plane growth regions (Y). The shape of the C-plane growth regions (Y) depends upon the growth condition. Sometimes the C-plane growth regions (Y) meander with a fluctuating width.

SUMMARY OF THE INVENTION

The present invention succeeds in obtaining a low dislocation density GaN single crystal substrate by making parallel facet V-grooves by the facet growth, producing voluminous defect accumulating regions (H) at the valleys, depriving other parts of dislocations by the facets, gathering dislocations to the voluminous defect accumulating regions (H) at the valleys (bottoms) of the V-grooves and annihilating/accumulating the dislocations in the voluminous defect accumulating regions (H) permanently. The formation of the voluminous defect accumulating regions (H) enable the present invention to solve all the three problems aforementioned;

(1) to reduce the hazy dislocation diffusion dispersing from the defect assemblies below the valleys of facets;
(2) to extinguish the planar defects formed below the valleys of facets; and
(3) to control the positions of the defect assemblies formed under the valleys of the facets.

The present invention can make a low dislocation density GaN single crystal substrate by controlling the positions of the voluminous defect accumulating regions (H). The major portions (Z) and (Y) of the GaN substrate of the present invention are low dislocation density single crystals obtained by concentrating dislocations into narrow, restricted portions aligning regularly and periodically. The GaN substrates are suitable for a low dislocation substrate for fabricating blue, violet light laser diodes.

BRIEF DESCRIPTION OF THE DRAWINGS

FIG. 1 are perspective views of a pit composed of facets which have been produced by a facet growth method, which was proposed in the previous Japanese Patent Laying Open No. 2001-102307 invented by the inventors of the present invention, for growing a GaN crystal with maintaining facets on a growing surface, and for clarifying that facets grow slantingly inward and gather dislocations to corner lines. FIG. 1($a$) exhibits that dislocations are swept inward by growing inclining facets and are stored at the bottom of the pit. FIG. 1($b$) shows that mutual repulsion causes six radial planar defects hanging from the corner lines.

FIG. 3 are vertically sectioned views of a pit for showing that dislocations are swept and gathered to the corner lines by inward growing facets and accumulated at dislocation confluence (manifold point) under the center bottom of the pit and shaped into longitudinally extending bundles of dislocations hanging from the bottom in a facet growth suggested by Japanese Patent Laying Open No. 2001-102307 invented by the inventors of the present invention. FIG. 3(1) demonstrates a bundle of dislocations which are formed with dislocations gathered by the facet growth. FIG. 3(2) demonstrates that the dislocation bundle is not closed but open and strong repulsion releases the once gathered dislocations outward into hazy dislocation dispersion.

FIG. 4 are vertically sectioned views of a longitudinally extending V-groove having a valley for showing that dislocations are transferred by inward growing facets and are formed into voluminous defect accumulating regions (H) dangling from the valley of the facets. FIG. 4(1) indicates that the facet growth concentrates dislocations to the voluminous defect accumulating region (H) at the bottom of the valley. FIG. 4($b$) shows the voluminous defect accumulating region (H) at the bottom absorb dislocations by the upward growth.

FIG. 5 are sectional views of a sample at various steps for demonstrating the steps of the present invention of making a linearly extending stripe mask on an undersubstrate, growing a GaN crystal on the masked undersubstrate, producing linear facets on the stripe mask, producing voluminous defect accumulating regions (H) under the valleys of the facets, and growing low dislocation single crystal regions (Z) neighboring the voluminous defect accumulating regions (H). FIG. 5(a) shows a single facet case having sets of steep slope facets without shallow facets. FIG. 5(b) shows a double facet case having sets of steep slope facets followed by sets of shallow facets.

FIG. 6 are CL plan views of a stripe mask and a grown GaN crystal for showing a GaN growth of the present invention. FIG. 6(a) is a CL plan view of a sample having a stripe mask on an undersubstrate. FIG. 6(b) is a CL plan view of a GaN crystal having a ZHZYZHZYZ ... structure of repetitions of a set of a voluminous defect accumulating region (H), a low dislocation single crystal region (Z) and a C-plane growth region (Y).

FIG. 9 are CL plan views of mirror polished GaN crystals having a ZHZYZHZYZ ... periodic structure of repetitions of a set of a voluminous defect accumulating region (H), low dislocation single crystal region (Z) and a C-plane growth region (Y) which are made by forming a stripe mask on an undersubstrate and growing a GaN crystal epitaxially on the masked undersubstrate. FIG. 9(a) is the CL plan view of the mirror polished GaN crystal having a ZHZYZHZYZ ... periodic structure which is made by forming a stripe mask in parallel to a <1-100> direction of GaN on an undersubstrate and growing a GaN crystal epitaxially on the masked undersubstrate. FIG. 9(b) is the CL plan view of the mirror polished GaN crystal having a ZHZYZHZYZ ... periodic structure which is made by forming a stripe mask in parallel to a <11-20> direction of GaN on an undersubstrate and growing a GaN crystal epitaxially on the masked undersubstrate.

FIG. 10 are sectional views of a sample at various steps for demonstrating the steps of the present invention of making a linearly extending stripe mask on an undersubstrate, growing a GaN crystal on the masked undersubstrate, producing linear facets on the stripe mask, producing voluminous defect accumulating regions (H) under valleys of the facets and growing low dislocation single crystal regions (Z) neighboring the voluminous defect accumulating regions (H), grinding a rugged faceted surface, eliminating the undersubstrate for separating a GaN substrate, and lapping the GaN substrate and polishing the GaN substrate. FIG. 10(1) shows a sapphire undersubstrate. FIG. 10(2) denotes a sample having a GaN epi-layer formed on the sapphire undersubstrate. FIG. 10(3) illustrates a stripe mask formed on the GaN epi-layer. FIG. 10(4) shows a CL section of an as-grown GaN sample having a facet surface with valleys, voluminous defect accumulating regions (H) following the valleys, low dislocation single crystal regions (Z) under the facets and C-plane growth regions (Y) under the flat tops. FIG. 10(5) shows a section of a mirror polished GaN substrate having a HZYZHZYZH ... structure composed of the voluminous defect accumulating regions (H), low dislocation single crystal regions (Z) and the C-plane growth regions (Y).

FIG. 11 are sectional views of a sample at various steps for demonstrating the steps of the present invention of making a linearly extending stripe mask on an undersubstrate, growing a GaN crystal on the masked undersubstrate, producing linear facets on the stripe mask, producing voluminous defect accumulating regions (H) under valleys of the facets and growing low dislocation single crystal regions (Z) neighboring the voluminous defect accumulating regions (H), grinding a rugged faceted surface, eliminating the undersubstrate for separating a GaN substrate, and lapping the GaN substrate and polishing the GaN substrate. FIG. 11(1) shows a foreign material undersubstrate with a stripe mask. FIG. 11(2) denotes a CL section of an as-grown GaN sample having a facet surface with valleys, voluminous defect accumulating regions (H) following the valleys, low dislocation single crystal regions (Z) under the facets and C-plane growth regions (Y) under the flat tops. FIG. 11(3) shows a section of a mirror polished GaN substrate having a HZYZHZYZH ... structure composed of the voluminous defect accumulating regions (H), low dislocation single crystal regions (Z) and the C-plane growth regions (Y).

FIG. 12(1) is a section of the prepared GaN undersubstrate having an inherent structure ... HZYZHZYZH ..., which is observable in a CL image. FIG. 12(2) is a CL-observed section of a thick-grown GaN ingot having H, Z and Y grown on the H, Z and Y regions of the parent GaN substrate. FIG. 12(3) is CL-observed sections of a plurality of GaN wafers sliced from the tall GaN ingot.

DETAILED DESCRIPTION OF THE PREFERRED EMBODIMENTS

Figure 2:
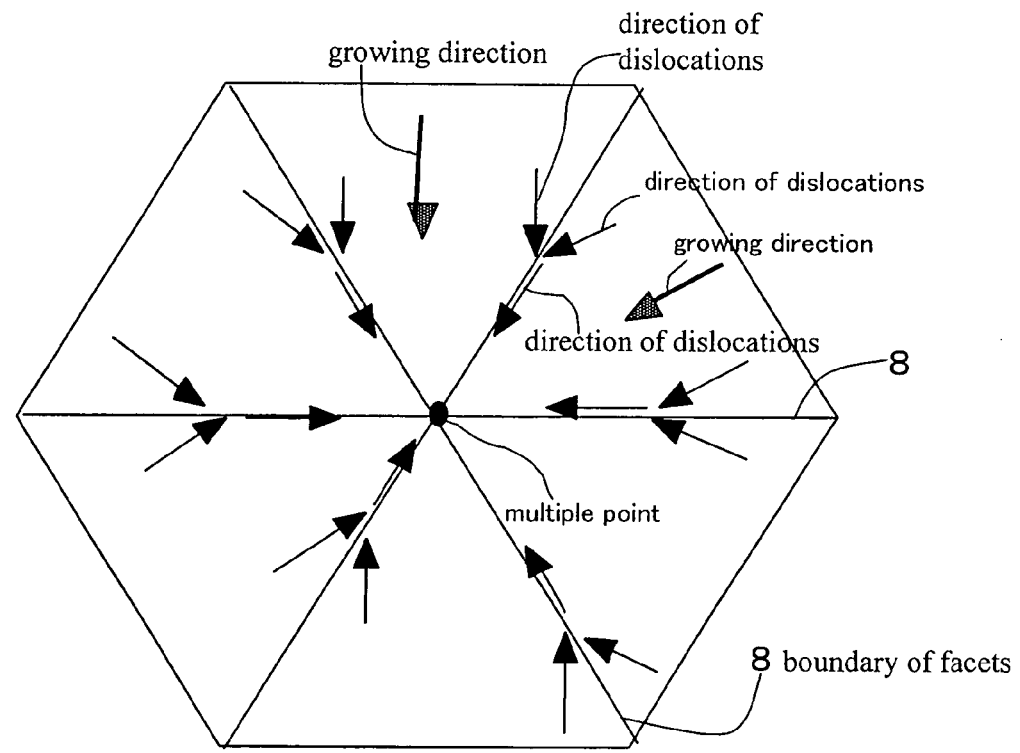
FIG. 2 is a plan view of a pit for showing that dislocations are swept and gathered to corner lines by inward growing facets and accumulated at dislocation confluence (manifold point) under the center bottom of the pit in a facet growth suggested by Japanese Patent Laying Open No. 2001-102307 invented by the inventors of the present invention.
Figure 7:
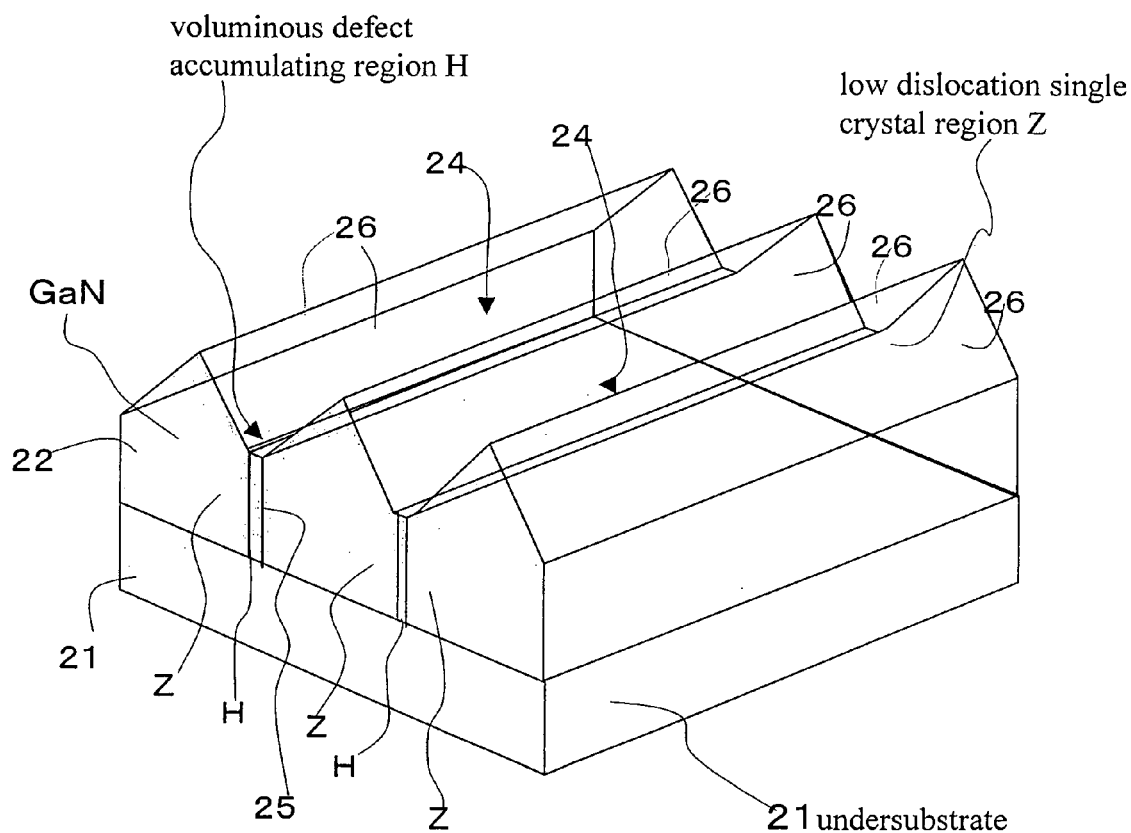
FIG. 7 is an oblique view of a rack-shaped as-grown GaN crystal having a ZHZHZ ... periodic structure of repetitions of a set of a voluminous defect accumulating region (H) and a low dislocation single crystal region (Z) which are made by forming a stripe mask on an undersubstrate and growing a GaN crystal epitaxially on the masked undersubstrate.
Figure 8:
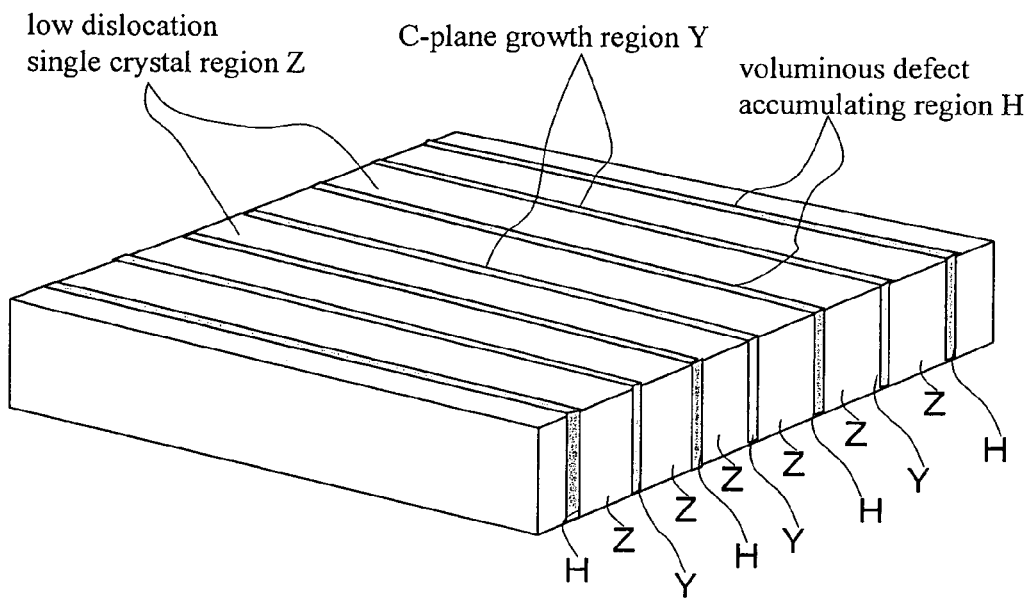
FIG. 8 is a perspective CL view of a mirror polished GaN crystal having a ZHZYZHZYZ ... periodic structure of repetitions of a set of a voluminous defect accumulating region (H), a low dislocation single crystal region (Z) and a C-plane growth region (Y) which are made by forming a stripe mask on an undersubstrate and growing a GaN crystal epitaxially on the masked undersubstrate.

The present invention include various versions. The present invention grows a GaN crystal by forming linear V-grooves (valleys and hills) made of pairs of facets, maintaining the valleys and hills, inducing voluminous defect accumulating regions (H) under the valleys (bottoms), making low dislocation single crystal regions (Z) under the facets (except bottoms) as illustrated in FIG. 7. Interfaces (K) or cores (S) of the voluminous defect accumulating regions (H) attract dislocations from the low dislocation single crystal regions (Z), annihilate parts of dislocations, and accumulate other dislocations.

The present invention reduces dislocations by making use of the interface (K) or the core (S) as a dislocation annihilation/accumulation place (claim 43).

The present invention gives a method of growing a GaN single crystal by making linear voluminous defect accumulating regions (H), producing low dislocation single crystal regions (Z) in contact with the voluminous defect accumulating regions (H), utilizing interfaces (K) or cores (S) of the voluminous defect accumulating regions (H) as dislocation annihilation/accumulation places, and reducing dislocations in other parts except the voluminous defect accumulating regions (H) (claim 44).

The present invention gives a method of growing a GaN single crystal by making linear voluminous defect accumulating regions (H), producing facet slopes in contact with the voluminous defect accumulating regions (H), maintaining the facet slopes, utilizing interfaces (K) or cores (S) of the voluminous defect accumulating regions (H) as dislocation annihilation/accumulation places, and reducing dislocations in other parts except the voluminous defect accumulating regions (H) (claim 45).

For clarifying the relation between the facet slopes and the voluminous defect accumulating regions (H), the present invention is defined as a method of growing a GaN single crystal by making linear voluminous defect accumulating regions (H), producing facet slopes with valleys, the valleys being in contact with the voluminous defect accumulating regions (H), maintaining the facet slopes, utilizing interfaces (K) or cores (S) of the voluminous defect accumulating regions (H) as dislocation annihilation/accumulation places, and reducing dislocations in other parts except the voluminous defect accumulating regions (H) (claim 46).

A GaN grows in practice with a plurality of linear voluminous defect accumulating regions (H). The method is defined by making a plurality of linear voluminous defect accumulating regions (H), producing linear facet slopes neighboring the voluminous defect accumulating regions (H), maintaining the facet slopes and reducing dislocations in other parts except the voluminous defect accumulating regions (H).

For clarifying the relation between the facet slopes and the voluminous defect accumulating regions (H), the present invention is defined as a method of growing a GaN single crystal by making a plurality of linear voluminous defect accumulating regions (H), producing linear facet slopes with valleys, the valleys being in contact with the voluminous defect accumulating regions (H), and reducing dislocations in other parts except the voluminous defect accumulating regions (H).

Pairs of linearly parallel extending facets make valleys, which leads the voluminous defect accumulating regions (H). The shape of parallel valleys looks like lying prisms. Sometimes the prism-shaped facet slopes are optically symmetric.

The symmetric lying prism-shaped facet slopes have flat tops between the pairing slopes.

When the voluminous defect accumulating regions (H) extends in a <1-100> and in a <0001> direction, the facets are denoted by {kk-2kn} (k,n integers).

Most prevalent facets are {11-22} planes in the case. The voluminous defect accumulating regions (H) can otherwise extend in <11-20> direction and in a <1-100> direction. When the voluminous defect accumulating regions (H) extends in a <11-20> and in a <0001> direction, the facets are denoted by {k-k0n} (k,n integers).

Most prevalent facets are {1-101} planes in the case.

In the case of the symmetric prism-shaped facet slopes having flat tops, the extending direction of voluminous defect accumulating regions (H) is either a <1-100> direction or a <11-20> direction. The facets are {11-22} planes, {1-101} planes, {kk-2kn} or {k-k0n} (n, k; integers). The flat tops are (0001) planes and sometimes vary the width and the edge lines.

Figure 13:
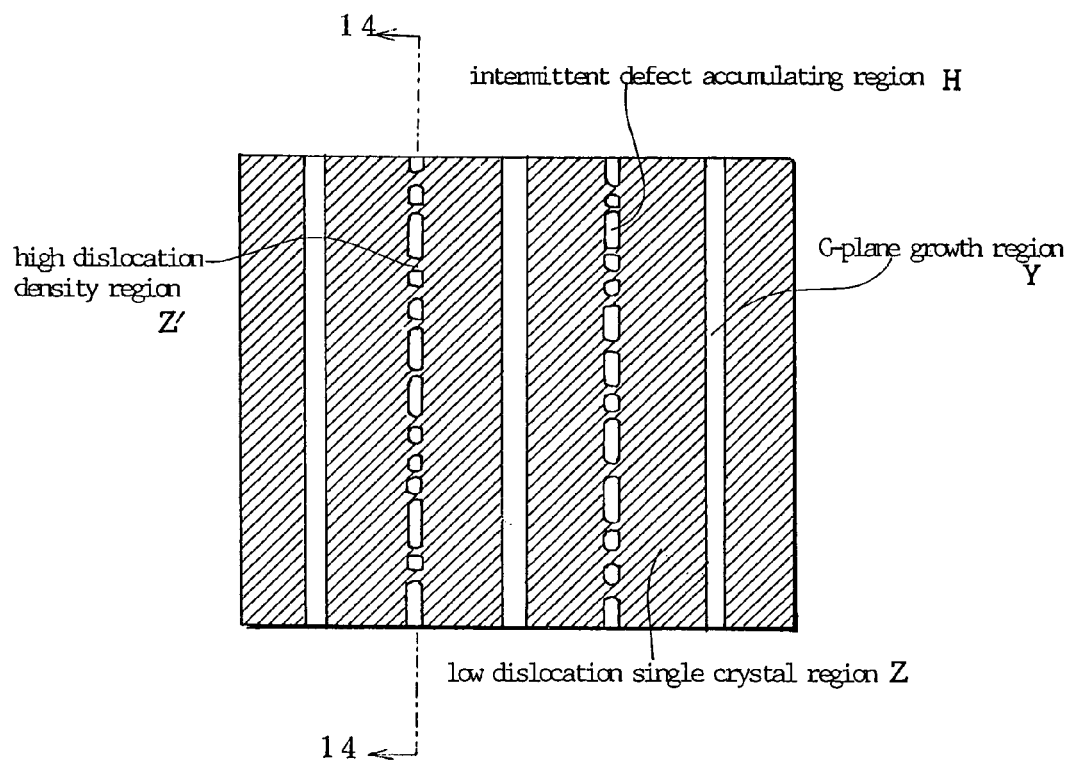
FIG. 13 is a fluorescence microscope-image plan view of a GaN substrate obtained by slicing a thick-grown GaN crystal having intermittent, dotted, discontinual defect accumulating regions (H) extending along lines in parallel to the mask stripes made on an undersubstrate or the parent voluminous defect accumulating regions (H) of a GaN undersubstrate, and high dislocation density regions (Z') which are made of single crystals, exist between the intermittent defect accumulating regions (H) and have high dislocation density.

Voluminous defect accumulating regions (H) are the most significant parts in the present invention. The voluminous defect accumulating regions (H) are parallel continual planes with a definite width and extend both in a vertical direction and in a horizontal direction parallel to the mask stripes. Excess thick grown GaN or anomalously grown GaN sometimes has intermittent, dotted, discontinuous defect accumulating regions (H) with a fluctuating thickness. Since the width is fluctuating, the word "voluminous" should be improper. FIG. 13 shows the intermittent defect accumulating regions (H). In the case, the reciprocal slanting facets gather dislocations to the defect accumulating regions (H). Dislocations are not fully enclosed within the defect accumulating regions (H). Some dislocations deviates from the defect accumulating regions (H). Intermittent, separated discontinuous defect accumulating regions (H) still have the function of annihilating and accumulating dislocations. The intermittent, discontinuous voluminous defect accumulating regions (H) are also contained in an effective scope of the present invention.

Voluminous defect accumulating regions (H) have variations. One of the variations of the voluminous defect accumulating regions (H) is a polycrystalline voluminous defect accumulating region (H).

Otherwise the voluminous defect accumulating regions (H) are single crystals. A set of milder inclining facets appear at valleys, following steeper facets. The voluminous defect accumulating regions (H) grow just under the milder facets.

In this case, the voluminous defect accumulating region (H) has vertical interfaces (K) and (K) which coincide with just boundaries between the milder facets (on H) and the steeper facets (on Z).

Some voluminous defect accumulating regions (H) grow with vertical interfaces (K) composed of planar defects.

Some voluminous defect accumulating regions (H) grow as single crystals having an orientation slightly slanting to an orientation of the neighboring low dislocation single crystal regions (Z).

Some voluminous defect accumulating regions (H), which are formed by milder facets, coincide with an area of the milder facets at the top. Some voluminous defect accumulating regions (H) grow with the same orientation as the milder facets.

Some voluminous defect accumulating regions (H) grow with planar defects under the milder facets.

A very miracle phenomenon sometimes occurs in some voluminous defect accumulating regions (H). It is inversion of polarity (c-axis). The c-axis of the voluminous defect accumulating regions (H) turns over into an inverse direction. As mentioned before, a GaN crystal lacks inversion symmetry. GaN has (anisotropic) polarity at a [0001] axis. A (0001) plane has a different property from a (000–1) plane. It is interesting that polarity inversion happens in the voluminous defect accumulating regions (H). In this inversion case, the voluminous defect accumulating regions (H) grow with a c-axis antiparallel to the c-axis of the neighboring steeper facets leading the low dislocation single crystal regions (Z).

In the inversion case, the voluminous defect accumulating regions (H) grow with a [000–1] axis, but the neighboring steeper facets (on Z) grow with a [0001] axis.

When the extension of the voluminous defect accumulating regions (H) is a <1–100> direction, the milder facets (on H) are {11–2–5} planes or {11–2–6} planes. A minus n index means the polarity inversion.

If no inversion takes place, the milder (shallower) facets (on H) are {11–25} planes or {11–26} planes for the voluminous defect accumulating regions (H) extending in a <1–100> direction.

Optimum ranges of parameters are described. An available range is 1 μm to 200 μm for the width h of a voluminous defect accumulating region (H).

The least of a width h of a voluminous defect accumulating region (H) is 1 μm. A small width under 1 μm is unoperative. The upper limit is 200 μm. An excess large width h over 200 μm induces disorder of a crystal structure. A suitable range is 1 μm to 2000 μm for a width z of a low dislocation single crystal region (Z).

A narrow z less than 10 μm is unoperative. A wide z over 2000 μm induces distortion of facets or crystal defects.

Practical utility as a GaN wafer requires regularly and periodically aligning voluminous defect accumulating regions (H) for allowing low dislocation single crystal regions (Z) to regularly and periodically align therebetween.

An optimum range of a pitch p of the voluminous defect accumulating regions (H) is 20 μm to 2000 μm. A pitch longer than 2000 μm induces distortion of facets and crystal defects. Low dislocation single crystal regions (Z) are made by a fundamental process of making a mask having stripes on an undersubstrate, growing voluminous defect accumulating regions (H) on the stripes, and growing low dislocation single crystal regions (Z) on unmasked parts.

The seed mask is composed of a plurality of parallel linear stripes deposited upon an undersubstrate.

The seed mask induces different behavior of growing a GaN crystal. Steeper facets grow on unmasked undersubstrate, leading GaN single crystals. Milder facets grow on mask seeds, leading voluminous defect accumulating regions (H).

Candidates for a material of the seed mask are described. A mask can be made of silicon dioxide ($SiO_2$) or silicon nitride ($Si_3N_4$).

Otherwise, the mask is made of platinum (Pt) or tungsten (W).

Alternatively, the mask is made of polycrystalline aluminum nitride (AlN) or polycrystalline gallium nitride (GaN).

Further, the mask can be made by $SiO_2$ precipitated with polycrystalline GaN on the surface. All of the masks are useful for making voluminous defect accumulating regions (H).

There are variations of methods of making the masks. One method is to make a mask by piling a GaN epi-layer on an undersubstrate, depositing a mask layer on the GaN epi-layer, patterning the mask layer into a suitable mask shape at positions predetermined for producing voluminous defect accumulating regions (H) by photolithography, and growing GaN on the masked GaN epi-layer.

Another method is to make a mask by directly depositing a mask layer on an undersubstrate, patterning the mask layer into a suitable mask shape at positions predetermined for producing voluminous defect accumulating regions (H) by photolithography, and growing GaN on the masked GaN epi-layer. In the latter case, there are two versions for the GaN growth. One version is to grow a buffer layer at a lower temperature on the masked undersubstrate and to grow a thick GaN layer at a higher temperature on the buffer layer. The other is to grow a thick GaN layer at a higher temperature directly on the masked undersubstrate.

In addition to the stripe mask as a seed for generating a voluminous defect accumulating region (H), an ELO(epitaxial lateral overgrowth) mask can be made on an undersubstrate at the same time. A GaN crystal is grown on an undersubstrate covered with both the ELO mask and the stripe seed mask. The co-operation of the ELO mask and the stripe seed mask can be applied also to the aforementioned processes.

Seed masks of the present invention should have parameters within favorable ranges. An optimum range of the width h of the linear voluminous defect accumulating region (H) is 10 μm to 250 μm.

Mask stripes align in parallel with each other with an equal pitch. The pitch is 20 μm to 2000 μm.

A GaN single crystal substrate is made from a grown GaN single crystal by the following processes. A GaN crystal grows with many parallel linear voluminous defect accumulating regions (H), linear low dislocation single crystal regions (Z) and linear C-plane growth region (Y). Dislocations in the low dislocation single crystal regions (Z) and the C-plane growth region (Y) are reduced by making the best use of the voluminous defect accumulating regions (H) as dislocation annihilation/accumulation places. An as-grown GaN crystal substrate with low dislocation density single crystal regions (Z) and (Y) is obtained. The as-grown GaN substrate is treated by mechanical processing (slicing, lapping, grinding). The GaN substrate is finished by polishing into a GaN mirror wafer with a smooth flat surface.

The present invention makes a flat, smooth GaN substrate by forming parallel facet-building valleys on a growing GaN crystal, yielding voluminous defect accumulating regions (H) at the valleys, absorbing dislocations in surrounding low dislocation single crystal regions (Z) and C-plane growth region (Y), annihilating and accumulating the dislocations in the voluminous defect accumulating regions (H), processing an as-grown GaN crystal by mechanical processing, and polishing surfaces of the GaN crystal.

The mechanical processing includes at least one of slicing, grinding, or lapping processing.

The undersubstrate is a GaN, sapphire, SiC, spinel, GaAs or Si substrate.

A GaN single crystal substrate of the present invention has a surface including linear low dislocation single crystal regions (Z) with interfaces (K) on both side and parallel linear voluminous defect accumulating regions (H) in contact with the low dislocation single crystal regions (Z) via the interface (K). This means a GaN single crystal substrate of a surface having a "HKZKH" structure. Since the interfaces intervene between (H) and (Z), the symbol (K) will be omitted in symbolized expression of structures. The surface of the GaN is denoted simply by a single "HZH" structure. GaN is defined by an attribute of a surface.

A GaN single crystal substrate of the present invention has a surface including a plurality of regular, periodical repetitions of parallel linear low dislocation single crystal regions (Z) with interfaces on both side and parallel linear voluminous defect accumulating regions (H) in contact with the low dislocation single crystal regions (Z) via the interfaces. This means a GaN single crystal substrate of a surface having a indefinite number of a "HZHZHZ . . . " structure. The structure can be abbreviated to a -(HZ)$^m$- structure. GaN is defined by an attribute of a surface.

A GaN single crystal substrate of the present invention includes planar low dislocation single crystal regions (Z) extending also in a thickness direction with planar interfaces (K) on both side and parallel planar voluminous defect accumulating regions (H) in contact with the planar low dislocation single crystal regions (Z) via the planar interfaces (K). This means a GaN single crystal substrate having a voluminous HZH structure in three dimensions. GaN is defined by an attribute of a voluminous structure.

A GaN single crystal substrate of the present invention includes a plurality of regular, periodical repetitions of planar parallel low dislocation single crystal regions (Z) with planar interfaces on both side and parallel planar voluminous defect accumulating regions (H) in contact with the low dislocation single crystal regions (Z) via the interfaces. This means a GaN single crystal substrate having a indefinite number of a voluminous "HZHZHZ . . . " structure. The structure can be abbreviated to a -(HZ)$^m$- structure. GaN is defined by an attribute of a voluminous structure.

A GaN single crystal substrate of the present invention has a surface including a linear C-plane growth region (Y) of high resistivity, two linear low dislocation single crystal regions (Z) sandwiching the C-plane growth region (Y) and parallel linear voluminous defect accumulating regions (H) in contact with the low dislocation single crystal regions (Z). Electric resistivity of the low dislocation single crystal regions (Z) is lower than that of the C-plane growth regions (Y). This means a GaN single crystal substrate of a surface having a "HZYZH" structure. GaN is defined by an attribute of a surface.

Polarity inversion of the voluminous defect accumulating regions (H) enables the voluminous defect accumulating regions (H) to control the shape of facets. The reason is that the polarity inversion delays the growing speed of the voluminous defect accumulating regions (H).

A GaN single crystal substrate of the present invention has a surface including a plurality of regular, periodical repetitions of a linear C-plane growth region (Y) of high resistivity, two linear low dislocation single crystal regions (Z) sandwiching the C-plane growth region (Y) and parallel linear voluminous defect accumulating regions (H) in contact with the low dislocation single crystal regions (Z). Electric resistivity of the low dislocation single crystal regions (Z) is lower than that of the C-plane growth regions (Y). This means a GaN single crystal substrate of a surface having a " . . . HZYZHZYZHZYZ . . ." structure. The surface of the GaN is denoted simply by an indefinite number of " . . . HZYZHZ . . . " structure. An abbreviated expression is -(HZYZ)$^m$-. GaN is defined by an attribute of a surface.

The C-plane growth regions (Y), which accompany flat tops, have electric resistance higher than the other parts (Z) growing with {11–22} planes. The variance originates from the difference of doping rates through different index planes. The C-plane is plagued by a poor doping rate. The facets are rich in the ability of absorbing dopants. The facet-guided low dislocation single crystal regions (Z) are endowed with high conductivity.

The low dislocation single crystal regions (Z) and the C-plane growth regions (Y), which have the same orientation, have different conductivities resulting from the growing plane difference.

A GaN single crystal substrate of the present invention includes a planar C-plane growth region (Y) of high resistivity, two parallel planar low dislocation single crystal regions (Z) sandwiching the C-plane growth region (Y) and parallel planar voluminous defect accumulating regions (H) in contact with the low dislocation single crystal regions (Z). Electric resistivity of the low dislocation single crystal regions (Z) is lower than that of the C-plane growth regions (Y). This means a GaN single crystal substrate having a voluminous HKZYZKH structure. The surface of the GaN is denoted simply by a single "HZYZH" structure by omitting K. GaN is defined by an attribute of a voluminous structure.

A GaN single crystal substrate of the present invention includes a plurality of regular, periodical repetitions of a planar C-plane growth region (Y) of high resistivity, two parallel planar low dislocation single crystal regions (Z) sandwiching the C-plane growth region (Y) and parallel planar voluminous defect accumulating regions (H) in contact with the low dislocation single crystal regions (Z). This means a GaN single crystal substrate having a . . . HKZYZKHKZYZKHKZYZKH . . . structure. The surface of GaN is denoted simply by an indefinite number of " . . . HZYZHZ . . . " structure by omitting K. An abbreviated expression is -(HZYZ)$^m$-. GaN is defined by an attribute of a voluminous structure.

In the GaN substrate of the present invention, the voluminous defect accumulating regions (H) and the low dislocation single crystal regions (Z) penetrate the substrate from the surface to the bottom (claim 9).

A GaN having the intermittent, discontinuous defect accumulating regions (H), which enjoys low dislocation density of low dislocation single crystal regions (Z), is included within the scope of the present invention.

Variations and attributes of the voluminous defect accumulating regions (H) are described. A voluminous defect accumulating region (H) is a polycrystal (claim 10). A crystal boundary (K) as an interface intervenes between the polycrystalline voluminous defect accumulating region (H) and the surrounding low dislocation single crystal region (Z).

In many cases, however, a voluminous defect accumulating region (H) is single crystal enclosed by planar defects as an interface (K). (claim 11) The planar defect intervenes between the single crystal voluminous defect accumulating regions (H) and the low dislocation single crystal region (Z).

A voluminous defect accumulating region (H) is a single crystal including threading dislocation bundles (claim 12).

A voluminous defect accumulating region (H) is a single crystal including threading dislocations and planar defects. (claim 13).

A voluminous defect accumulating region (H) is a single crystal having an orientation slightly slanting to the orientation of the surrounding low dislocation single crystal regions (Z) (claim 14).

A voluminous defect accumulating region (H) is a single crystal having an threading dislocations and planar defects and being shielded by planar defects as an interface from the surrounding low dislocation single crystal regions (Z) (claim 15).

A voluminous defect accumulating region (H) is a single crystal having a planar defect extending in the length direction and being shielded by planar defects as an interface from the surrounding low dislocation single crystal regions (Z) (claim 16).

A GaN substrate has a surface of a (0001) plane (C-plane) (claim 17).

A voluminous defect accumulating region (H) is a single crystal having a c-axis antiparallel (inverse) to the c-axis of the surrounding low dislocation single crystal regions (Z) (claim 18). Namely, the voluminous defect accumulating regions (H) have an inverse polarity to the surrounding regions (Y) and (Z).

A voluminous defect accumulating region (H) is a single crystal having a c-axis antiparallel (inverse) to the c-axis of the surrounding low dislocation single crystal regions (Z) (claim 18) and being shielded by planar defects from the low dislocation single crystal regions (Z) (claim 19).

A voluminous defect accumulating region (H) is a single crystal including threading dislocations in the inner core (S) and having a c-axis antiparallel (inverse) to the c-axis of the surrounding low dislocation single crystal regions (Z) (claim 20).

A voluminous defect accumulating region (H) is a single crystal including threading dislocations in the inner core (S) and planar defects and having a c-axis antiparallel (inverse) to the c-axis of the surrounding low dislocation single crystal regions (Z) (claim 21).

A voluminous defect accumulating region (H) is a single crystal having a c-axis slightly slanting to a direction antiparallel (inverse) to the c-axis of the surrounding low dislocation single crystal regions (Z) (claim 22).

A voluminous defect accumulating region (H) is a single crystal including threading dislocations and planar defects, having a c-axis antiparallel (inverse) to the c-axis of the surrounding low dislocation single crystal regions (Z) and being shielded by planar defects as an interface from the low dislocation single crystal regions (Z) (claim 23).

A voluminous defect accumulating region (H) is a single crystal including a planar defect extending in the length direction, having a c-axis antiparallel (inverse) to the c-axis of the surrounding low dislocation single crystal regions (Z) and being shielded by planar defects as an interface from the low dislocation single crystal regions (Z) (claim 24).

A voluminous defect accumulating region (H) is a single crystal having a c-axis antiparallel (inverse) to the c-axis of the surrounding low dislocation single crystal regions (Z). The surrounding low dislocations regions (Z) and (Y) have surfaces of a (0001) Ga plane. But, the voluminous defect accumulating regions (H) have surfaces of a (000–1)N plane. (claim 25)

An extending direction of superficial parallel low dislocation single crystal regions (Z) and superficial parallel voluminous defect accumulating regions (H) appearing on a GaN crystal is either a <1–100> direction or a <11–20> direction (claim 27).

Planar low dislocation single crystal regions (Z) and planar voluminous defect accumulating regions (H) are parallel to both a <1–100> direction and a <0001> direction (claim 28).

Planar low dislocation single crystal regions (Z) and planar voluminous defect accumulating regions (H) are parallel to both a <11–20> direction and a <0001> direction (claim 29).

A range of a width of a low dislocation single crystal region (Z) is 10 μm to 2000 μm (claim 30). An annotation is required. When no C-plane growth region (Y) exists, the above width (10 μm-2000 μm) signifies just the width z of the low dislocation single crystal region (Z). But, when a C-plane (Y) intervenes between two neighboring low dislocation single crystal regions (Z), the above width (10 μm-2000 μm) means a sum (2z+y) of widths of two low dislocation single crystal regions (Z) and C-plane growth region (Y).

A preferable range of a width of a low dislocation single crystal region (Z) is 100 μm to 800 μm (claim 31). A similar annotation is required. When no C-plane growth region (Y) exists, the above width (100 μm-800 μm) signifies just the width z of the low dislocation single crystal region (Z). But, when a C-plane (Y) intervenes between two neighboring low dislocation single crystal regions (Z), the above width (100 μm-800 μm) means a sum (2z+y) of widths of two low dislocation single crystal regions (Z) and C-plane growth region (Y).

A range of a width of a voluminous defect accumulating region (H) is 1 μm to 200 μm (claim 32).

A preferable range of a width of a voluminous defect accumulating region (H) is 10 μm to 80 μm (claim 33).

An average of dislocation density of low dislocation single crystal regions (Z) is less than $5 \times 10^6$ cm$^{-2}$ (claim 34).

The dislocation density is less than $3 \times 10^7$ cm$^{-2}$ at points distanced by 30 μm from the voluminous defect accumulating regions (H) within the low dislocation single crystal regions (Z).

Dislocation density of low dislocation single crystal regions (Z) is highest in the vicinity of the interface and decreases as a function of the distance from the interface (claim 35).

A surface of a GaN substrate has cavities formed at the voluminous defect accumulating regions (H) (claim 36).

The depth of the cavities of the voluminous defect accumulating regions (H) is less than 1 μm (claim 37).

Turning over the single crystal GaN substrate of claim 25 upside down gives a GaN substrate as follows.

A voluminous defect accumulating region (H) is a single crystal having a c-axis antiparallel (inverse) to the c-axis of the surrounding low dislocation single crystal regions (Z). The low dislocation single crystal regions (Z) and the C-plane growth regions (Y) have (000–1) planes ((000–1) N planes) and the voluminous defect accumulating regions (H) have (0001) planes (0001)Ga plane. (claim 38) A surface of a GaN substrate has cavities formed at the low dislocation single crystal regions (Z) (claim 39).

A GaN substrate includes parallel planar voluminous defect accumulating regions (H) periodically and regularly aligning with a pitch p and parallel single crystal regions (Z or Z&Y) sandwiched by two neighboring voluminous defect accumulating regions (H) (claim 40). The parallel single crystal regions are either only a low dislocation single crystal regions (Z) or a set ZYZ of two low dislocation single crystal regions (Z) and a C-plane growth region (Y).

Parallel planar voluminous defect accumulating regions (H) align at a constant pitch "p" on a GaN crystal. An allowable pitch p is 20 μm to 2000 μm (claim 41).

A preferable pitch p of the voluminous defect accumulating regions (H) is 100 μm to 1200 μm (claim 42).

The GaN single crystal substrate enables makers to produce on-GaN InGaN laser diodes.

Most frequently appearing facets on a surface of a facet-grown GaN crystal are {11–22} planes and {1–101} planes. The lengths of an a-axis and a c-axis are denoted by "a" and "c" respectively. A slanting angle $\Theta_a$ of a {11–22} plane to a C-plane is given by $\Theta_a = \tan^{-1}(3^{1/2}a/2c)$. Another slanting angle $\Theta_m$ of a {1–101} plane to a C-plane is given by $\Theta_m = \tan^{-1}(a/c)$.

A GaN crystal has an a axis of a=0.31892 nm and a c-axis of c=0.51850 nm. A slanting angle $\Theta_a$ of a {11–22} plane to a C-plane is $\Theta_a = \tan^{-1}(3^{1/2}a/2c) = 28.043$ degrees.

A slanting angle $\Theta_m$ of a {1-101} plane to a C-plane is $\Theta_m=\tan^{-1}(a/c)=31.594$ degrees.

When a <1-100> extending parallel stripe mask is formed upon an undersubstrate as shown in FIG. 9(a), the facet growth makes V-grooves composed of (11-22) facets and (-1-122) facets. A slanting angle of the facets to a C-axis is 28.043 degrees.

A depth of a v-groove is denoted by "V". A width of a voluminous defect accumulating region (H) is designated by "h". A width of a pair of (11-22) and (-1-122) facets is give by V cosec $\Theta_a$. A projection of the facets, which is equal to a width of a low dislocation single crystal region (Z), is given by z=V cot $\Theta_a$.

A pitch (spatial period) of periodically aligning voluminous defect accumulating regions (H) or C-plane growth regions (Y) is denoted by "p". The pitch (spatial period) is a sum of a voluminous defect accumulating region (H) width h, twice of a facet width z and a C-plane growth region (Y) width y.

$$p=h+y+2z=h+y+2V\cot\Theta_a$$

A width s of the stripe mask rules the width h of the voluminous defect accumulating regions (H). The pitch p of the stripe mask is predetermined. The width h and pitch p of the voluminous defect accumulating regions (H) are programmable on the design of the stripe mask. A range of the width h of the voluminous defect accumulating region (H) is 1 µm to 200 µm. The pitch p of the stripe mask is 20 µm to 2000 µm. A total width (y+2z) of the single crystal regions Z+Y is 10 µm to 2000 µm.

The stripe mask width s and the pitch p determines the width h of the voluminous defect accumulating region (H). The repetition period of a " . . . HZYZHZYZ . . . " structure is equal to the mask stripe pitch p.

A small depth of a V-groove gives a definite width y to the C-plane growth region (Y). The deeper the V-groove is, the narrower the C-plane growth region (Y) decreases. When the depth V of the V-groove exceeds a critical depth $V_c$, the C-plane growth region (Y) vanishes. For $V<V_c$, $y\neq 0$. For $V>V_c$, y=0. The critical depth $V_c$ is given by the following, (In the case of a <1-100> extending V-groove)

Critical depth $V_c=(p-h)\tan\Theta_a/2=0.307(p-h)$ (In the case of a <11-20> extending V-groove)

Critical depth $V_c=(p-h)\tan\Theta_m/2=0.266(p-h)$

Since the pitch p and the stripe width s are predetermined by the mask pattern, the depth V of the V-grooves determines the width y of the C-plane growth region (Y).

If the facet growth maintained $V>V_c$, the facet growth would make a rack-shaped surface without a flat top (y=0). All the embodiments described hereafter have flat tops and C-plane growth regions (Y) with a definite width y.

In Sample A of Embodiment 1, s=50 µm, h=40 µm, p=400 µm, y=30 µm, and thickness T=1250 µm. For the values, the depth V of the V-groove is V=100 µm and the critical V-groove depth $V_c$ is $V_c$=110 µm. The width z of the accompanying low dislocation single crystal region (Z) is z=165 µm.

Even if a grown GaN crystal has a depth T which is larger than the critical thickness $V_c$, the depth V does not exceed the critical depth $V_c$.

Another purpose of the present invention is to propose a low cost method of producing GaN single crystal substrates. A low cost method reduces the cost by making a thick (tall) GaN single crystal ingot, slicing the thick ingot into a plurality of as-cut GaN wafers, and mechanically processing the as-cut wafers into a plurality of GaN mirror wafers. A single epitaxial growth for a plurality of GaN wafers reduces the cost for one wafer. A low cost method obtains a plurality of GaN mirror wafers by forming a striped mask on a foreign material undersubstrate, growing a GaN crystal upon the masked foreign material undersubstrate, forming linearly extending ribbon-shaped slanting facets, making facet hills and facet valleys which coincide with the stripes, producing voluminous defect accumulating regions (H) under the valleys of facets above the stripes, yielding low dislocation single crystal regions (Z) under the facets, making C-plane growth regions (Y) at flat tops between neighboring reciprocal facets, maintaining the facets, the voluminous defect accumulating regions (H), the low dislocation single crystal regions (Z) and the C-plane growth regions (Y), attracting dislocations from the low dislocation single crystal regions (Z) and the C-plane growth regions (Y) into the voluminous defect accumulating regions (H), reducing dislocations in the low dislocation single crystal regions (Z) and the C-plane growth regions (Y), making a thick tall GaN single crystal ingot, slicing the tall GaN single crystal into a plurality of as-cut wafers, and polishing the as-cut wafers into GaN mirror wafers.

A GaN single crystal substrate, which was made by the present invention, can be a promising candidate of a seed undersubstrate without stripe mask for growing a GaN single crystal. Namely, the present invention is utilized twice. The GaN substrate made by the present invention has an inherent structure . . . HZHZHZ . . . or . . . HZYZHZYZHZYZ . . . . It was discovered that the repetitions of the fundamental components play the same role as striped masks. The GaN substrate dispenses with a stripe mask. When a GaN film crystal is grown upon a seed GaN substrate made by the present invention on a facet growth condition, the GaN film transcribes the voluminous defect accumulating regions (H) exactly. Voluminous defect accumulating regions (H) grow just upon the inherent voluminous defect accumulating regions (H) of the substrate GaN. Either low dislocation single crystal regions (Z) or C-plane growth regions (Y) grow on either the inherent low dislocation single crystal regions (Z) or the inherent C-plane growth regions (Y) of the substrate GaN. A child linear voluminous defect accumulating region (H) precisely succeeds a parent linear voluminous defect accumulating region (H) with the same width and the same direction as the parent (H). A film H transcribes a substrate H. H is s heritable feature. The property of a growing voluminous defect accumulating region (H) succeeding a substrate voluminous defect accumulating region (H) is called "H-H succession." The H-H succession is perfect. Positions and sizes of the C-plane growth regions (Y) do not always coincide with parent inherent C-plane growth regions (Y) of the substrate GaN. A sum of growing Z and Y, however, coincides with a sum of substrate Z and Y. Z-Z succession is not perfect. Y-Y succession is not perfect. But, (Y+Z)-(Y+Z) succession is perfect. The voluminous defect accumulating region (H) has a different orientation (in the case of single crystal) or a different property (in the case of polycrystal) from surrounding single crystal parts. And the voluminous defect accumulating region (H) is encapsulated by an interface (K). Clear distinctions enable a film voluminous defect accumulating region (H) to succeed a substrate voluminous defect accumulating region (H). But, there is a poor distinction between a low dislocation single crystal region (Z) and a C-plane growth region (Y). Both Z and Y are single crystals having the same orientation. Crystallographically speaking, Z and Y are identical. Only dopant concentrations are different. The low dislocation single crystal regions (Z) are rich in an n-type dopant, which gives higher electric conductivity to Z. The C-plane growth regions (Y) are poor in the n-type dopant, which gives lower electric conductivity to Y. A GaN substrate made by the present invention has inherently two roles as an undersubstrate and as a stripe mask. The GaN substrate can be an undersubstrate for growing a child GaN crystal in accordance with the teaching of the present invention.

Another low cost method obtains a plurality of GaN mirror wafers by preparing a maskless GaN mirror polished wafer made by the present invention as an undersubstrate, growing a GaN crystal upon the maskless GaN undersubstrate, forming linearly extending ribbon-shaped slanting facets, making facet hills and facet valleys which coincide with the inherent voluminous defect accumulating regions (H) of the parent GaN undersubstrate, producing voluminous defect accumulating regions (H) under the valleys of facets above the parent voluminous defect accumulating regions (H), yielding low dislocation single crystal regions (Z) under the facets, making C-plane growth regions (Y) at flat tops between neighboring reciprocal facets, maintaining the facets, the voluminous defect accumulating regions (H), the low dislocation single crystal regions (Z) and the C-plane growth regions (Y), attracting dislocations from the low dislocation single crystal regions (Z) and the C-plane growth regions (Y) into the voluminous defect accumulating regions (H), reducing dislocations in the low dislocation single crystal regions (Z) and the C-plane growth regions (Y), making a thick tall GaN single crystal ingot, slicing the tall GaN single crystal into a plurality of as-cut wafers, and polishing the as-cut wafers into GaN mirror wafers.

Another low cost method obtains a plurality of GaN mirror wafers by preparing a maskless GaN mirror polished wafer made by the present invention, growing a GaN crystal upon the maskless GaN undersubstrate, forming linearly extending ribbon-shaped slanting facets, making facet hills and facet valleys which coincide with the inherent voluminous defect accumulating regions (H) of the parent GaN undersubstrate, forming less inclining shallow facets just on the valleys, producing voluminous defect accumulating regions (H) under the valley shallow facets above the parent voluminous defect accumulating regions (H), yielding low dislocation single crystal regions (Z) and C-plane growth regions (Y) upon the parent inherent low dislocation single crystal regions (Z) and the C-plane growth regions (Y), maintaining the facets, the voluminous defect accumulating regions (H), the low dislocation single crystal regions (Z) and the C-plane growth regions (Y), attracting dislocations from the low dislocation single crystal regions (Z) and the C-plane growth regions (Y) into the voluminous defect accumulating regions (H), reducing dislocations in the low dislocation single crystal regions (Z) and the C-plane growth regions (Y), making a thick tall GaN single crystal ingot, slicing the tall GaN single crystal into a plurality of as-cut wafers, and polishing the as-cut wafers into GaN mirror wafers. Further, it is possible to grow a GaN ingot by using one of the GaN substrates as a seed crystal which have been sliced from the GaN ingot made by the method described above. It enable makers to produce low cost GaN substrates.

EMBODIMENT 1

Sapphire Undersubstrate; FIG. 10

FIG. 10 shows the steps of Embodiment 1 for making a GaN single crystal substrate of the present invention. A sapphire single crystal is employed as an undersubstrate of a C-plane top surface. FIG. 10(1) denotes a C-plane surface sapphire undersubstrate 41. Sapphire belongs to trigonal symmetry without three-fold rotation symmetry. InGaN-type LEDs on the market have been produced exclusively on C-plane (0001) sapphire undersubstrates.

A 2 μm thick GaN epi-layer 42 is grown on the sapphire undersubstrate 41 heteroepitaxially by an MOCVD method. FIG. 10(2) shows the GaN epi-layer 42 covering the sapphire undersubstrate 41. The top of the GaN epi-layer 42 is a C-plane (0001).

A 100 nm $SiO_2$ film is deposited uniformly upon the GaN epi-layer 42. Parts of the $SiO_2$ film are etched away except parallel stripes 43 by photolithography. A set of the parallel $SiO_2$ stripes 43 is called a stripe mask. An individual masked part is called a "stripe" 43. FIG. 10(3) shows a section of a mask patterned GaN epi-layer upon sapphire. The $SiO_2$ stripe 43 has a width s. The stripes 43 align in parallel at a definite pitch p. Parts of the GaN epi-layers between the neighboring stripes 43 are exposed. An exposed part 48 has a width t. A sum of the exposed part width t and the stripe width s is the pitch p (period). Five different patterns A, B, C, D and E of masks with different widths and pitches are prepared for comparing functions of the masks. Stripe directions are parallel to a GaN <1–100> direction in Patterns A, B, C and D. Namely, the stripes are parallel to a {11–20} plane (A-plane) in Patterns A to D. Pattern E has a unique stripe direction parallel to a <11–20> direction which is parallel to a {1–100} plane (M-plane). As mentioned before, the stripe width s and the exposure width t satisfy an equation of p=s+t.

Pattern A; stripe width s=50 μm, pitch p=400 μm, exposure width t=350 μm

Pattern B; stripe width s=200 μm, pitch p=400 μm, exposure width t=200 μm

Pattern C; stripe width s=2 μm, pitch p=20 μm, exposure width t=18 μm

Pattern D; stripe width s=300 μm, pitch p=2000 μm, exposure width t=1700 μm

Pattern E; stripe width s=50 μm, pitch p=400 μm, exposure width t=350 μm

Samples having Patterns A, B, C, D and E are called Samples A, B, C, D and E.

(1) Growth of Sample A and Sample B

GaN crystals are grown on Sample A of Pattern A and on Sample B of Pattern B by an HVPE method. An HVPE apparatus has a vertically long hot wall furnace, a Ga boat containing Ga metal at a higher spot, a susceptor for supporting a substrate at a lower spot and a heater for heating the susceptor and the Ga boat. Sample A and Sample B of sapphire undersubstrates are laid upon the susceptor. GaN crystals are grown on Samples A and B on the same condition.

The Ga boat is supplied with hydrogen gas ($H_2$) and hydrochloric acid gas (HCl) from outer gas cylinders via gas inlet tubes on the top of the furnace. Hydrogen gas is a carrier gas. The susceptor is supplied with hydrogen gas ($H_2$) and ammonia gas ($NH_3$) via other gas inlet tubes on the top.

Maintaining the furnace at atmospheric pressure, Embodiment 1 (Samples A and B) heats the Ga boat at a temperature higher than 800° C. and heats Samples on the sapphire substrates at 1050° C. Reaction of Ga with HCl synthesizes gallium chloride GaCl once at an upper portion in the vicinity of the Ga boat in the furnace. GaCl vapor falling toward the susceptor reacts with ammonia gas. Gallium nitride (GaN) is piled upon the exposures 48 and mask stripes 43 of Samples A and B on the susceptor.

Conditions of epitaxial growth of GaN are;

| | |
|---|---|
| Growth temperature | 1050° C. |
| NH$_3$ partial pressure | 0.3 atm (30 kPa) |
| HCl partial pressure | 0.02 atm (2 kPa) |
| Growth time | 10 hours |
| Thickness | 1250 μm |

The above HVPE process produces 1250 μm thick GaN epi-layers on Samples A and B having Patterns A and B. FIG. 10(4) shows a sectional view of the GaN-grown samples.

[SEM, TEM and CL Observation of Sample A]

A surface of Sample A is observed by a microscope. Sample A has a rack-shaped surface composed of many parallel V-grooves 44 (hills/valleys) aligning with a definite pitch. Each V-groove 44 is built by a pair of inner slanting facets 46 and 46. Namely, the surface looks like an assembly of lying triangle prisms on an image in the microscope. Sometimes, there are flat tops 47 between neighboring V-grooves 44. The flat tops 47 are parallel to a C-plane. The flat tops and regions just under the flat tops are called now "C-plane growth regions". Valleys (bottom lines) 49 of the V-grooves 44 coincide in the vertical direction with the stripes 43 of the mask initially formed. The positions of the valleys (bottom lines) 49 are exactly predetermined by the positions of the stripes 43 of the initially made mask. Facets 46 and C-plane growth regions are made upon the exposure 48 on the GaN epi-layer. The mask rules the positions and sizes of the valleys 49 of the V-grooves 44.

The V-grooves 44 of Sample A align in parallel with each other with a definite pitch of 400 μm. The 400 μm groove pitch is equal to the stripe mask pitch p=400 μm. The rack-shaped surface is controlled by the initially prepared mask. A valley lies just above a stripe. Valleys and stripes have one-to-one correspondence. The surface is constructed by repetitions of 400 μm pitch wide hills and valleys. Many of the facets building the V-grooves 44 are {11–22} plane facets. Since the stripes have been prepared in parallel to a <1–100> direction which is parallel with a {11–20} plane, the facets are yielded in parallel to the extension of the stripes.

Sometimes the neighboring facets 46 and 46 have an intermediate flat top 47. The flat top is parallel to a C-plane (0001) and a mirror flat plane. The width of the C-plane growth region is about 30 μm. Shallower (less inclining) facets exist at valleys of the V-grooves, following lower ends of the facet 46. A V-groove has two step facets of a pair of steeper facets and a pair of milder facets. Sample A is cleaved in cleavage plane {1–100}. Cleaved sections are observed by a scanning electron microscope (SEM), cathode luminescence (CL) and fluorescence microscope.

The observation reveals special regions 45 which extend in a c-axis direction and have a definite thickness at valleys 49 of the V-grooves 44. The valley-dangling, c-extending regions 45 are discernible from other regions. The c-axis extending region 45 has a width of about 40 μm in Sample A. The CL image gives the valley-dangling regions darker contrast and other regions brighter contrast. The valley dangling regions 45 are clearly discernible in the CL picture. Cleaving Sample A at various spots reveals a fact that the c-axis extending, valley-dangling region 45 has a three-dimensional volume with a definite thickness. Thus, the region 45 is a planar region extending both in the thickness direction and in the mask stripe direction. The planar regions 45 align in parallel with a definite pitch.

Sample A is further examined by the CL and the TEM (transmission electron microscope) for clarifying the valley-hanging regions. Behavior of dislocations of the valley-hanging region turns out to be entirely different from other regions. Dark interfaces 50 intervene between the valley-hanging regions 45 and the other regions. The valley-dangling region 45 enclosed by the interface 50 contains high density of dislocations of $10^8$ cm$^{-2}$ to $10^9$ cm$^{-2}$. Thus, the valley-dangling region 45 is a concentrated assembly of dislocations. The CL observation teaches us that the interfaces 50 are also an assemblies of dislocations. The interfaces 50 are somewhere planar dislocation assemblies and elsewhere linear assemblies. No difference of crystal orientations is found between inner parts (valley-dangling region) of the interfaces and outer parts of the interfaces. Namely, the valley-dangling region is a single crystal having the same orientation as the surrounding single crystal regions in Sample A. The valley-dangling dislocation-rich region 45 is called a "voluminous defect accumulating region (H)."

Outer regions (Z and Y) outside of the interfaces 50 which appear as dark contrast in the CL picture have low dislocation density. The regions just below the facet are called "low dislocation single crystal regions (Z)". Dislocation density shows conspicuous contrast between the inner part and the outer part of the interface 50. In the close vicinity of the interfaces, there are transient regions having a medium dislocation density of $10^6$ cm$^{-2}$ to $10^7$ cm$^{-2}$. The dislocation density falls rapidly in proportion to a distance from the interface in the low dislocation single crystal regions (Z). At a point distanced from the interface by 100 μm, a dislocation density reduces to $10^4$ cm$^{-2}$~$10^5$ cm$^{-2}$. Some points close to the interface have a similar low dislocation density of $10^4$ cm$^{-2}$ to $10^5$ cm$^{-2}$. Dislocation density falls outside of the interfaces 50 as a function of the distance from the valleys of the V-grooves. Electric conductivity is high in the low dislocation single crystal regions (Z).

In Sample A, the tops 47 of facets are flat surfaces which are parallel to a C-plane. The regions (Y) just below the C-plane have low dislocation density. The region is called a "C-plane growth region (Y)". The C-plane growth region (Y) is a low dislocation density single crystal with high electric resistance. Three different regions are defined. A first is a voluminous defect accumulating region (H) hanging from a valley of a V-groove. A second one is a low dislocation single crystal region (Z) following a facet and sandwiching the voluminous defect accumulating region (H). A third one is C-plane growth region (Y) following a C-plane top. All the three regions are planar regions extending in parallel to the mask stripes. Thus, H, Y and Z are all parallel to the stripes. The structure is designated by a repetitions of

. . . YZHZYZHZYZHZYZHZYZH . . . .

It is briefly represented by -(HZYZ)$^m$-.

The low dislocation single crystal regions (Z) and C-plane growth regions (Y) contain a small number of dislocations. Almost all of the dislocations extend in parallel to a C-plane in the surrounding regions (Z) and (Y). The C-plane parallel extending dislocations run centripetally toward the voluminous defect accumulating regions (H). The dislocation density in the surrounding regions (Z) and (Y) is slightly high at an early stage of the growth. The dislocation density in (Z) and (Y) decreases with the progress of growth. It is confirmed that the surrounding regions (Z) and (Y) are single crystals.

These results of this examination signify a dislocation reduction function that the facet growth sweeps dislocations outside of the interfaces into the valleys of the V-grooves and the swept dislocations are accumulated within the interfaces 50 and the inner voluminous defect accumulating regions (H). Thus, the dislocation density is low in the low dislocation single crystal regions (Z) and the C-plane growth regions (Y) but the dislocation density is high in the voluminous defect accumulating regions (H).

An inner part of two parallel neighboring interfaces is the voluminous defect accumulating region (H) containing many dislocations. An outer part of two parallel neighboring interfaces is a single crystal with few dislocation. The outer part consists of two discernible portions. One is a part transfixed by progressing facets 46 and is defined as a locus of facets. The part is a low dislocation single crystal region (Z). The other is a part left untouched by the progressing facets 46 but is a locus of a rising flat C-plane. The other is a C-plane growth region (Y).

The C-plane growth regions (Y) just under the flat tops (parallel to C-plane) are also ordered single crystals with dislocation density lower than the low dislocation single crystal regions (Z). The C-plane growth region (Y) is not a part through which facets have passed. But, the C-plane growth regions (Y) are upgraded by the function of the voluminous defect accumulating regions (H). Though almost all the surface of a growing GaN crystal is covered with facets and V-grooves, some portions which are uncovered with the facets happen. The facet-uncovered regions are C-plane growth region (Y) following the flat tops of C-planes. It is confirmed that the C-plane growth regions (Y) are low dislocation density single crystals. But, electric resistivity is high in the C-plane growth regions (Y).

Three regions H, Z and Y should be discriminated from each other. The low dislocation single crystal regions (Z) and the voluminous defect accumulating regions (H) have final C-plane surfaces as a top, when GaN is mechanically processed. Growing surfaces of the voluminous defect accumulating regions (H) and the low dislocation single crystal regions (Z) are not a C-plane but a facet plane. The facets allow a dopant to invade into the growing GaN crystal. The C-plane forbids the dopant from infiltrating into the GaN crystal. The low dislocation single crystal regions (Z) and the voluminous defect accumulating regions (H) are endowed with high electric conductivity. The C-plane growth regions (Y) have poor electric conduction. The low dislocation single crystal regions (Z) and the C-plane growth region (Y) are favored with low dislocation density in common.

What is important is the relation between the voluminous defect accumulating regions (H) and the facets appearing in the V-groove. Prevalent (steeper) facets appearing in the prism-shaped V-groove are {11-22} planes. The bottoms (valleys) have milder slanting facets having a larger fourth index n. The milder facets lead and cover the voluminous defect accumulating regions (H).

Milder slanting (shallow) facets form the voluminous defect accumulating regions (H) in Samples A. The voluminous defect accumulating region (H) is formed by piling many milder facets. The voluminous defect accumulating regions (H) are enclosed by the milder slanting facets 49 and side vertical interfaces 50 and 50 and are led by the milder facets growing in the vertical direction.

The tops of the milder slanting facets join the bottoms 49 of the steeper facets. The joint line form a closed loop in the facets. The milder slanting facets meet at a definite obtuse angle at the lowest bottom 49, which has the maximum dislocation density in the voluminous defect accumulating regions (H).

The observation indicates that the steeper facets {11-22} gather dislocations into the valleys 44 and the voluminous defect accumulating regions (H) arrest the dislocations with high density therein.

The present invention reduces dislocations in the single crystal regions (Z) and (Y) surrounding the voluminous defect accumulating region (H) by maintaining facets 46 and facet valleys 44 on a growing surface, making voluminous defect accumulating regions (H) following bottoms of the valleys 44 formed by the facets 46, attracting dislocations of peripheral regions into the voluminous defect accumulating regions (H), annihilating and accumulating the attracted dislocations in the voluminous defect accumulating regions (H) and making the best use of the voluminous defect accumulating regions (H) as dislocation annihilating/accumulating regions.

[SEM, TEM, and CL Observation of Sample B]

Surfaces and cleavage planes of Sample B are observed by SEM (scanning electron microscope), TEM(transmission electron microscope) and CL(cathode luminescence). The result is similar to Sample A.

What is different from Sample A is the width h of the voluminous defect accumulating region (H) at a valley of a V-groove. In Sample A, the closed defect accumulating region (H) has a narrow width $h_A$=40 µm. In Sample B, the closed defect accumulating region (H) has a wide width $h_B$=190 µm. The widths of (H) correspond to the widths of the mask stripes ($s_A$=50 µm, $S_B$=200 µm). The fact implies that the stripe mask makes a striped voluminous defect accumulating region (H of a similar size. The positions and the sizes of voluminous defect accumulating region (H are predetermined by the striped mask. Thus the size and positions of the voluminous defect accumulating region (H) are programmable and controllable by the mask.

The voluminous defect accumulating region (H) of Sample A are homogeneous. The voluminous defect accumulating region (H) of Sample B is linear on the surface but inhomogeneous in inner parts. The surfaces of the voluminous defect accumulating regions (H) of Sample B have a plenty of shallow facets and polycrystalline hillocks beside the normal facets which form normal V-grooves.

The turbulent voluminous defect accumulating regions (H) of Sample A are scrutinized. It is found that there are single crystals in a closed defect accumulating region (H) whose orientations are slightly inclining to the orientation of the surrounding single crystal regions (Z) and (Y). The common orientation of the low dislocation single crystal regions (Z) and the C-plane growth regions (Y) is named a "basic" orientation. It is further found that there are several partial grains in the voluminous defect accumulating region (H) having orientations different from the basic orientation. A further discovery is that the voluminous defect accumulating regions (H) of Sample B include linear defects, planar defects and crystal grains slightly slanting to the basic orientation.

[Processing of Sample A and Sample B]

As-grown substrates have rugged top surfaces and bottom undersubstrates. Bottoms of Samples A and B are ground for eliminating the undersubstrates. Top surfaces are also ground for removing the facetted rugged surfaces. Both surfaces are polished into flat, smooth surfaces. About 1 inchφ GaN substrate wafers are obtained for Sample A and Sample B, as shown in FIG. 10(5).

The finished GaN substrates are (0001) surface (C-surface) wafers. The obtained GaN wafers are uniformly transparent for human eyesight. CL observation enables parts of the GaN wafers to clarify the differences of growth history as a difference of contrast.

CL examination by irradiating Samples A and B by a 360 nm wavelength light which is close to the bandgap of GaN shows a set of parallel linear voluminous defect accumulating regions (H) regularly aligning with a pitch of 400 μm. The 400 μm pitch of the voluminous defect accumulating region (H) is exactly equal to the pitch of the stripe mask 43.

Voluminous defect accumulating regions (H) give dark contrast on a CL image in many cases. Some voluminous defect accumulating regions (H) exhibit bright contrast on the same CL image. Contrast of voluminous defect accumulating regions (H) depends upon positions in a GaN crystal.

"Dark" or "bright" contrast appears only on a CL picture. GaN is entirely uniform and transparent for eye sight. Differences of Z, Y and H are not detected even with an optical microscope. The CL observation can discern Z, Y and H.

Low dislocation single crystal regions (Z) following the facets 44 appear as parallel bright contrast ribbons extending in a direction on the CL picture. Dark contrast strings are found just at middles of the bright ribbons of the low dislocation single crystal regions (Z). The dark contrast strings are C-plane growth regions (Y). Parallel bright-dark-bright ribbons turn out to be parallel "ZYZ" stripes.

In a CL picture, facet regions grown with {11–22} facets look bright. C-plane regions grown with (0001) planes (C-plane) look dark. For three CL-discernible regions, the CL gives different contrasts;

| voluminous defect accumulating regions (H) | bright (partly dark) |
|---|---|
| low dislocation single crystal regions (Z) | bright |
| C-plane growth regions (Y) | dark. |

The voluminous defect accumulating region (H) is a planar region having a definite thickness and extends in parallel with a c-axis direction and an LD stripe direction. The voluminous defect accumulating regions (H) are vertical to a surface of a substrate and penetrate the substrate from the top to the bottom.

The voluminous defect accumulating regions (H), low dislocation single crystal regions (Z) and C-plane growth regions (Y) are all invisible to eye-sight but are discernible by the CL.

A polished GaN crystal is a flat, smooth substrate without facets as shown in FIG. 10(5). Dislocation density is measured on the sample substrates. CL, etching and TEM can discern threading dislocations. The CL observation is most suitable for examining dislocations density.

A threading dislocation looks like a dark dot in the CL picture. Samples A and B reveal highly concentrated dislocations in the voluminous defect accumulating regions (H). Interfaces (K) enclosing the voluminous defect accumulating regions (H) appear as linear arrays of dislocations.

The interfaces (K) are three-dimensional planar defects. Dark contrast clearly discriminates the interface (K) 50 from bright Z and bright H. The interface (K) is composed of planar defects or dislocation bundles.

Sample A carrying a 50 μm width mask reveals occurrence of parallel striped voluminous defect accumulating regions (H) of a 40 μm width. Sample B with a 200 μm width mask reveals occurrence of parallel striped voluminous defect accumulating regions (H) of a 190 μm width. The initial mask stripe width rules the width of the voluminous defect accumulating regions (H). The width of H is equal to or slightly smaller than the width of stripes.

Sample A and Sample B reveal low dislocation density in the low dislocation single crystal regions (Z) and the C-plane growth regions (Y). Dislocations decreases in proportion to a distance from the voluminous defect accumulating region (H). Somewhere in the low dislocation single crystal regions (Z), dislocations decreases rapidly and discontinuously just outside of the interfaces. An average of dislocation density is less than $5 \times 10^6$ cm$^{-2}$ in the low dislocation single crystal regions (Z) and the C-plane growth regions (Y) of Samples A and B.

In the low dislocation single crystal regions (Z) and the C-plane growth regions (Y), dislocations run centripetally toward the central voluminous defect accumulating regions (H) in parallel to the C-plane in Samples A and B. Dislocations are gathered, annihilated and accumulated in the voluminous defect accumulating regions (H). The voluminous defect accumulating regions (H) lower dislocation density in the other regions (Z) and (Y) by annihilating/accumulating dislocations. The GaN substrates of Samples A and B are a single crystal with dislocations decreased by the action of the voluminous defect accumulating regions (H).

The GaN substrates of Samples A and B are etched in a heated KOH (potassium hydroxide) solution. The KOH etchant has anisotropic etching rates. A Ga-plane ((0001)Ga) is difficult to etch. But, an N-plane ((000–1)N) is easy to etch. Anisotropy shows whether individual parts are an N-plane or a Ga-plane on a GaN (0001) surface.

The low dislocation single crystal regions (Z) and the C-plane growth regions (Y) are unetched. The voluminous defect accumulating regions (H) are partly etched but partly unetched.

The etching test means that the voluminous defect accumulating regions (H) have (000–1)N planes as well as (0001) Ga plane. The low dislocation single crystal regions (Z) and the C-plane growth regions (Y) have all (0001) Ga planes. Namely, the surrounding portions (Z) and (Y) are (0001) single crystals.

Some parts of the voluminous defect accumulating regions (H) are single crystals having the same polarity as (Z) and (Y). But, other parts of the voluminous defect accumulating regions (H) are single crystals having a polarity reverse to the surrounding regions (Z) and (Y). The reversed portion having (000–1)N-planes is deeply etched by KOH.

Sample A of a 50 μm wide stripe mask and Sample B of a 200 μm wide stripe mask reveal similar properties. An exception is widths h of the voluminous defect accumulating regions (H). Sample A shows 40 μm wide voluminous defect accumulating regions (H) ($h_A$=40 μm). Sample B shows 190 μm wide voluminous defect accumulating regions (H) ($h_B$=190 μm). The result confirms that the width h of the voluminous defect accumulating regions (H) can be uniquely determined by the widths of mask stripes implanted on the undersubstrate.

Efficient exploitation of the substrate area requires narrower voluminous defect accumulating regions (H), wider low dislocation single crystal regions (Z) and wider C-plane growth regions (Y). Excess large voluminous defect accumulating regions (H) are undesirable, since they have a tendency of including abnormal intrinsic defects. The above two reasons favor narrower voluminous defect accumulating regions (H).

A reduction of voluminous defect accumulating regions (H) requires a decrement of a stripe width s. Yielding facets requires a definite width s for mask stripes. Too narrow stripes, however, can produce neither facets nor voluminous defect accumulating regions (H). Without facets, neither voluminous defect accumulating regions (H), low dislocation single crystal regions (Z) nor C-plane growth regions (Y) happen. A lower limit of a stripe width s is searched by following Sample C.

[Growth of Sample C (Stripe width s=2 μm, pitch p=20 μm)]

Sample C starts from an undersubstrate of Pattern C having a set of parallel 2 μm stripes 43 aligning with a 20 μm pitch (s=2 μm, p=20 μm). A GaN film is grown on the masked undersubstrate of Sample C by the same facet growth based on the HVPE method as Samples A and B.

The 2 μm stripes 43 of an SiO$_2$ mask are buried with GaN by the HVPE. Although facets occur on a growing surface, valleys of V-grooves happen accidentally and contingently here and there without definite relation with implanted mask stripes. The stripes cannot be seeds of valleys of V-grooves. Random distributing facets cover a surface of Sample C. The HVPE cannot control the positions of the valleys of V-grooves. The HVPE turns out to be inadequate for Pattern C which has a too narrow width s and a too narrow pitch p.

Then, instead of the HVPE, a GaN crystal is grown by an MOCVD method at a low speed. Reduction of the growing speed aims at making parallel V-grooves having valleys at the stripe masks (SiO$_2$) 43.

The MOCVD method employs metalorganic materials for a Ga source, for example, trimethylgallium or triethyl gallium (TMG, TEG) instead of metal gallium Ga. Here, trimethyl gallium (TMG) is supplied as a Ga source. Other gas source materials are ammonia gas (NH$_3$ gas: group 5 gas) and hydrogen gas (carrier gas).

A GaN crystal is grown in a furnace of an MOCVD apparatus by laying Sample C on a susceptor of the furnace, heating Sample C up to 1030° C., and supplying material gases in a volume ratio of group 3 gas (TMG): group 5(ammonia)=1:2000 to Sample C. The growing speed is 4 μm/h. The growth time is 30 hours. A 120 μm thick GaN crystal having V-grooved facets is obtained.

In the growth, a GaN crystal having parallel valleys 49 of V-grooves 44 just above the stripe masks 43 is made. Positions of the facet valleys coincide with the positions of the striped masks 43. This means that positions of the masks 43 enable positions of the V-grooves to be controllable. Further, voluminous defect accumulating regions (H) are found to grow under bottoms 49 of V-grooves.

Sample C has a very small mask width of s=2 μm. In accordance with the tiny mask width, parallel V-grooves produce thin voluminous defect accumulating regions (H) of a 1 μm width at bottoms. This fact means that the width of mask rules the width of voluminous defect accumulating region (H). 2 μm is the lowest limit of mask width and 1 μm is the least width of the voluminous defect accumulating region (H). Low dislocation density realized in the surrounding single crystal regions (Z) and (Y) is confirmed by the TEM observation. Sample C features smallness of the voluminous defect accumulating regions (H). It is confirmed that the MOCVD enables a narrow width stripe mask to make narrow parallel voluminous defect accumulating regions (H). The MOCVD of a small growing speed is suitable for making the narrow width voluminous defect accumulating regions (H) instead of the HVPE of a high growing speed.

[Growth of Sample D (Stripe Width s=300 μm, Pitch p=2000 μm)]

Sample D grows a GaN crystal on an undersubstrate with a stripe mask having many parallel 300 μm wide stripes aligning in a vertical direction with a 2000 μm pitch (Pattern D). Pattern D is an example of a large width s and a large pitch p (spatial period) for examining the upper limit of s and p. Sample D grows GaN by the HVPE method like Sample A and Sample B on the following condition.

| | |
|---|---|
| Growth temperature | 1030° C. |
| NH$_3$ partial pressure | 2.5 × 10$^{-2}$ atm (2.5 kPa) |
| Growth time | 30 hours |
| Thickness | 4400 μm |

The HVPE method produces a 4.4 mm thick GaN crystal. Sample D shows a rack-shaped (V-grooved) surface having parallel valleys and hills made by facets extending in parallel to mask stripes. Plenty of parallel voluminous defect accumulating regions (H) accompany parallel valleys 49 of V-grooves 44 with the same pitch p=2000 μm. Positions of the voluminous defect accumulating region (H) exactly coincide with the positions of initially-prepared stripes 43. This fact means that the stripes induce the voluminous defect accumulating regions (H) above them.

Some of the facets 46 building the V-grooves 44 deform. Tiny pits and small hillocks appear on some of hills composed of facets aligning parallelly and regularly in accordance with the mask stripes.

Parallel voluminous defect accumulating regions (H) occur with a period of 2000 μm which is equal to the pitch p=2000 μm of the mask stripes. Hills and valleys maintain a regular rack-shape constructed by parallel lying prism-like columns. But, some parts are distorted. Some ends of V-grooves are defaced. Some facets have different index facets partially. The area of C-plane growth parts on the tops between neighboring V-grooves has fluctuation.

In spite of the irregularity of facets and V-grooves, voluminous defect accumulating regions (H) lie at the predetermined lines just above the mask stripes. The width of the voluminous defect accumulating region (H) is about 250 μm. Sample D shows a tendency of the width of the voluminous defect accumulating region (H) decreasing in the proceeding of growth.

An excess large width h has a tendency of incurring abnormal-shaped polycrystalline regions in the large voluminous defect accumulating regions (H) in Sample D. The abnormal-shaped polycrystalline regions induce disorder of dislocations which overrun the voluminous defect accumulating regions (H) into the surrounding low dislocation single crystal regions (Z) and C-plane growth regions (Y).

The voluminous defect accumulating region (H), even distorted, produces the low dislocation single crystal regions and C-plane growth regions on both sides. An average of dislocation density in the surrounding low dislocation single crystal regions (Z) and C-plane growth regions (Y) is less than 5×10 cm$^-$. The fact signifies that even deforming voluminous defect accumulating region (H) has the function of dislocation reduction.

There are regions having bundles of dislocations outside of the voluminous defect accumulating regions (H), where shapes of facets are seriously distorted.

Examinations of Samples A, B, C and D clarify the facts that the width h of the voluminous defect accumulating region (H) is 2 m to 200 m, the width s of the stripes of a mask is 2 m to 300 m, and the pitch p of the voluminous defect accumulating region (H) is 20 m to 2000 m, for accomplishing the purposes of the present invention.

[Growth of Sample E(Stripe Direction<11–20>; Stripe Width s=50 m, Pitch p=400 m)]

Sample E grows a GaN crystal on an undersubstrate covered with a mask of Pattern E having parallel <11–20> extending 50 m wide stripes aligning with a 400 m pitch. Mask pattern E is similar to Mask pattern A in a 50 m width and a 400 m pitch. But, Pattern E is different from Pattern A in extending directions. Pattern E has stripes extending in <11–20>. Stripes of Pattern A extend in <1–100>. Extension of the stripes of Sample E is parallel to cleavage planes {1–100}.

Other conditions of Sample E except the stripe direction are similar to Sample A. A GaN crystal is grown on Sample E by the HVPE method on the following conditions.

| | |
|---|---|
| Growth temperature | 1050 |
| NH₃ partial pressure | 0.3 atm (30 kPa) |
| HCl partial pressure | 2.0 × 10⁻ atm (2.0 kPa) |
| Growth time | 10 hours |
| Thickness | 800 m |

Growth on Pattern E is slow. Ten hours of growth brings about 800 m thick GaN film. Unification of stripe-shaped crystals is difficult on Pattern E. Thus, the growing speed is low. A 800 m GaN crystal is obtained for Sample E of Pattern E by the ten hour growth.

Somewhere no unification of crystals occurs in Sample E and deep gaps separate neighboring grains. Thicknesses of Sample E are not uniform but have large fluctuation. Random facets appear in Sample E without dominant facets.

Somewhere crystals are unified and have uniform surfaces. Slightly deformed voluminous defect accumulating regions (H) are formed at valleys of facets. At the regions where linear voluminous defect accumulating regions (H) align, the positions of the voluminous defect accumulating regions (H) coincide with the predetermined positions of the mask stripes.

Crystallographical property is analysed. In Sample E, the voluminous defect accumulating regions (H) turn out to be polycrystalline. Sample E is different from the former Samples A, B, C and D at the polycrystalline voluminous defect accumulating regions (H).

Dislocation distribution in Sample E is examined by a TEM. The TEM confirms that dislocation density is very low in the low dislocation single crystal regions (Z) and the C-plane growth regions (Y) outside of the polycrystalline voluminous defect accumulating regions (H). A spot quite close to the voluminous defect accumulating regions (H) shows 7×10 cm⁻. Dislocation density decreases in proportion to a distance from (H). An average of the dislocation density is less than 5×10 cm⁻ in the low dislocation single crystal regions (Z) and the C-plane growth regions (Y). The least dislocation density is 5×10 cm⁻.

Sample E ensures that even a <11–20> direction of stripes takes effect of the present invention. The <11–20> stripe direction of Sample E has still drawbacks in comparison with the <1–100> stripe direction employed in Samples A, B, C and D. The drawbacks, however, will be overcome in near future.

EMBODIMENT 2

GaAs, Si, Sapphire Undersubstrate; Pattern A, H(A+ELO); FIG. 11

Embodiment 2 prepares three different undersubstrates;
α. GaAs (111)A-surface undersubstrate,
β. sapphire C-plane (0001) undersubstrate,
γ. Si(111) undersubstrate Silicon (Si) is a diamond (C) type cubic symmetry crystal. Gallium arsenide (GaAs) is a zinc blende type (ZnS) cubic symmetry crystal. Gallium nitride (GaN) is a wurtzite type (ZnS) hexagonal symmetry crystal. A C-plane of the wurtzite type has three-fold rotation symmetry. In cubic symmetry, only a (111) plane has three-fold rotation symmetry. In the case of Si, a (111) surface crystal is available for an undersubstrate. In the case of GaAs, a (111) plane has two discernible types due to lack of inversion symmetry. One (111) is a surface covered with dangling Ga atoms, which is denoted by (111)A plane. The other (111) is a surface covered with dangling As atoms, which is designated by (111)B plane. "A" means group 3 element. "B" means group 5 element. A GaAs (111)A surface crystal can be a candidate for an undersubstrate. Sapphire belongs to a trigonal symmetry group. Sapphire lacks three-fold rotation symmetry. In the case of sapphire, a (0001) C-plane wafer is a candidate for an undersubstrate for growing a GaN crystal.

FIGS. 11(1) to (3) show steps of making a GaN crystal upon foreign material undersubstrates of Embodiment 2. Embodiment 1 piles a thin GaN film on an undersubstrate and makes a SiO₂ mask on the thin GaN film. Sparing the GaN film, Embodiment 2 directly makes a stripe mask 53 on an undersubstrate 51. A mask of Pattern A is prepared by covering the undersubstrate with a 0.1 μm mask material of SiO₂ and making parallel seed stripes by photolithography.

Embodiment 2 employs a new Pattern I besides Pattern A. Pattern I has an ELO (epitaxial lateral overgrowth) mask in addition to Pattern A. The ELO mask is complementarily formed on parts uncovered with the stripes of Pattern A. The ELO mask is a hexagonal symmetric pattern arranging 2 μmφ round windows at corner points of plenty of equilateral triangles of a 4 μm side aligning indefinitely in hexagonal symmetry. The direction of the ELO mask is determined by adjusting a side of the unit triangle in parallel to the stripe extension of the stripe mask. The ELO pattern, in general, has a smaller pitch than the stripe mask. Pattern I is a hybrid pattern containing the stripe mask and the ELO mask.

Pattern A stripe width s=50 μm, pitch p=400 μm

Pattern I Pattern A (s=50 μm, p=400 μm)+ELO mask (2 μm×4 μm; 6-fold symmetry)

Since the mask is formed upon an undersubstrate without GaN, the direction of the mask cannot be defined in reference to a GaN crystal. The direction must be defined by the orientation of the undersubstrate crystal. In the case of a GaAs undersubstrate, the stripe direction is adjusted to be parallel to a <11–2> direction of the GaAs undersubstrate. In the case of a sapphire undersubstrate, the stripe direction is determined to be parallel to a <11–20> direction of the sapphire undersubstrate. In the case of a silicon undersubstrate, a <11–2> direction of silicon is the stripe direction. Four samples of masked undersubstrates are prepared with different patterns and different materials.

Sample F: a (111) GaAs undersubstrate having a Pattern A mask
Sample G: a (0001) sapphire undersubstrate having a Pattern A mask
Sample H: a (111) Si undersubstrate having a Pattern A mask
Sample I: a (111) GaAs undersubstrate having a Pattern I (A+ELO) mask FIG. 11(1) demonstrates an undersubstrate 51 with mask stripes 53. Similarly to Embodiment 1, an HVPE apparatus grows GaN layers on the masked undersubstrate 51 of Samples F to I. The HVPE apparatus has a hot wall tall furnace, a Ga-boat sustained at an upper spot in the furnace, a susceptor positioned at a lower spot in the furnace, gas inlets for supplying $H_2$, HCl and $NH_3$ gases, a gas exhausting outlet, a heater and a vacuum pump. Supplying $H_2$ and HCl gases via the gas inlet to the Ga-boat produces gallium chloride (GaCl) by a reaction of $2HCl+2Ga \rightarrow GaCl+H_2$. Falling down toward the heated susceptor, GaCl reacts with ammonia ($NH_3$). Synthesized GaN piles upon the masked undersubstrates. Two step growth produces a thin GaN buffer layer at a lower temperature and a thick GaN epi-layer at a higher temperature upon the undersubstrates.

(1. Growth of a GaN Buffer Layer)

A thin GaN buffer layer is grown on an undersubstrate of GaAs, sapphire or Si by an HVPE method under the following condition.

| | |
|---|---|
| Ammonia partial pressure | 0.2 atm (20 kPa) |
| HCl partial pressure | $2 \times 10^{-3}$ atm (200 Pa) |
| Growth temperature | 490° C. |
| Growth time | 15 minutes |
| Thickness | 50 nm |

(2. Growth of a GaN Epi-Layer)

The HVPE method produces a GaN epitaxial layer on the low-temperature grown GaN buffer layer at a high temperature under the following condition.

| | |
|---|---|
| Ammonia partial pressure | 0.2 atm (20 kPa) |
| HCl partial pressure | $2.5 \times 10^{-2}$ atm (2500 Pa) |
| Growth temperature | 1010° C. |
| Growth time | 11 hours |
| Thickness | about 1400 μm (1.4 mm) |

Samples F to I all yield transparent 1.4 mm thick GaN single crystals. Appearances are similar to the samples of Embodiment 1. The transparent GaN crystals look like a glass plate. The surfaces are occupied by assemblies of facets.

Samples F to I have {11–22} planes as the most prevailing facets 56. Mirror flat tops 57 appear on hills between the neighboring {11–22} facets 56. The mirror flat tops 57 have a 20 to 40 μm width. Shallower facets appear at bottoms between the neighboring {11–22} facets. A double facet structure occurs also in Samples F to I. Embodiment 2 is similar to Embodiment 1 in appearance.

Four samples F to I are mechanically processed. Gringing eliminates the undersubstrates of GaAs, Si or sapphire from the bottoms of the grown-substrates. Lapping removes the rugged morphology on the top surfaces. Mechanical processing of the GaAs undersubstrates(Samples F and I) and the Si undersubstrate (Sample H) is facier than the sapphire undersubstrate (Sample G). Following polishing makes flat mirror GaN substrates of a 2 inch diameter. FIG. 11(3) demonstrates the section of the mirror polished wafer.

The grown GaN crystals of Samples F to I are (0001) C-plane substrates. The substrate crystals are transparent, flat and smooth. Top surfaces are covered with linear voluminous defect accumulating regions (H) regularly and periodically aligning in parallel. The width of the voluminous defect accumulating regions (H) is 40 μm. Low dislocation single crystal regions (Z) and C-plane growth regions (Y) align in parallel between the neighboring voluminous defect accumulating regions (H). Samples F to I carry a cyclic structure of "ZHZYZHZYZH . . ." repeating in a direction perpendicular to the extending direction of the voluminous defect accumulating regions (H).

Dislocation density is small in the low dislocation single crystal regions (Z) and the C-plane growth regions (Y). Dislocations decrease in proportion to the distance from the interface (K) in the low dislocation single crystal regions (Z). Somewhere dislocations rapidly decrease by a quite short distance from the interface in the low dislocation single crystal regions (Z). Averages of the dislocation density in the low dislocation single crystal regions (Z) and the C-plane growth regions (Y) are less than $5 \times 10^6$ cm$^{-2}$ for all the samples F, C, H and I. The averages of the samples are;

| | |
|---|---|
| Sample F: | $3 \times 10^6$ cm$^{-2}$ |
| Sample G: | $2 \times 10^6$ cm$^{-2}$ |
| Sample H: | $3 \times 10^6$ cm$^{-2}$ |
| Sample I: | $9 \times 10^5$ cm$^{-2}$. |

Sample I, which is based upon the ELO-including hybrid mask, is endowed with the least dislocation density ($0.9 \times 10^6$ cm$^{-2}$). The state of the voluminous defect accumulating regions (H) of Samples F to I is similar to Sample A of Embodiment 1. The voluminous defect accumulating regions (H) stand just upon the mask stripes 53 in Samples F, G, H, and I. Linear facets 56 with a definite width grow into grooves on both sides of the valleys 59 lying upon the voluminous defect accumulating regions (H). Growth of the facets gathers dislocations on the facets into the valley-hanging voluminous defect accumulating regions (H) in all the samples F to I.

Fluorescence microscope observes the voluminous defect accumulating regions (H) appearing on the surface of Samples F to I. It is confirmed that the voluminous defect accumulating regions (H) penetrate the substrate from the top to the bottom in all the samples F to I.

The ELO-carrying Sample I is further examined. Etching Sample I at 200° C. with a mixture of sulfuric acid ($H_2SO_4$) and nitric acid ($HNO_3$) produces parallel striped cavities just upon the voluminous defect accumulating regions (H) on the top surface. Other portions (Z and Y) are unetched on the top surface.

On the bottom surface, the voluminous defect accumulating regions (H) are left unetched but the other portions (Z and Y) are etched into cavities. The etchant ($H_2SO_4+HNO_3$) has selectivity of etching. A (0001)Ga plane has strong resistance but a (000–1)N plane has weak resistance against the etchant. Selective etching examination signifies that the voluminous defect accumulating regions (H) are single crystals having a c-axis antiparallel (inverse) to the c-axis of the other (Z and Y) portions.

In Sample I, the shallower facets leading the voluminous defect accumulating regions (H) should have inverse facet planes (11–2–5) or (11–2–6) and should have grown in a –c-axis direction <000–1>.

Two specimens F1 and F2 are made for Sample F having a (111) GaAs undersubstrate. Specimen F1 is a good GaN crystal. Specimen F2 shows some defaults.

Specimen F2 contains parts having neither V-grooves nor linear facets upon the stripes. Instead of V-grooves, an array of inverse dodecagonal pits aligns on the stripes in F2.

F2 contains prism-shaped facets 56 having V-grooves on other parts. But, the CL observation reveals that no voluminous defect accumulating region (H) exists under valleys of the facet grooves. The facet grooves are vacant. The voluminous defect accumulating regions (H) should be produced under the valleys of facets in the teaching of the present invention. F2 deviates from the scope of the present invention. The reason why such vacant V-grooves are formed in F2 is not clarified yet.

Some reason prevents voluminous defect accumulating regions (H) from occurring on the stripes. Lack of the linear voluminous defect accumulating region (H) prohibits linear facets from happening. Extinction of the linear voluminous defect accumulating regions (H) induces conical round pits of facets instead of V-grooves. Appearance of unexpected discrete facet pits contradicts the purpose of the present invention. What is the reason of producing undesired discrete conical facet pits instead of liner parallel V-grooves?

Specimen F2 of Sample F requires a detailed examination. The areas bearing many discrete facet pits are plagued with dispersion of once-converged dislocations in a wide range. Dislocation density of F2 (Sample F) is $7 \times 10^6$ cm$^{-2}$ which is higher than other samples having voluminous defect accumulating regions (H) following the valleys of facet V-grooves.

In F2, the CL observation confirms the existence of planar defects, which root in facet pit centers and extend radially in six directions spaced by 60 degrees of rotation. The radial planar defects extend farther by a distance longer than 100 μm somewhere. The planar defects are similar to the planar defects 10 shown in FIG. 1(b). Vacant V-grooves carry dislocation arrays without voluminous defect accumulating region (H) under the valleys (bottoms), which are planar defects in a three-dimensional view.

It is confirmed that the facets lose the clear prism shape and degrade to an amorphous shape, when the closed defect accumulating region (H) is vanished like Sample F2. The closed defect accumulating region (H) is indispensable for maintaining the prism regular shape of the facets (repetition of valleys and hills).

The closed defect accumulating region (H) acts as a dislocation annihilation/accumulation region. When the closed defect accumulating region (H) is not formed (vacant bottom), assembling of dislocations is disturbed, once gathered dislocations diffuse again and sometimes planar dislocation assemblies happen. Sample F clarifies the significance of the voluminous defect accumulating region (H).

Lack of the voluminous defect accumulating region (H) disturbs assembling of dislocations and prevents the growing GaN crystal from forming low dislocation regions, even if the facets form a set of the rack-shaped parallel hills and valleys. The voluminous defect accumulating region (H) is important. The voluminous defect accumulating region (H) under the bottoms of prism shaped facets is an essential requirement of the present invention.

EMBODIMENT 3

Differences of Mask Materials (Mask Types; SiN, Pt, W, SiO$_2$)

A plurality of GaAs (111)A-plane substrates are prepared for examining the differences induced by various mask materials. GaAs (111)A means a (111) wafer in which Ga atoms appear on the surface (GaAs (111)B means a (111) wafer in which As atoms appear on the surface). Masks of Samples J to N are formed upon the GaAs(111)A substrates.

J: covered with a 0.15 μm thick Si$_3$N$_4$ film
K: covered with a 0.2 μm thick Pt film
L: covered with a 0.2 μm thick W film
M: covered with a 0.1 μm thick SiO$_2$ film and with a 0.2 μm thick GaN film
N: covered with a 0.1 μm thick SiO$_2$ film and with a 0.2 μm thick AlN film Samples M and N have complex masks. Sample M is prepared by growing a 0.2 μm GaN layer on the SiO$_2$/GaAs substrate at a low temperature (600° C.) by the MOCVD method. Sample N is prepared by growing a 0.2 μm AlN layer on the SiO$_2$/GaAs substrate at a low temperature (700° C.) by the MOCVD method. The GaN and AlN films are fine polycrystalline. Samples M and N have a 0.3 μm mask thickness.

The Si$_3$N$_4$ film (J), Pt film (K), W film(L), GaN/SiO$_2$ films (M), and AlN/SiO$_2$ films (N) are patterned into parallel stripe masks by photolithography. Pattern A (s=50 μm, p=400 μm) of Embodiment 1 is employed also for the striped masks of Samples J to N. The orientations of the mask patterns are determined by equalizing the stripe direction to a GaAs <11-2> direction.

The mask films made of four different materials are examined by an X-ray diffraction method. The Si$_3$N$_4$ film (J) is amorphous, the Pt film (K) is polycrystalline, and the W film (L) is polycrystalline. Sole SiO$_2$ films are amorphous. But, the SiO$_2$ films on GaN or AlN are fine polycrystalline (M and N).

Five samples of the masked substrates are utilized for making a GaN substrate by the steps shown in FIG. 11. The followings are a list of (film)/(substrate) of Embodiment 3.

| | |
|---|---|
| Sample J: | Si$_3$N$_4$/GaAs of Pattern A |
| Sample K: | Pt/GaAs of Pattern A |
| Sample L: | W/GaAs of Pattern A |
| Sample M: | GaN/SiO$_2$/GaAs of Pattern A |
| Sample N: | AlN/SiO$_2$/GaAs of Pattern A |

GaN crystals are grown on the masked samples by the HVPE method which is the same HVPE method as Embodiments 1 and 2. Embodiment 3 preliminarily grows a thin GaN buffer layer at a low temperature on a condition similar to Embodiment 2.

(Growing Condition of a GaN Buffer Layer of Embodiment 3)

| | |
|---|---|
| Growth temperature | about 490° C. |
| NH$_3$ partial pressure | 0.2 atm (20 kPa) |
| HCl partial pressure | $2 \times 10^{-3}$ atm (0.2 kPa) |
| Growth time | 20 minutes |
| Layer thickness | 60 nm |

The 60 nm buffer layer is thinner than the mask thickness (150 nm to 300 nm). The GaN buffer layers grow only upon the exposed GaAs substrate. The masks are not covered with GaN at the step.

The samples are heated. Thick GaN epi-layers are further grown on the buffer layer and the masks at 1030° C. for a long time. The condition of growing the epi-layer is as follows, (Growing Condition of a Thick GaN Epi-Layer of Embodiment 3; Facet Growth)

| | |
|---|---|
| Growth temperature | 1030° C. |
| NH$_3$ partial pressure | 0.25 atm (25 kPa) |
| HCl partial pressure | $2.5 \times 10^{-2}$ atm (2.5 kPa) |
| Growth time | 13 hours |
| Layer thickness | about 1900 μm (1.9 mm). |

The latter growth makes about 1.9 mm thick GaN single crystals. Samples J, K, L, M and N have similar surface morphology.

Microscope observation clarifies that Samples J to N have a rack-shaped surface built by parallel V-grooves (hills and valleys) or prisms aligning regularly and periodically with a common pitch (spatial period) composed of facets. The disposition of the parallel (hill/valley) grooves exactly coincides with the initially disposed mask stripes 53. The bottoms 59 of the valleys coincides with the mask stripes 53 (FIG. 11(2)). The valley-to-valley pitch of the rack-shaped surface is 400 μm which is equal to the mask pitch (p=400 μm).

The facets 56 composing the parallel prisms on the rack-shaped surface are mainly {11–22} and {11-2-2} planes. Flat tops 57 of a width of 30 μm to 50 μm remain between neighboring facets {11–22} and {11-2-2}. The flat tops are (0001) planes which are made by C-plane growth. The regions just under the C-plane growth flat tops are C-plane growth regions (Y).

In Samples J, L, M and N, shallower facets appear at bottoms 59 between the neighboring {11–22} facets. A double facet structure occurs in Samples. Appearance of the Samples is the same one as Sample A of Embodiment 1.

In the case of Sample K, however, a rugged shape is found at bottoms 59 of V-grooves 54. Sample K has few neat facets.

Five kinds of grown crystal wafers are ground. GaAs undersubstrates are eliminated by grinding. Tops surfaces are ground for eliminating facets and pits and making a flat smooth surface. Flat GaN wafers of a 2 inch diameter are obtained.

These gallium nitride (GaN) wafers are transparent, flat substrates having a (0001) top (C-plane).

Voluminous defect accumulating regions (H) align regularly, in a striped pattern with a definite width, linearly and toward a <1–100> direction on a surface of the substrates. Pitches of the regions (H) are 400 μm. Widths h of the regions (H) are almost about 40 μm, which corresponds with the width of the initially mask stripes.

In Sample K, widths of voluminous defect accumulating regions (H) sometimes deviate from 40 μm. The widths dilate at some spots or shrink at other spots. The widths are unstable in Sample K.

Dislocation density is counted by the cathode luminescence (CL) method. Dislocation density is small in the regions (Z) and (Y) outside of the voluminous defect accumulating regions (H). The dislocation density in (Z) and (Y) decreases in proportion to the distance from the voluminous defect accumulating regions (H). In some cases, dislocation density rapidly declines outside of boundaries (K) of the voluminous defect accumulating regions (H). Average dislocation density is less than $5 \times 10^6$ cm$^{-2}$ in the surrounding single crystal regions (Z) and (Y). In the concrete,

| Sample J: | $3 \times 10^6$ cm$^{-2}$ |
| Sample K: | $4 \times 10^6$ cm$^{-2}$ |
| Sample L: | $3 \times 10^6$ cm$^{-2}$ |
| Sample M: | $1 \times 10^6$ cm$^{-2}$ |
| Sample N: | $2 \times 10^6$ cm$^{-2}$. |

Samples J, L, M and N are similar to Sample A of Embodiment 1 in the state of the voluminous defect accumulating regions (H). Namely, in Samples J, L, M and N, the voluminous defect accumulating regions (H) occur just above the mask stripes, parallel linear facets with a definite width extend in parallel to the extension of the mask stripes for forming V-grooves with hills and valleys, and the valleys coincide with the voluminous defect accumulating regions (H). Slanting facets sweep dislocations into the voluminous defect accumulating regions (H).

The voluminous defect accumulating regions (H) are observed by a CL image for all the samples J to N. The voluminous defect accumulating regions (H) penetrate the grown GaN substrate in the direction of thickness. The CL image confirms that the voluminous defect accumulating regions (H) attain to the bottom of the GaN substrate.

Estimation based on the TEM and the CL observation clarifies that the voluminous defect accumulating regions (H) hanging from the valleys 59 held by the facets 56 are single crystals in Samples J, L, M and N.

In Samples M and N, the voluminous defect accumulating regions (H) are single crystal, although the masks are polycrystalline GaN and AlN in Samples M and N. The fact signifies that the milder slanting facets grow in horizontal directions for covering the voluminous defect accumulating regions (H) above the mask stripes. The milder slanting facets determine the state and the orientation of the voluminous defect accumulating regions (H) as a single crystal.

Detailed investigation of Samples J and M clarifies that the single crystal voluminous defect accumulating regions (H) have a c-axis just reverse to the c-axis of the surrounding single crystal parts. Namely, the surrounding low dislocation single crystal regions (Z) and the C-plane growth regions (Y) have a surface of a common (0001) plane. (0001) plane is conveniently denoted by a (0001) Ga-plane which has Ga-atoms overall on the surface. The single crystalline voluminous defect accumulating regions (H) have a (000–1) plane which is denoted by a (000–1)N plane. Thus, there is a clear grain boundary (K) between the voluminous defect accumulating regions (H) and the surrounding single crystal regions (Z) and (Y). The definite grain boundary (K) effectively acts as a dislocation annihilation/accumulation region.

A CL picture shows the fact that Sample K (Pt mask) is different from other samples J, L, M and N. The voluminous defect accumulating regions (H) of Sample K are polycrystals. The CL and the TEM observation discover that besides polycrystalline ones (K$_1$), the voluminous defect accumulating regions (H) of Sample K (Pt mask) have further variations K$_2$ and K$_3$.

K$_1$: a polycrystal containing a plurality of crystal grains

K$_2$: a single crystal having an orientation different from the surrounding single crystal regions (Z) and (Y)

K$_3$: a single crystal having a common <0001> axis (c-axis) with the surrounding single crystal regions (Z) and (Y), but a-, b- and d-axes different from the surrounding (Z) and (Y).

It is confirmed that Sample K includes wide variations of the voluminous defect accumulating regions (H).

Sample K has parallel facets 56 constructing a rack-shaped rugged surface which looks like an array of lying prisms aligning in the direction vertical to the extension of the prisms. Parallel voluminous defect accumulating regions (H) are formed at the valleys 59 of the facets 56. The voluminous defect accumulating regions (H) deprive the surrounding regions of dislocations and accumulate them. Low dislocation density is realized in the surrounding regions also in Sample K. The positions of the voluminous defect accumulating regions (H) coincide with the initially formed mask stripes. The mask stripes produce the voluminous defect accumulating regions (H) exactly just above the mask. Thus, Sample K is still an embodiment of the present invention.

Polycrystalline voluminous defect accumulating regions (H) appear most conspicuously in Sample K. Some other samples partially include polycrystalline voluminous defect accumulating regions (H) at a restricted rate, for example, in Samples A and J.

Why polycrystalline voluminous defect accumulating regions (H) are produced? On the masked undersubstrate, the undersubstrate generate GaN single crystals and the mask stripes generate polycrystals. In other samples, single crystal parts extend from the facets to the regions above the mask and bury the regions earlier than the growth of polycrystal in the regions. Single crystal voluminous defect accumulating regions (H) further grow onward. But in Sample K, polycrystals on the masks grow upward earlier than horizontal extension of the single crystal regions from the surroundings. Pt masks allow polycrystals to grow faster than the horizontal invasion of the surrounding single crystals.

Table 1 shows stripe mask widths s (μm), voluminous defect accumulating region (H) widths h (μm), mask stripe pitches p (μm), C-plane growth region (Y) widths y (μm) and GaN film thicknesses T(μm) of Samples A to N of Embodiments 1, 2 and 3.

TABLE 1

Table of the stripe mask widths s, voluminous defect accumulating region (H) widths h, mask pitches p, C-plane growth region (Y) widths y, GaN layer thicknesses T, and values of 2z + y according to Embodiments 1 to 3

| symbol of Sample | S (μm) | h (μm) | p (μm) | y (μm) | T (μm) | 2z + y (μm) |
|---|---|---|---|---|---|---|
| A | 50 | 40 | 400 | 30 | 1250 | 360 |
| B | 200 | 190 | 400 |  | 1250 | 210 |
| C | 2 | 1 | 20 |  | 120 | 19 |
| D | 300 | 250 | 2000 |  | 4400 | 1750 |
| E | 50 |  | 400 |  | 800 |  |
| F | 50 | 40 | 400 | 20~40 | 1400 | 360 |
| G | 50 | 40 | 400 | 20~40 | 1400 | 360 |
| H | 50 | 40 | 400 | 20~40 | 1400 | 360 |
| I | 50 | 40 | 400 | 20~40 | 1400 | 360 |
| J | 50 | 40 | 400 | 30~50 | 1900 | 360 |
| K | 50 | 40 | 400 | 30~50 | 1900 | 360 |
| L | 50 | 40 | 400 | 30~50 | 1900 | 360 |
| M | 50 | 40 | 400 | 30~50 | 1900 | 360 |
| N | 50 | 40 | 400 | 30~50 | 1900 | 360 |

Figure 12:
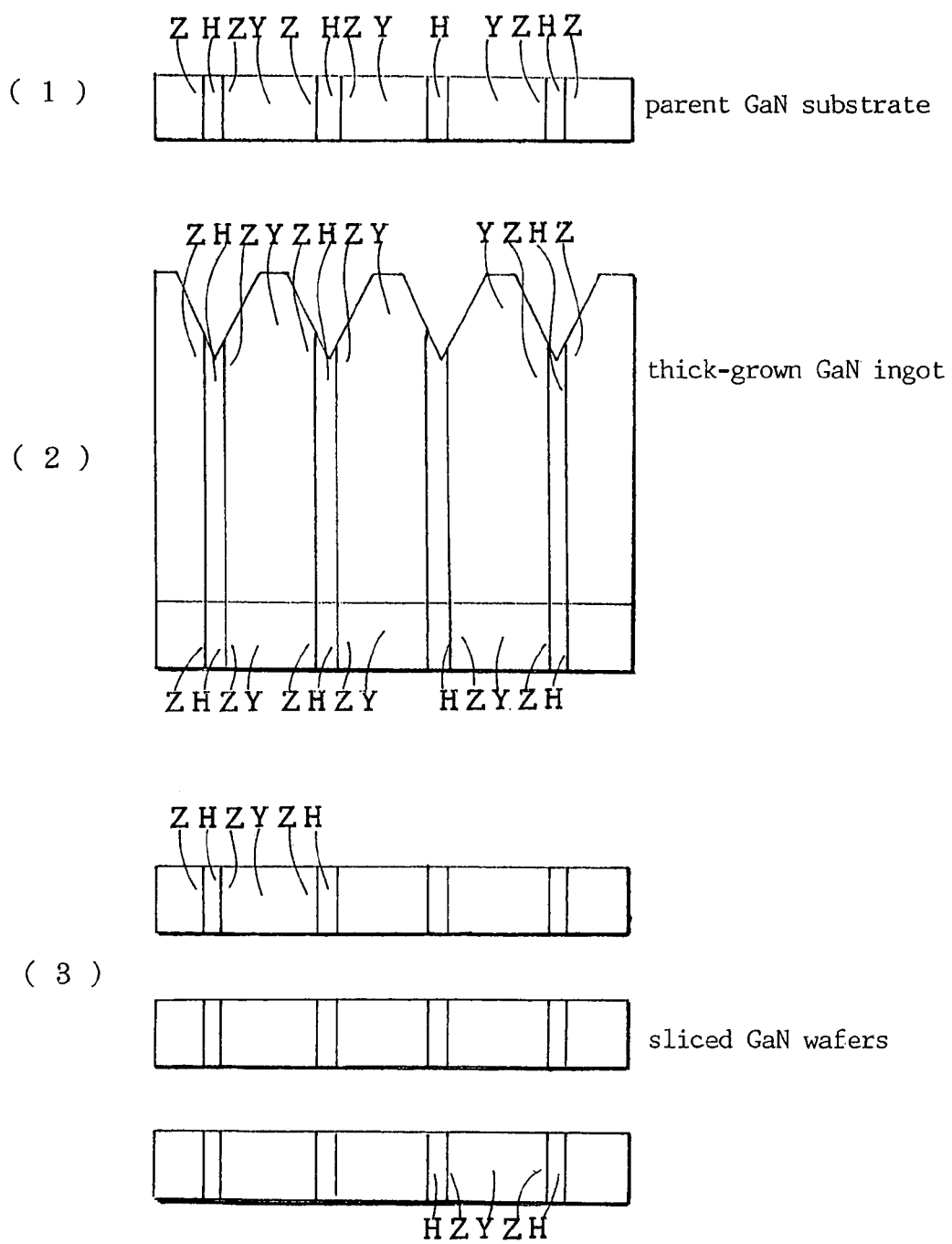
FIG. 12 is a series of sectional views of steps of making a GaN crystal Embodiment 4 of the present invention by preparing a GaN seed substrate made by the former embodiments of the present invention, growing a thick GaN epitaxial crystal on the seed GaN substrate on the condition of facet growing, forming linearly extending slanting facets and linearly extending facet hills on parent low dislocation single crystal regions (Z) and parent C-plane growth regions (Y) of the GaN seed substrate, forming facet valleys just upon parent voluminous defect accumulating regions (H) of the GaN seed, producing voluminous defect accumulating regions (H) under the bottoms of the valleys on the parent voluminous defect accumulating regions (H), forming low dislocation single crystal regions (Z) and C-plane growth regions (Y) under the hills and the facets on the parent low dislocation single crystal regions (Z) and the parent C-plane growth regions (Y), slicing an as-grown thick crystal into a plurality of as-cut GaN wafers, grinding both surfaces of the as-cut GaN wafers, and mirror-polishing the as-cut GaN wafers into a plurality of GaN mirror wafers.
Figure 14:
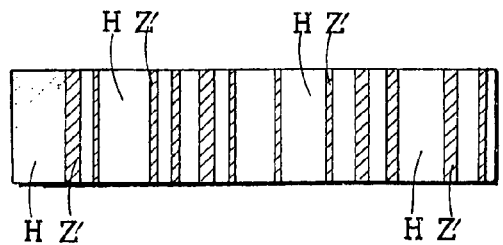
FIG. 14 is a fluorescence microscope-image sectional view of taking along a 14-14 line on FIG. 13 for showing a vertical section of the intermittent defect accumulating regions (H). It is shown that the defect accumulating regions (H) are intermittent in a substrate and high dislocation density regions (Z') exist between the intermittent defect accumulating regions (H). High density dislocations are accumulated in the defect accumulating regions (H) by slanting facets, escape from the intermittent defect accumulating regions (H), and diffuse toward the regions (Z') between the intermittent defect accumulating regions (H).

[Embodiment 4 (Producing of a GaN ingot; FIGS. 12 to 14)]

Embodiment 4 prepares two different undersubstrates O and P.

Undersubstrate O; a 30 mm φ GaN undersubstrate which has been produced by Embodiment 1 based on Pattern A. This is a GaN mirror wafer without mask, which has been prepared by mechanically processing and mirror-polishing the GaN substrate made by Embodiment 1 as shown in FIG. 12(1). Although the GaN wafer of Undersubstrate O has no stripe mask, inherent components (H, Z and Y) play the role of the stripe mask.

Undersubstrate P; a 30 mmφ GaN/sapphire undersubstrate which has been prepared by growing a 2 μm thick GaN film on a sapphire undersubstrate by the MOCVD, depositing a 0.1 μm $SiO_2$ film on the GaN film, and forming a stripe mask of Pattern A by photolithography.

The HVPE apparatus holds two undersubstrates O and P side by side on a susceptor and grows thick GaN films on the two undersubstrates O and P simultaneously on the same condition by utilizing $H_2$ gas as a carrier gas.

(Growing Condition of a Thick GaN Epi-Layer of Embodiment 4; Facet Growth)

| | |
|---|---|
| Growth temperature | 1030° C. |
| $NH_3$ partial pressure | 0.25 atm (25 kPa) |
| HCl partial pressure | $2.0 \times 10^{-2}$ atm (2.0 kPa) |
| Growth time | 80 hours |
| Layer thickness | about 10000 μm (10 mm) |

80 hour HVPE process grows about a 10 mm tall GaN crystal ingots on Undersubstrates O(maskless GaN) and P(masked GaN/sapphire). The two ingots are called Ingot O and Ingot P. The two ingots have similar surface morphology. Surfaces of Ingots O and P are rack-shaped surfaces composed of facets which look like a series of parallel equilateral triangular columns lying regularly and periodically side by side with a definite pitch p. Facets make repetitions of parallel hills and valleys with the pitch p. In Ingot P, the positions of valleys coincide with the positions of mask stripes. In Ingot O (FIG. 12(2)), the positions of valleys coincide with the positions of inherent voluminous defect accumulating regions (H) in the GaN undersubstrate. The pitch p of the rack-shaped surface (valleys/hills) built with facets is 400 μm for both Ingots O and P. Valleys and hills, which are less stable than Embodiment 1, are plagued with fluctuation.

Reciprocally slanting facets constructing the parallel prisms on the rack-shaped surface are composed mainly of complementary pairs of {11–22} and {–1–1–22} planes. Flat tops remain between neighboring facets {11–22} and {–1–1–22}. The flat tops are (0001) planes which are made by C-plane growth. The regions just under the C-plane growth flat tops are C-plane growth regions (Y). No shallow (mild slope) facet is observed on bottoms of the valleys. Fluctuation of valleys and hills in directions, depths and widths prevents shallow facets from happening on the bottoms.

Remarkable discovery is that the grown GaN crystal transcribes the inner, inherent components of H, Z and Y of Undersubstrate O, which is a maskless mirror GaN wafer composed of the inherent elements H, Z and Y. The inherent inner components H, Z and Y have a function similar to a stripe mask for making components H, Z and Y through the facet growth.

Ingot O is vertically sectioned. The section is observed. It is confirmed that positions of voluminous defect accumulating regions (H) of grown GaN exactly coincide with the inherent voluminous defect accumulating regions (H) of the GaN crystal of Undersubstrate O. The voluminous defect accumulating regions (H) hang from the bottoms of valleys. Coincidence of Y and Z between the undersubstrate and the grown crystal is less clear than H. Either a C-plane growth region (Y) or a low dislocation single crystal region (Z) grows on an inherent low dislocation single crystal region (Z) of Undersubstrate O. Either a C-plane growth region (Y) or a low dislocation single crystal region (Z) grows on an inherent C-plane growth region (Y) of Undersubstrate O.

Ingots P and O are sliced into nine as-cut GaN wafers with wiresaws. The as-cut wafers are ground and polished on both surfaces. Nine GaN mirror wafers are obtained for both Samples O and P. The as-cut GaN wafers of Ingot O are shown in FIG. 12(3).

All the nine GaN wafers of Samples O and P are flat, smooth transparent substrates having a (0001) surface. Six or seven GaN wafers grown at early stages are endowed with good quality. CL pictures confirm that <1–100> extending parallel linear voluminous defect accumulating regions (H) align periodically and regularly with a 400 μm pitch.

The early grown GaN mirror wafers O and P are immune from fluctuation of widths, directions and depths of valleys and hills. Two or three GaN wafers grown at a later stage contain anomalies and defects in both Samples O and P. Detailed CL observation found that voluminous defect accumulating regions (H) fluctuate in width, direction and depth. As shown in FIG. 13, voluminous defect accumulating regions (H) are not fully continual but discontinual. Sometimes a voluminous defect accumulating region (H) is divided into plenty of discontinual, dotted defect accumulating regions (H) aligning along a line. The divided, dotted, intermittent defect accumulating regions (H) are still discernible from the surrounding low dislocation single crystal regions (Z). Imperfection of the defect accumulating regions (H) allows some dislocations to escape from the defect accumulating regions (H) toward a direction of (H) aligning intermittently. Further analysis confirms that in spite of dislocation diffusion toward the direction of (H) aligning intermittently, high dislocation density is confined between the intermittent defect accumulating regions (H) and diffusion of dislocations from the intermittent defect accumulating regions (H) has a poor influence upon dislocation distribution in the low dislocation single crystal regions (Z). Regions adjacent to the voluminous defect accumulating regions (H) are still favored with low dislocation density as the low dislocation single crystal regions (Z).

Intermission and discontinuity of the voluminous defect accumulating regions (H) often appear on an excess thick-grown GaN crystal or a GaN crystal grown on a special condition. The intermittent, discontinuous defect accumulating regions (H) are permissible to some extent. The present invention, however, denies complete extinction of defect accumulating regions (H). Without defect accumulating regions (H), GaN growth cannot maintain facets, valleys and hills, which deprives the present invention of the effect of reducing dislocations. FIG. 13 demonstrates the intermittent, dotted discontinuous defect accumulating regions (H).

GaN mirror wafers of Samples O and P, which are suffering from the intermittent defect accumulating regions (H), enjoy low dislocation density in low dislocation single crystal regions (Z) and rapid dislocation reduction in proportion to the distance from the defect accumulating regions (H). There are some spots having $3 \times 10^7$ cm$^{-2}$ dislocations which are distanced from the defect accumulating regions (H) by 30 μm. The least dislocation density is less than $1 \times 10^5$ cm$^{-2}$. An average of the dislocation density is less than $5 \times 10^6$ cm$^{-2}$ in the low dislocation single crystal regions (Z) in Samples O and P.

The examinations confirm that Samples O and P are also suitable for practical GaN single crystal substrates.

What we claim is:

1. A single crystal GaN substrate having a top surface, a bottom surface, a diameter of more than 25 mm (1 inch) and a thickness of more than 120 μm,
    the top surface comprising:
    a planar low dislocation single crystal region (Z) extending in a direction defined on the top surface; and
    two planar defect accumulating regions (H) extending in the same direction as the low dislocation single crystal region (Z), having interfaces (K) on both sides and being in contact with the planar low dislocation single crystal regions (Z) via the interfaces (K).

2. A single crystal GaN substrate having a top surface, a bottom surface, a diameter of more than 25 mm (1 inch) and a thickness of more than 120 μm,
    the top surface comprising repetitions (ZHZH . . . ) of a unit (ZH) having a pair of
    a planar low dislocation single crystal region (Z) extending in a direction defined on the top surface and
    a planar defect accumulating region (H) extending in the same direction as the low dislocation single crystal region (Z), having interfaces (K) on both sides and being in contact with the planar low dislocation single crystal region (Z) via the interfaces (K).

3. A single crystal GaN substrate having a top surface, a bottom surface, a diameter of more than 25 mm (1 inch) and a thickness of more than 120 μm,
    the single crystal GaN substrate comprising:
    a planar low dislocation single crystal region (Z) extending in both a direction of thickness and a direction defined on the top surface; and
    two planar voluminous defect accumulating regions (H) extending in the same directions as the low dislocation single crystal region (Z), having interfaces (K) on both sides and being in contact with the low dislocation single crystal regions (Z) via the interfaces (K).

4. A single crystal GaN substrate having a top surface, a bottom surface, a diameter of more than 25 mm (1 inch) and a thickness of more than 120 μm,
    the single crystal GaN substrate comprising repetitions (ZHZH . . . ) of a unit (ZH) having a pair of:
    a planar low dislocation single crystal region (Z) extending both in a direction of thickness and in a direction defined on the top surface and
    a planar voluminous defect accumulating region (H) extending in the same directions as the low dislocation single crystal region (Z), having interfaces (K) on both sides and being in contact with the low dislocation single crystal region (Z) via the interfaces (K).

5. A single crystal GaN substrate according to claim 1, the top surface further comprising a linear C-plane growth region (Y) lying at a middle of the linear low dislocation single crystal region (Z) and extending in the same direction as the low dislocation single crystal region (Z),
    the linear C-plane growth region (Y) being a low dislocation density single crystal and having higher resistivity than other regions,
    three low dislocation density single crystal regions of ZYZ being sandwiched between the linear defect accumulating regions (H).

6. A single crystal GaN substrate according to claim 2, the top surface further comprising repetitions (HZYZHZYZH . . . ) of a unit (HZYZ) having a set of
    a parallel linear defect accumulating region (H),
    a parallel linear low dislocation single crystal region (Z),
    a parallel linear C-plane growth region (Y) of a low dislocation single crystal with higher resistivity than other regions, and
    another parallel linear low dislocation single crystal region (Z).

7. A single crystal GaN substrate according to claim 3, the substrate further comprising a planar C-plane growth region (Y) lying at a middle of the planar low dislocation single crystal region (Z) and extending in the same direction as the low dislocation single crystal region (Z),
    the planar C-plane growth regions (Y) being a low dislocation density single crystal and having higher resistivity than other regions,
    three low dislocation density single crystal regions of ZYZ being sandwiched between the voluminous defect accumulating regions (H).

8. A single crystal GaN substrate according to claim 4, the substrate further comprising repetitions (HZYZHZYZH . . . ) of a unit (ZYZH) having a set of
- a parallel planar low dislocation single crystal region (Z),
- a parallel planar C-plane growth region (Y) of a low dislocation single crystal with higher resistivity than other regions, and
- another parallel planar low dislocation single crystal region (Z).

9. A single crystal GaN substrate according to claim 4, wherein the low dislocation single crystal regions (Z) and the voluminous defect accumulating regions (H) penetrate the substrate from the top surface to the bottom surface.

10. A single crystal GaN substrate according to claim 4, wherein the voluminous defect accumulating region (H) is a polycrystal and has the interfaces (K) between the voluminous defect accumulating regions (H) and the low dislocation single crystal regions (Z).

11. A single crystal GaN substrate according to claim 4, wherein the voluminous defect accumulating region (H) is a single crystal of an orientation nearly equal to an orientation of the neighboring low dislocation single crystal regions (Z) and the interface (K) between the voluminous defect accumulating region (H) and the low dislocation single crystal region (Z) contains planar defects.

12. A single crystal GaN substrate according to claim 4, wherein the voluminous defect accumulating region (H) is a single crystal of an orientation nearly equal to an orientation of the neighboring low dislocation single crystal regions (Z) and has an inner core (S) having threading dislocation bundles.

13. A single crystal GaN substrate according to claim 4, wherein the voluminous defect accumulating region (H) is a single crystal of an orientation nearly equal to an orientation of the neighboring low dislocation single crystal regions (Z) and has an inner core (S) having planar defects and threading dislocation bundles.

14. A single crystal GaN substrate according to claim 4, wherein the voluminous defect accumulating region (H) is a single crystal of an orientation slightly slanting to an orientation of the neighboring low dislocation single crystal regions (Z).

15. A single crystal GaN substrate according to claim 4, wherein the voluminous defect accumulating region (H) is a single crystal of an orientation nearly equal to an orientation of the neighboring low dislocation single crystal regions (Z), has an interface (K) containing planar defects, and has an inner core (S) having planar defects and threading dislocation bundles.

16. A single crystal GaN substrate according to claim 4, wherein the voluminous defect accumulating region (H) is a single crystal of an orientation nearly equal to an orientation of the neighboring low dislocation single crystal regions (Z), has an interface (K) containing planar defects, and has an inner core (S) having a layer of longitudinally extending planar defects.

17. A single crystal GaN substrate according to claim 4, wherein the top surface is a (0001) plane.

18. A single crystal GaN substrate according to claim 4, wherein the voluminous defect accumulating regions (H) are single crystals having a c-axis antiparallel to a c-axis of the neighboring low dislocation single crystal regions (Z).

19. A single crystal GaN substrate according to claim 4, wherein the voluminous defect accumulating regions (H) are single crystals having a c-axis antiparallel to a c-axis of the neighboring low dislocation single crystal regions (Z) and have interfaces (K) of planar defects.

20. A single crystal GaN substrate according to claim 4, wherein the voluminous defect accumulating regions (H) are single crystals having a c-axis antiparallel to a c-axis of the neighboring low dislocation single crystal regions (Z) and have an inner core (S) containing threading dislocation bundles.

21. A single crystal GaN substrate according to claim 4, wherein the voluminous defect accumulating regions (H) are single crystals having a c-axis antiparallel to a c-axis of the neighboring low dislocation single crystal regions (Z) and have an inner core (S) containing threading dislocation bundles and planar defects.

22. A single crystal GaN substrate according to claim 4, wherein the voluminous defect accumulating regions (H) are single crystals having a c-axis which is slightly slanting to a direction antiparallel to a c-axis of the neighboring low dislocation single crystal regions (Z).

23. A single crystal GaN substrate according to claim 4, wherein the voluminous defect accumulating regions (H) are single crystals having a c-axis antiparallel to a c-axis of the neighboring low dislocation single crystal regions (Z) and have interfaces (K) composed of planar defects and an inner core (S) containing threading dislocation bundles and planar defects.

24. A single crystal GaN substrate according to claim 4, wherein the voluminous defect accumulating regions (H) are single crystals having a c-axis antiparallel to a c-axis of the neighboring low dislocation single crystal regions (Z) and have interfaces (K) composed of planar defects and an inner core (S) containing a longitudinally extending planar defect.

25. A single crystal GaN substrate according to claim 4, wherein the voluminous defect accumulating regions (H) are single crystals having a c-axis antiparallel to a c-axis of the neighboring low dislocation single crystal regions (Z), the low dislocation single crystal regions (Z) have (0001) planes on the top surface of the substrate and the voluminous defect accumulating regions (H) have (000-1) planes on the top surface of the substrate.

26. A single crystal GaN substrate according to claim 4, wherein the low dislocation single crystal regions (Z) and the voluminous defect accumulating regions (H) extend in a <1-100> direction.

27. A single crystal GaN substrate according to claim 4, wherein the low dislocation single crystal regions (Z) and the voluminous defect accumulating regions (H) extend in a <11-20> direction.

28. A single crystal GaN substrate according to claim 4, wherein the planar low dislocation single crystal regions (Z) and the planar voluminous defect accumulating regions (H) extend both in a <1-100> direction and in a <0001> direction.

29. A single crystal GaN substrate according to claim 4, wherein the planar low dislocation single crystal regions (Z) and the planar voluminous defect accumulating regions (H) extend both in a <11-20> direction and in a <0001> direction.

30. A single crystal GaN substrate according to claim 8, wherein a sum (y+2z) of a width y of the C-plane growth region (Y) and widths z of the low dislocation single crystal regions (Z) ranges from 10 µm to 2000 µm.

31. A single crystal GaN substrate according to claim 8, wherein a sum (y+2z) of a width y of the C-plane growth region (Y) and widths z of the low dislocation single crystal regions (Z) ranges from 100 µm to 800 µm.

32. A single crystal GaN substrate according to claim 4, wherein a width h of the voluminous defect accumulating region (H) is 1 µm to 200 µm.

33. A single crystal GaN substrate according to claim 4, wherein a width h of the voluminous defect accumulating region (H) is 10 μm to 80 μm.

34. A single crystal GaN substrate according to claim 4, wherein an average of dislocation density is less than $5\times10^6$ cm$^{-2}$ in the low dislocation single crystal regions (Z).

35. A single crystal GaN substrate according to claim 4, wherein dislocation density in the low dislocation single crystal regions (Z) is the highest in the vicinity of the interface (K) and decreases in proportion to a distance from the interface (K).

36. A single crystal GaN substrate according to claim 25, wherein the surface of the substrate has lower steps of cavities at positions of the voluminous defect accumulating regions (H).

37. A single crystal GaN substrate according to claim 36, wherein the cavities have depths less than 1 μm.

38. A single crystal GaN substrate according to claim 4, wherein the voluminous defect accumulating regions (H) are single crystals having a c-axis antiparallel to a c-axis of the neighboring low dislocation single crystal regions (Z), the low dislocation single crystal regions (Z) have (000–1) planes on the top surface of the substrate and the voluminous defect accumulating regions (H) have (0001) planes on the top surface of the substrate.

39. A single crystal GaN substrate according to claim 38, wherein the surface of the substrate has lower steps of cavities at positions of the low dislocation single crystal regions (Z).

40. A single crystal GaN substrate having a top surface a bottom surface, a diameter of more than 25 mm (1 inch) and a thickness of more than 120 μm,
   the top surface comprising:
   parallel linear defect accumulating regions (H) accumulating dislocations and aligning periodically, regularly with a pitch p; and
   parallel linear low dislocation single crystal regions (Z) sandwiched between the neighboring linear defect accumulating regions (H) or
   a set (ZYZ) of parallel linear low dislocation single crystal regions (Z) and a C-plane growth region (Y) with higher resistivity than other regions between the neighboring linear defect accumulating regions (H).

41. A single crystal GaN substrate according to claim 40, wherein the pitch p of aligning the parallel linear defect accumulating regions (H) is 20 μm to 2000 μm.

42. A single crystal GaN substrate according to claim 40, wherein the pitch p of aligning the parallel linear defect accumulating regions (H) is 100 μm to 1200 μm.

43. A single crystal GaN substrate having a top surface, a bottom surface, a diameter of more than 25 mm (1 inch) and a thickness of more than 120 μm,
   the single crystal GaN substrate comprising repetitions (ZHZH . . . ) of a unit (ZH) having a pair of:
   a planar low dislocation single crystal region (Z) which is not easily etched by an etchant and extends both in a direction of thickness and in a direction defined on the top surface and
   a planar voluminous defect accumulating region (H) which is easily etched by an etchant and extends in the same directions as the low dislocation single crystal region (Z), having interfaces (K) on both sides and being in contact with the low dislocation single crystal region (Z) via the interfaces (K).

44. A single crystal GaN substrate according to claim 43, wherein the etchant is KOH or a mixture of sulfuric acid and nitric acid.

45. A single crystal GaN substrate according to claim 1, wherein the planar defect accumulating regions (H) include abnormal shaped polycrystal regions.

46. A single crystal GaN substrate according to claim 1, wherein the single crystal GaN substrate is made by an HVPE method or an MOCVD method.

47. A single crystal GaN substrate according to claim 5, wherein the linear C-plane growth region (Y) has a fluctuation width.

48. A laser diode produced on a single crystal GaN substrate, the single crystal GaN substrate having a top surface, a bottom surface, a diameter of more than 25 mm (1 inch) and a thickness of more than 120 μm,
   the top surface comprising:
   a planar low dislocation single crystal region (Z) extending in a direction defined on the top surface; and
   two planar defect accumulating regions (H) extending in the same direction as the low dislocation single crystal region (Z), having interfaces (K) on both sides and being in contact with the planar low dislocation single crystal regions (Z) via the interfaces (K).

49. A laser diode according to claim 48, wherein the laser diode is an InGaN blue-violet laser diode.

\* \* \* \* \*